United States Patent
Takane et al.

(10) Patent No.: US 6,538,249 B1
(45) Date of Patent: Mar. 25, 2003

(54) IMAGE-FORMATION APPARATUS USING CHARGED PARTICLE BEAMS UNDER VARIOUS FOCUS CONDITIONS

(75) Inventors: Atsushi Takane, Mito (JP); Haruo Yoda, Nishitama-gun (JP); Hideo Todokoro, Nishitama-gun (JP); Fumio Mizuno, Tokorozawa (JP); Shoji Yoshida, Hitachi (JP); Mitsuji Ikeda, Hitachinaka (JP); Mitsugu Sato, Hitachinaka (JP); Makoto Ezumi, Mito (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/612,302

(22) Filed: Jul. 7, 2000

(30) Foreign Application Priority Data

Oct. 19, 1999 (JP) .......................................... 11-296246
Jul. 9, 1999 (JP) .......................................... 11-195375
Jun. 2, 2000 (JP) ........................................ 2000-170407

(51) Int. Cl.$^7$ ................................................ H01J 37/26
(52) U.S. Cl. ...................................................... 250/310
(58) Field of Search ................................ 250/310, 307, 250/311; 356/401, 372, 399

(56) References Cited

U.S. PATENT DOCUMENTS

| | | | | |
|---|---|---|---|---|
| 3,829,691 A | * | 8/1974 | Hufnagel ..................... | 250/311 |
| 4,698,503 A | * | 10/1987 | Nomura et al. ............. | 250/311 |
| 4,733,074 A | * | 3/1988 | Kato et al. .................. | 250/307 |
| 4,894,540 A | * | 1/1990 | Komatsu ..................... | 250/307 |
| 4,941,980 A | * | 7/1990 | Halavee et al. ............. | 250/310 |
| 5,130,540 A | * | 7/1992 | Yamada et al. ............. | 250/310 |
| 5,142,147 A | * | 8/1992 | Kawamata et al. ......... | 250/310 |
| 5,512,747 A | * | 4/1996 | Maeda ........................ | 250/310 |
| 5,523,568 A | * | 6/1996 | Ichikawa et al. ........... | 250/310 |
| 5,608,218 A | * | 3/1997 | Sato et al. .................. | 250/310 |
| 6,067,164 A | * | 5/2000 | Onoguchi et al. .......... | 356/401 |
| 6,172,365 B1 | * | 1/2001 | Hiroi et al. ................. | 250/310 |
| 6,278,114 B1 | * | 8/2001 | Mitsui ........................ | 250/310 |

FOREIGN PATENT DOCUMENTS

| | | | | |
|---|---|---|---|---|
| EP | 0566963 A2 | * | 10/1993 | ............ G01B/7/34 |
| JP | 5-128989 | | 5/1993 | |
| JP | 5-227460 | | 9/1993 | |
| JP | 5-299048 | | 11/1993 | |
| JP | 5-333271 | | 12/1993 | |
| JP | 6-89687 | | 3/1994 | |
| JP | 6-113183 | | 4/1994 | |
| JP | 9-26312 | | 1/1997 | |
| JP | 9-92195 | | 4/1997 | |
| JP | 10-290389 | | 10/1998 | |
| JP | 11-261797 | | 9/1999 | |
| JP | 11-283035 | | 10/1999 | |
| JP | 11-287618 | | 10/1999 | |
| JP | 2000-39566 | | 2/2000 | |
| JP | 2000194969 A | * | 7/2000 | ............ G08B/25/00 |

OTHER PUBLICATIONS

"NOTE: Fast Noise Variance Estimation" by Immerker, Computer Vision and Image Understanding, vol. 64, No. 2 (Sep. 1996), pp. 300–302.

* cited by examiner

Primary Examiner—Kiet T. Nguyen
(74) Attorney, Agent, or Firm—McDermott, Will & Emery

(57) ABSTRACT

It is an object of the present invention to obtain an image which is focused on all portions of a sample and to provide a charged particle beam apparatus capable of obtaining a two-dimensional image which has no blurred part over an entire sample. In order to achieve the above object, the present invention comprises means for changing a focus condition of a charged particle beam emitted from a charged particle source, a charged particle detector for detecting charged particles irradiated from a surface portion of said sample in response to the emitted charged particle beam, and means for composing a two-dimensional image of the surface portion of the based on signals on which said charged particle beam is focused, said signals being among signals output from the charged particle detector.

36 Claims, 37 Drawing Sheets

F I G. 4
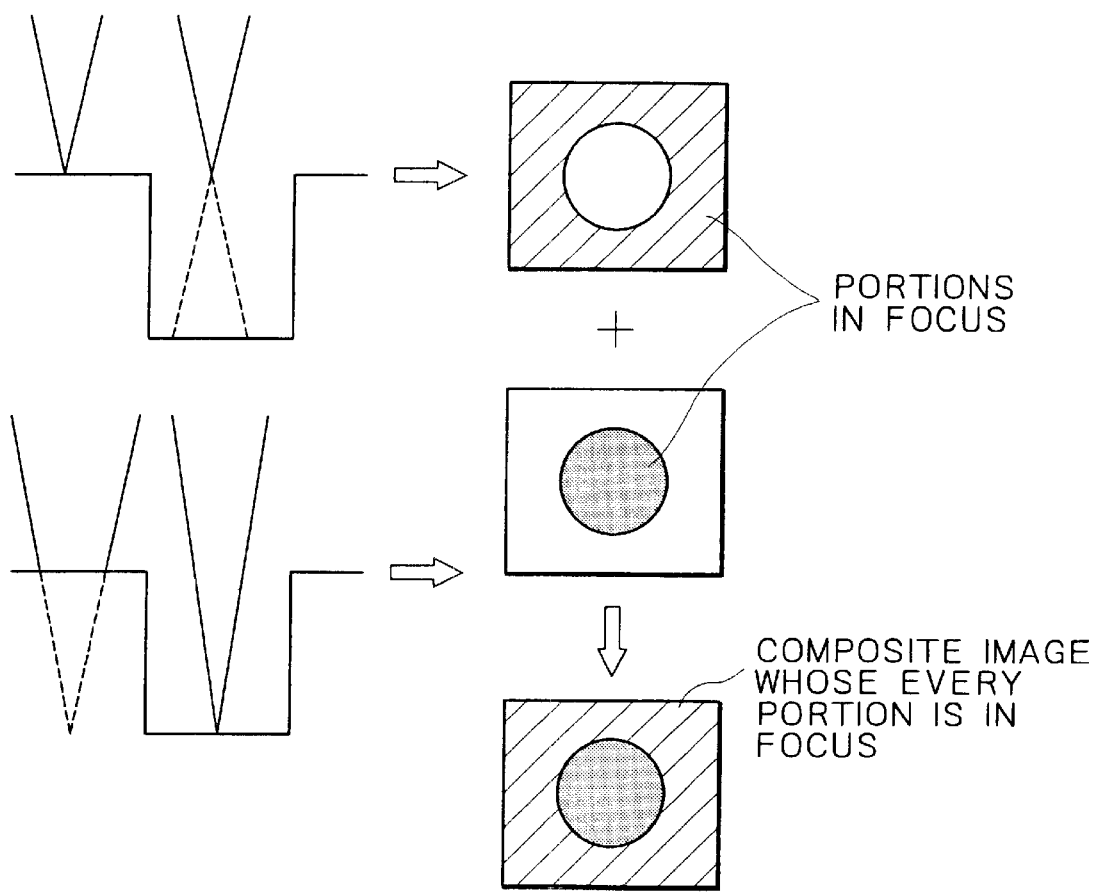

F I G. 31
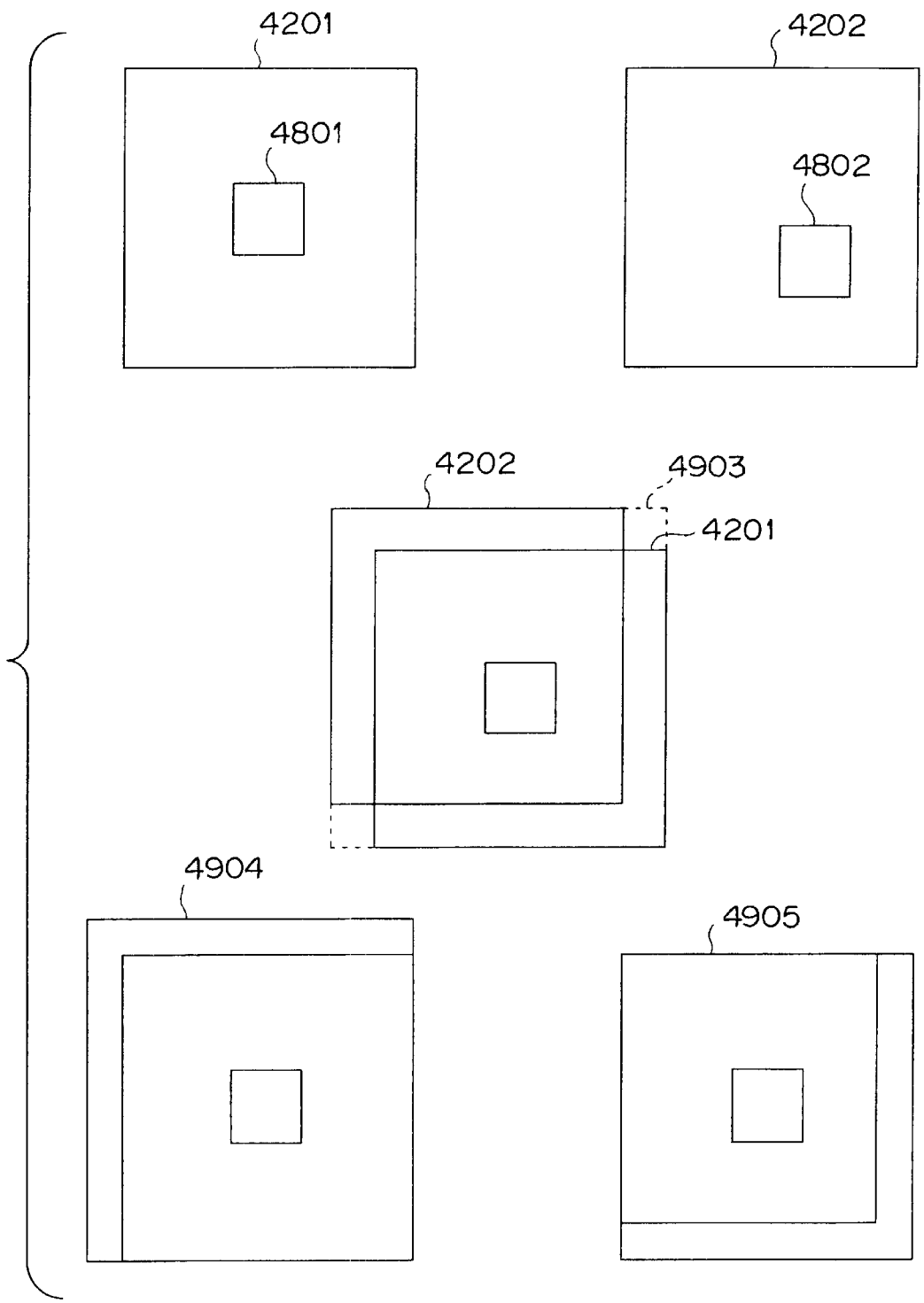

IMAGE-FORMATION APPARATUS USING CHARGED PARTICLE BEAMS UNDER VARIOUS FOCUS CONDITIONS

BACKGROUND OF THE INVENTION

The present invention relates to a charged particle beam apparatus, and more particularly to a charged particle beam apparatus having a function of properly adjusting the focus of an image obtained by charged particle beam irradiation.

A charged particle beam apparatus such as a scanning electron microscope is suitable for measuring or observing patterns formed on a semiconductor wafer, which has been becoming finer. Incidentally, samples used for such a purpose have taken a shape extending more three-dimensionally as semiconductor wafers have been multilayered. For example, currently, deeper contact holes have been formed in a sample.

SUMMARY OF THE INVENTION

A charged particle beam apparatus such as a scanning electron microscope thinly converges a beam and irradiates it onto a sample, which requires proper focusing of the beam on the sample. As semiconductor wafers have been multilayered, however, the distance between the surface of a sample and the bottom surface of a contact hole therein, for example, has become longer, causing a problem that the surface of the sample and the bottom surface of the contact hole have different focal distances. That is, focusing a beam onto the surface of the sample causes the bottom surface of the contact hole to be out of focus, producing a blurred image of the bottom surface of the contact hole.

Incidentally, Japanese Laid-Open Patent Publication No. 5-128989 (1993) discloses a technique which irradiates an electron beam onto a three-dimensional object while changing the focus of the beam, and extracts the contours of in-focus portions of the object to construct a three-dimensional image. In such an apparatus, however, when a two-dimensional image of a sample including the bottom of a contact hole is observed, for example, it is not possible to observe the details of the sample surface and the bottom portions of the contact hole since only the contour of the contact hole is indicated.

Japanese Laid-Open Patent Publication No. 5-299048 (1993) discloses another example which basically extracts contours of an object having concave/convex portions and produces a pseudo three-dimensional image in a representation similar to a contour chart.

The technique disclosed in Japanese Laid-Open Patent Publication No. 5-299048 (1993) performs differential processing on an image obtained by changing a focus, and extracts portions whose differential values exceed a preset extraction level.

This process is repeated on a plurality of images obtained by changing a focus, and finally the extracted portions are combined to extract contours of concave/convex portions of the imaged object. At that time, no consideration is given to portions whose differential values are less than the extraction level. Furthermore, since the extraction level, which is an evaluation level for determining a contour, depends on the S/N ratio of an image and the shape of the object, it is not possible to set a constant value for all portions. When there are two types of concave/convex portions in an image as shown in FIG. 16, for example, since a shape 1601 has a steep inclination, its in-focus portion has a large differential value, while since a shape 1602 has a moderate inclination, its in-focus portion has a small differential value. Therefore, if the same extraction level is applied to both shapes, the shape 1602 may not be extracted, depending on a selected extraction level. Thus, failing to set an appropriate extraction level produces an unextracted contour portion. Although the example in FIG. 16 shows only two types of concave/convex portions, an actual image has an infinite number of concave/convex portions. It is impossible to set an extraction level by which all of these contour portions are extracted. Since the above example extracts contour portions of each image separately, and no consideration is given to relationships between images whose portions have been extracted, when the extracted portions are combined to produce a composite image without setting an appropriate extraction level, some portions in the composite image may be left indefinite, or portions extracted from two or more images may overlap, as shown in FIG. 17. That is, in the invention disclosed in Japanese Laid-Open Patent Publication No. 5-299048 (1993), it is very difficult to set an extraction level, and in addition, no consideration is given to a method for processing extracted portions between images.

It is an object of the present invention to obtain an image which is focused on all portions of a sample or a certain two-dimensional area of a sample and to provide a charged particle beam apparatus capable of obtaining a two-dimensional image which has no blurred part over an entire sample.

In order to achieve the above object, a charged particle beam apparatus in accordance with the present invention comprises a charged particle source, a scan deflector for scanning a charged particle beam emitted from the charged particle source on a sample, means for changing a focus of the charged particle beam emitted from said charged particle source, a charged particle detector for detecting charged particles obtained at a portion of said sample irradiated with the charged particle beam, and means for composing a two-dimensional image of the sample as viewed from a direction of said charged particle beam source, based on signals on which said charged particle beam is focused, said signals being among signals output from the charged particle detector.

With this configuration, it is possible to select charged particles emitted from a two-dimensional area of a portion in focus from among charged particles obtained from an entire sample, and use the charged particles to form a sample image. That is, since a sample image can be constructed based on charged particles focused on an entire area or a specific two-dimensional area in a beam scan area, it is possible to compose a two-dimensional image that is focused on the charged particle beam scan area or a specific two-dimensional area thereof.

Another mode according to the present invention utilizes differential values or changes in a Sobel value at same coordinates of a plurality of images obtained by changing a focus, and uses a pixel value of the original image of an image which has a maximum value of those values to compose an image. This eliminates setting of unstable parameters as well as overlapping of portions extracted from the same image or more than one image for composition, resulting in composition of a full-focused image.

BRIEF DESCRIPTION OF THE DRAWINGS

FIG. 4 is schematic diagram for describing creation of a composite image according to the present invention;

FIG. 31 is a diagram showing a configuration of a preprocessing means 210 for full-focused image composition.

DETAILED DESCRIPTION OF THE PREFERRED EMBODIMENTS

Although embodiments according to the present invention will be described below with reference to a scanning electron microscope, which is a charged particle beam apparatus, the invention is not limited to this specific charged particle beam apparatus but can be applied to other charged particle beam apparatuses such as an FIB (Focused Ion Beam) apparatus which scans an ion beam on a sample to obtain a sample image.

Figure 1:
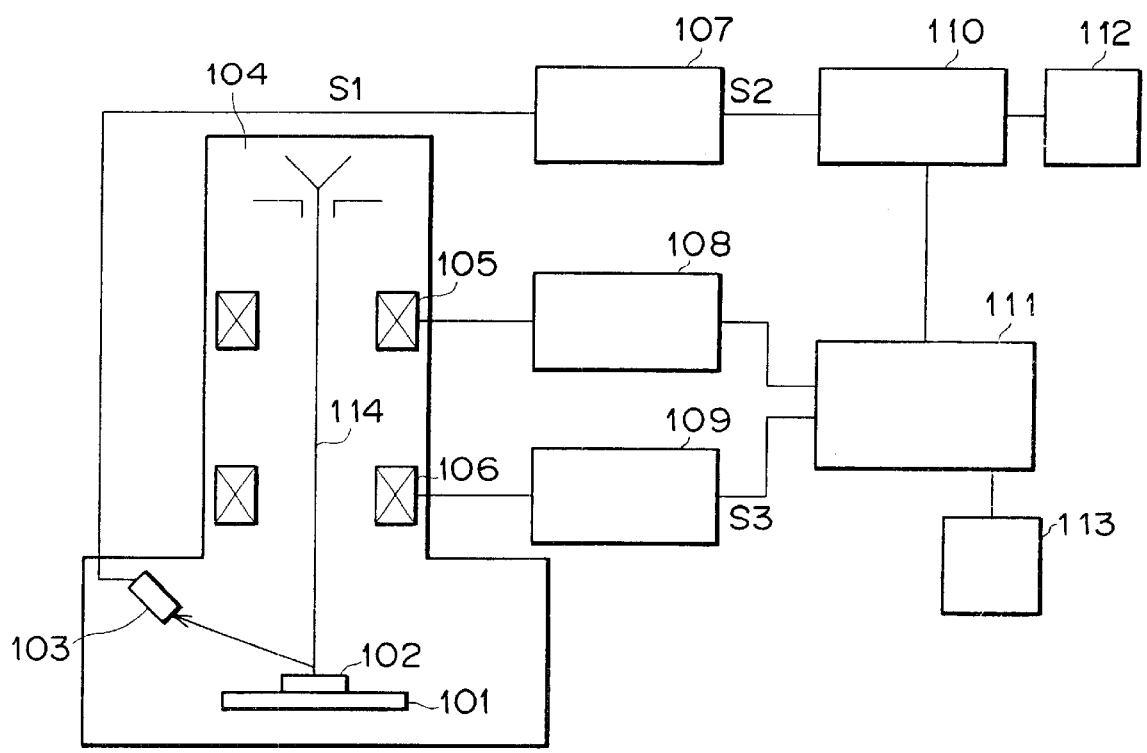
FIG. 1 is a schematic diagram of a configuration of a scanning electron microscope.

FIG. 1 is a diagram showing a scanning electron microscope to which the present invention is applied. This scanning electron microscope incorporates an automatic focus control function. In FIG. 1, reference numerals 101 and 102 denote a sample stage and a sample to be imaged on the sample stage, respectively; 104 denotes a cathode; 105 represents a scanning coil; 106 represents an electron lens; 108 denotes a scanning coil control circuit; and 109 denotes a lens control circuit.

An electron beam 114 is scanned on the sample 102 by the scanning coil 105, and electrons emitted from the sample 102 are detected by a detector 103. A signal S1 from the detector 103 is input to an AD converter 107, which converts the signal into a digital signal S2.

The digital signal S2 is fed to an image processing processor 110 which performs image processing such as differential processing of an image and extraction of characteristic quantities, and sends the results to a control computer 111.

The processed image is also sent to a display device 112 where the image is displayed. A focus control signal S3 from the control computer 111 is input to the lens control circuit 109 so that the lens control circuit can adjust the exciting current for the lens 106 to perform focus control.

Figure 2:
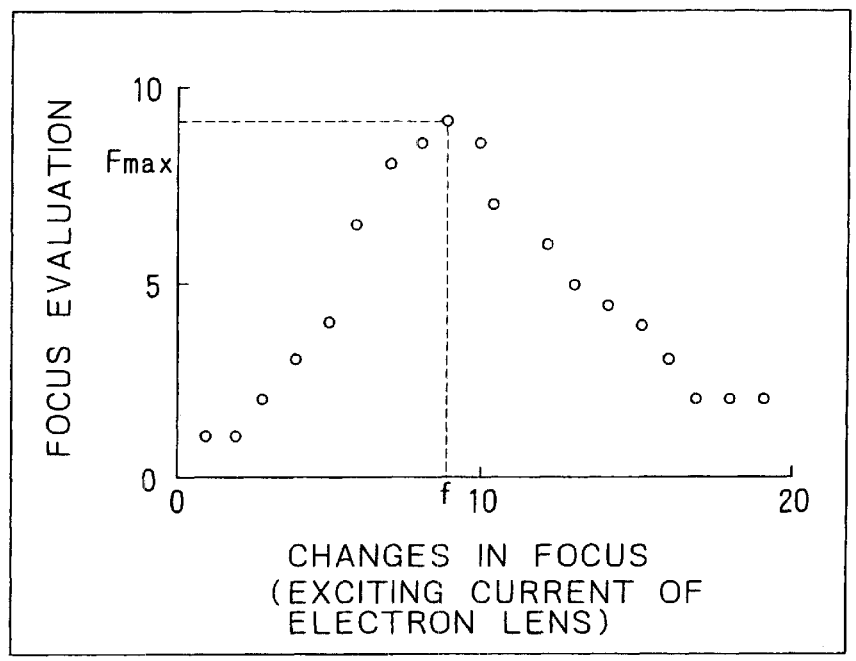
FIG. 2 is a graph showing changes in a focus evaluation value as electron lens conditions are changed.

Numeral 113 denotes an input means connected to the control computer 111. This scanning electron microscope, as configured above, performs automatic focus control by automatically setting focal conditions of the electron lens to optimum values. Specifically, the scanning electron microscope scans a plurality of frames while changing the electron lens conditions and calculates and evaluates focus evaluation values using the detection signals of secondary electrons and reflected electrons so as to set optimum values to the electron lens conditions. FIG. 2 shows changes in a focus evaluation value as an electron lens condition is varied.

Here, differential values between pixels or the like are used as focus evaluation values. Specifically, the sum of differential values is calculated for each frame captured while changing the lens condition, and a lens condition in which the sum is maximized is regarded as an in-focus condition. In FIG. 2, since the focus evaluation value is at maximum (Fmax) when the exciting current for the electron lens is f, the condition f is determined as an in-focus condition.

A scanning electron microscope having an automatic focus control function such as one described above has the following problems: First, since a focus evaluation value is calculated by applying a certain set process to a frame image or detection signals, an acquired value is applied to a frame image as a whole, that is, no consideration is given to local in-focus conditions. More specifically, when a sample has concave/convex portions, in-focus conditions are different between the upper surface and the bottom surface. However, the automatic focus control determines an optimum condition for either the upper surface or bottom surface as an optimum value for both, or it calculates a medium condition as an optimum value.

Next, the automatic focus control takes time. As seen from FIG. 2, since a plurality of frame images must be read to find an optimum focus evaluation value (that is, to find the maximum value in FIG. 2), it takes a few or a few tens of seconds to complete the control operation.

Embodiments according to the present invention provide a preferred scanning electron microscope capable of solving especially the above two problems. The configurations of apparatuses embodied according to the present invention will be described in detail below.

[First Embodiment]

Figure 3:
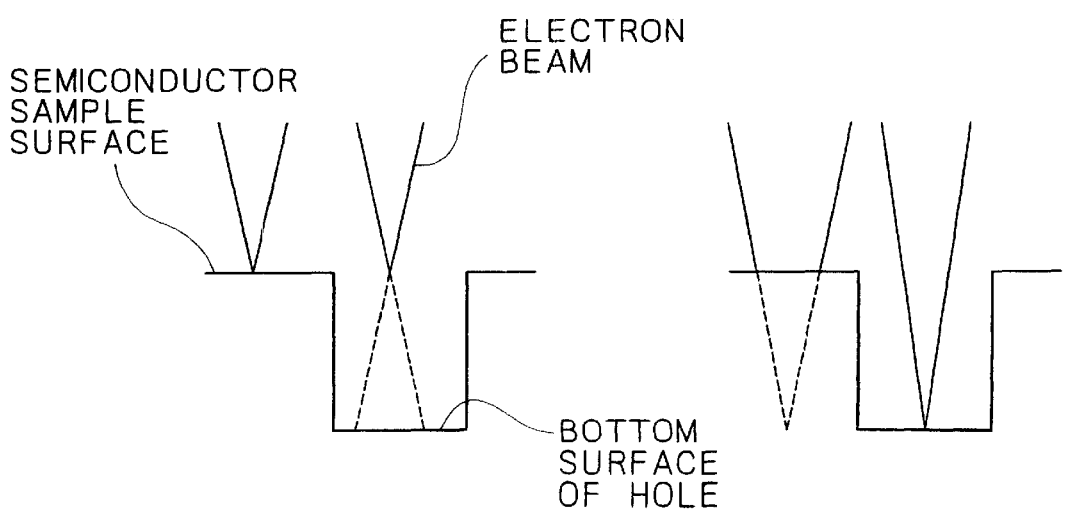
FIG. 3 is a diagram for describing focus deviations, which are a problem to be solved by the present invention.

FIG. 3 is a diagram used to describe focus deviations, which are a problem to be solved by the present invention. When a semiconductor sample with a contact hole therein is scanned by a scanning electron microscope, if the electron beam is focused on the surface of the semiconductor sample, the bottom surface of a contact hole having a high aspect ratio becomes out of focus. However, if the electron beam is focused onto the bottom surface of the contact hole, on the other hand, the surface of the sample becomes out of focus. Automatic focus control functions currently incorporated in scanning electron a microscopes cannot handle a local focus deviation such as this one, and can only calculate a sample surface or some average position as a focal position.

FIG. 4 is a schematic diagram for describing creation of a composite image according to the present invention. Using the semiconductor sample with contact holes therein described in FIG. 3, two images are captured: one in which a focal position is set on the surface of the semiconductor sample and the other in which a focal position is set on the bottom surface of a contact hole. Then, in-focus portions can be extracted from each image so as to produce a composite image, which is a two-dimensional image focusing on all surfaces of the sample. These two images are registered in, for example, two frame memories.

Figure 5:
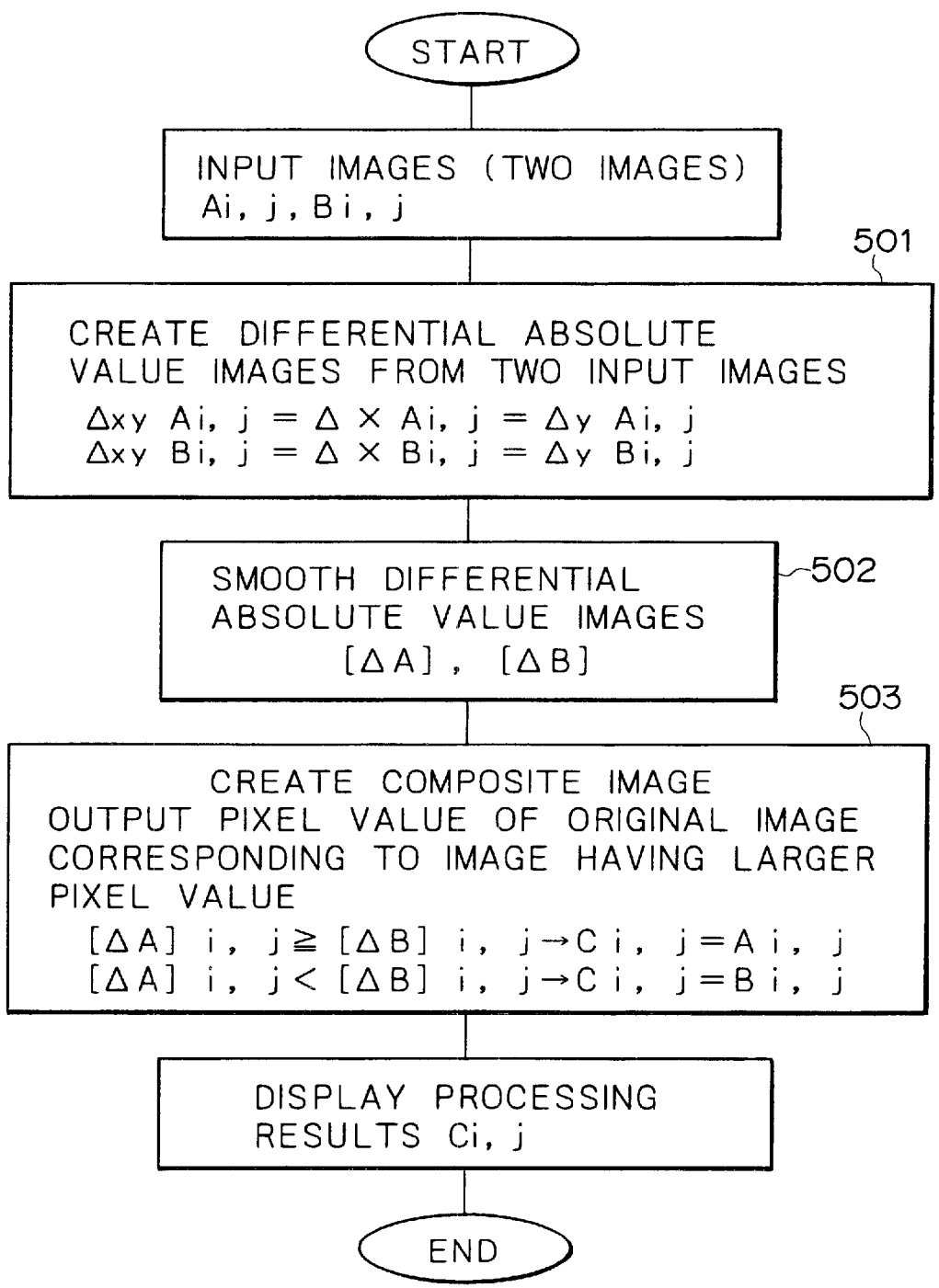
FIG. 5 is a flowchart showing a flow of processes for extracting in-focus portions and creating a composite image according to the present invention.

FIG. 5 is a flowchart showing a flow of processes for extracting in-focus portions and creating a composite image according to the present invention. Two images $A_{i,j}$ and $B_{i,j}$ whose focal positions are shifted from each other are captured. The focal positions are shifted by sending the focus control signal S3 from the control computer 111 to the lens control circuit 109 to adjust exciting current for the electron lens 106, as described using FIG. 1. Step 501 creates a differential absolute value image for each of the two captured images ($\Delta xy A_{i,j}$ for $A_{i,j}$ and $\Delta xy B_{i,j}$ for $B_{i,j}$). A differential absolute value image is created using values acquired by adding the absolute value of the difference between a pixel and another pixel shifted n pixels from the pixel in the x-direction to the absolute value of the difference between the same pixel and another pixel shifted n pixels from the pixel in the y-direction, as indicated by the formula (1).

$$\Delta xy A_{i,j} = \Delta x A_{i,j} + \Delta y A_{i,j}$$

$$\Delta xy B_{i,j} = \Delta x B_{i,j} + \Delta y B_{i,j}$$

$$\Delta x A_{i,j} = |A_{i,j} - A_{i+n,j}|, \quad \Delta x B_{i,j} = |B_{i,j} - B_{i+n,j}|$$

$$\Delta y A_{i,j} = |A_{i,j} - A_{i,j+n}|, \quad \Delta y B_{i,j} = |B_{i,j} - B_{i,j+n}| \tag{1}$$

Before using differential absolute value images created at step 501 as in-focus evaluation references, they are smoothed at step 502 to suppress noise influence. Step 503 determines which image is in focus, and creates a composite image. Here, the in-focus evaluation is performed based on the formula (2). That is, step 503 compares pixel values at same coordinates in the two differential absolute value images smoothed at step 502, and determines that a pixel of an original image which has a larger corresponding pixel value is in focus.

$$[\Delta A]_{i,j} \geq [\Delta B]_{i,j} \rightarrow C_{i,j} = A_{i,j}$$

$$[\Delta A]_{i,j} \geq [\Delta B]_{i,j} \rightarrow C_{i,j} = B_{i,j} \tag{2}$$

A composite image $C_{i,j}$ is composed of in-focus portions of $A_{i,j}$ and $B_{i,j}$. FIG. 5 illustrates composition using two images, and composition using n images can be performed by sequentially repeating the same process on a series of image pairs.

Figure 11:
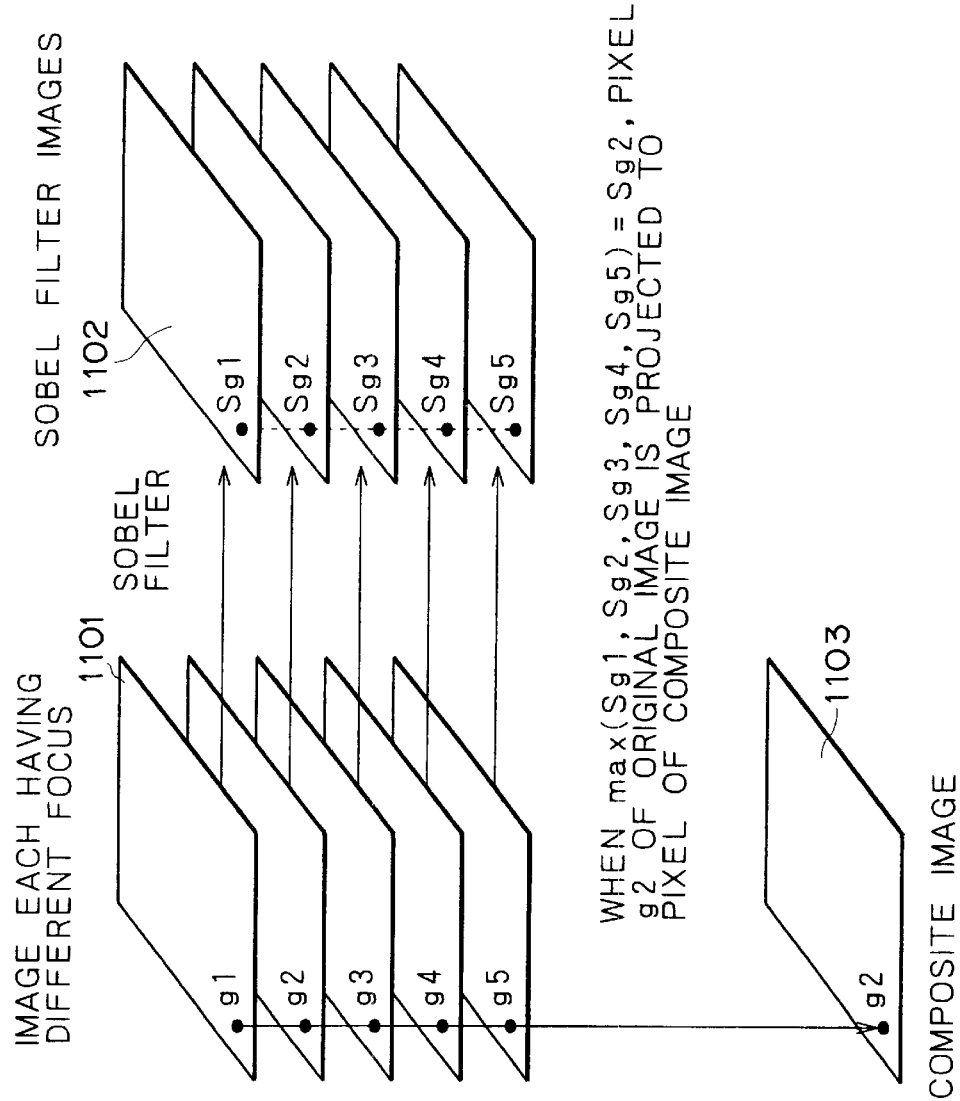
FIG. 11 is a schematic diagram showing a composing process according to the present invention.

FIG. 11 is a schematic diagram showing a composing process according to the present invention. The figure illustrates an example in which pixel values from a Sobel filter are set as in-focus evaluation references. Like image differential, the Sobel filter is used to extract edge information of an image, and when a pixel value processed by a Sobel filter is large, this means that changes in pixel values around the pixel are large. That is, the pixel is in focus and is hardly blurred. Numeral 1101 indicates a plurality of images captured by changing a focus, and 1102 indicates images obtained by processing each image 1101 by use of a Sobel filter. Each of the images 1101 is registered in one of a plurality of prepared frame memories.

Pixels Sg1 through Sg5 at same coordinates in the plurality of images 1102 registered in the frame memories are compared, and of those pixels, a pixel of the largest value is extracted. Supposing that the pixel of the largest value is Sg2, a pixel value g2 of the original image of the pixel Sg2 is projected to a pixel at same coordinates in the composite image. A composite image 1103 is acquired by repeating this process for all coordinates of the image to select pixels of largest values, and arranging them to form a two-dimensional image.

Figure 6:
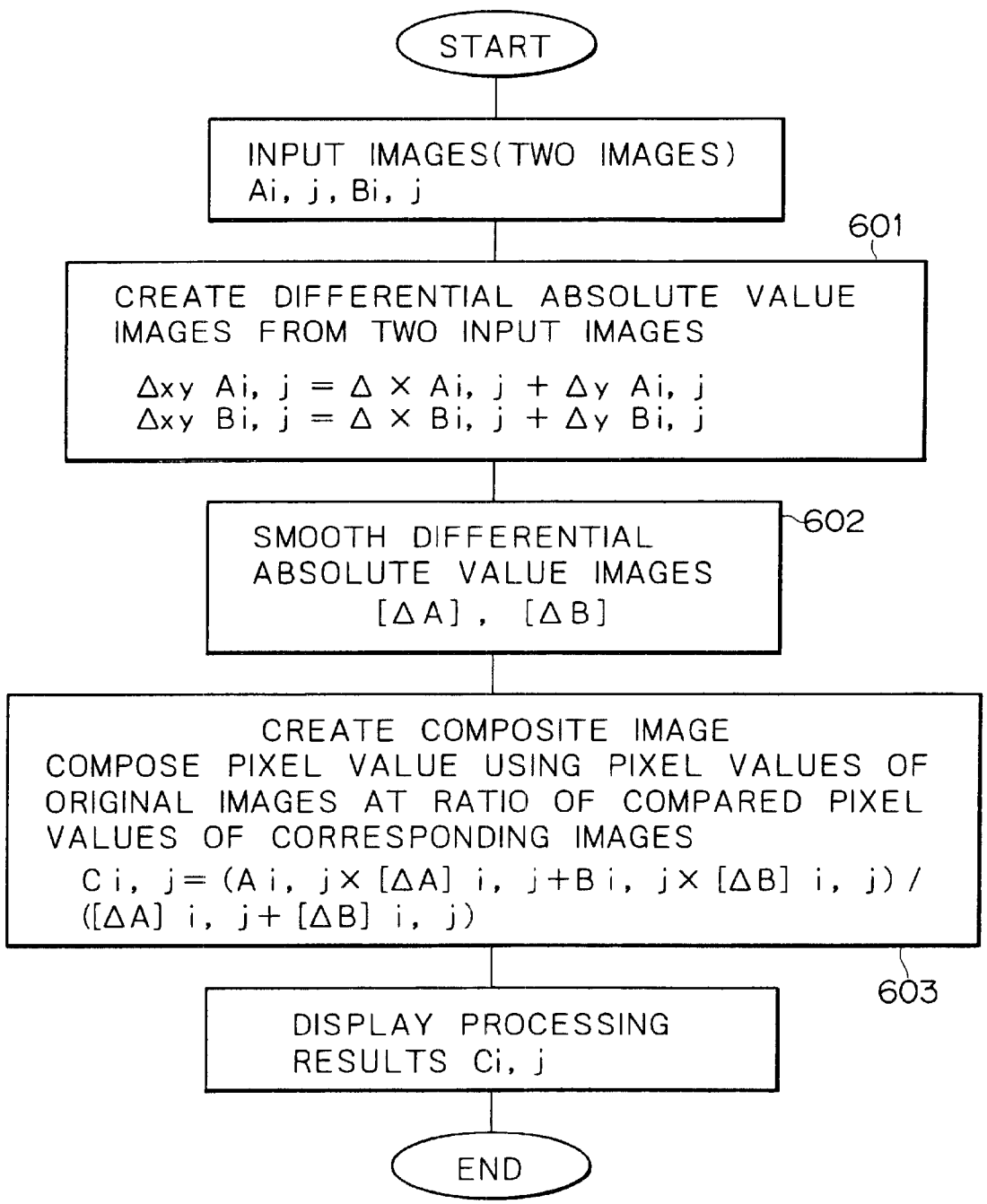
FIG. 6 is a flowchart showing another flow of processes for extracting in-focus portions and creating a composite image according to the present invention.

FIG. 6 is a flowchart showing another flow of processes for extracting in-focus portions and creating a composite image according to the present invention. Steps 601 and 602 create differential absolute value images and smooth the images, respectively, as at steps 501 and 502 in FIG. 5. Next, step 603 determines which one of the two images is in focus, and creates a composite image. Here, the in-focus evaluation is performed based on the formula (3). That is, step 603 compares pixel values at same coordinates in the two differential absolute value images smoothed at step 602, and composes a pixel value using corresponding pixel values of the original images at a ratio of the compared pixel values. In this method, comparing with the method shown in FIG. 5, influence of a blur due to focus deviation is added. However, this method is characterized by a smooth transition portion where the in-focus state is switched from image A to image B.

$$C_{i,j} = (A_{i,j} \times [\Delta A]_{i,j} + B_{i,j} \times [\Delta B]_{i,j}) / ([\Delta A]_{i,j} + [\Delta B]_{i,j}) \quad (3)$$

Figure 7:
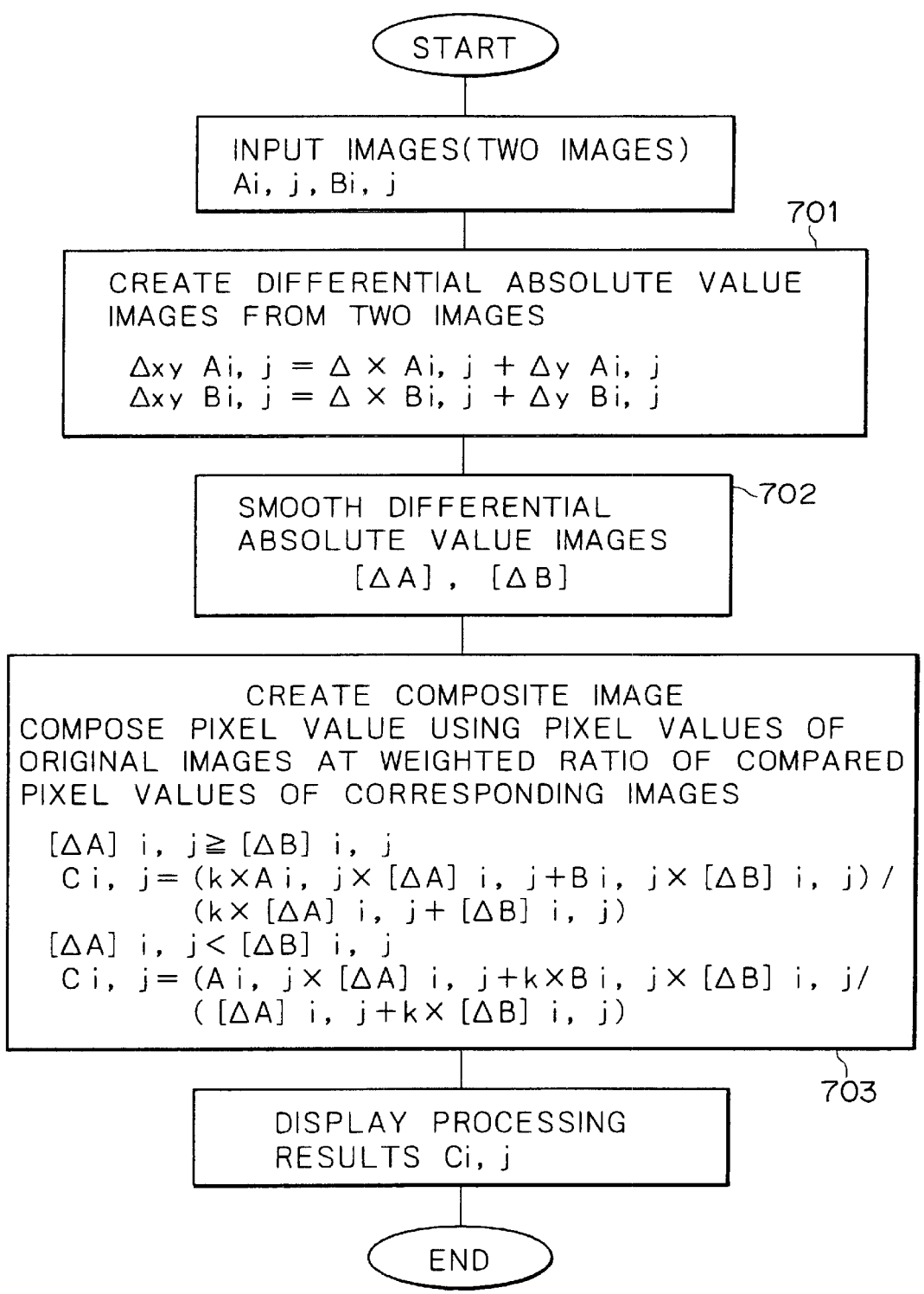
FIG. 7 is a flowchart showing still another flow of processes for extracting in-focus portions and creating a composite image according to the present invention.

FIG. 7 is a flowchart showing still another flow of processes for extracting in-focus portions and creating a composite image according to the present invention. Steps 701 and 702 create differential absolute value images and smooth the images, respectively, as at steps 501 and 502 in FIG. 5. Next, step 703 determines which one of the two images is in focus, and creates a composite image. Here, the in-focus evaluation is performed based on the formula (4). That is, step 703 compares pixel values at same coordinates in the two differential absolute value images smoothed at step 702, and composes a pixel value using corresponding pixel values of the original images at a weighted ratio of the compared pixel values. This is a method somewhere in between the methods illustrated in FIG. 5 and FIG. 6. If a weight coefficient K is set to 1, this method is equal to the method shown in FIG. 6, while this method approaches the method shown in FIG. 5 if the weight coefficient k is set to a value larger than 1.

$$[\Delta A]_{i,j} \geq [\Delta B]_{i,j} \ C_{i,j} = (k \times A_{i,j} \times [\Delta A]_{i,j} + B_{i,j} \times [\Delta B]_{i,j}) / (k \times [\Delta A]_{i,j} + [\Delta B]_{i,j})$$
$$[\Delta A]_{i,j} \geq [\Delta B]_{i,j} \ C_{i,j} = (A_{i,j} \times [\Delta A]_{i,j} + k \times B_{i,j} \times [\Delta B]_{i,j}) / ([\Delta A]_{i,j} + k \times [\Delta B]_{i,j}) \quad (4)$$

FIG. 6 and FIG. 7 illustrate composition using two images, and composition using n images can be performed by comparing differential absolute values or Sobel-filtered pixel values at same coordinates in n images, and selecting the first and second largest values to apply the same process to them. Furthermore, although in FIG. 6 and FIG. 7, differential absolute values are used as in-focus evaluation quantities, Sobel-filtered pixel values can be used in the same process flow.

In the above configuration, a two-dimensional image whose every area is in focus, taking local in-focus into account, can be composed by a simple calculating means.

[Second Embodiment]

Figure 8:
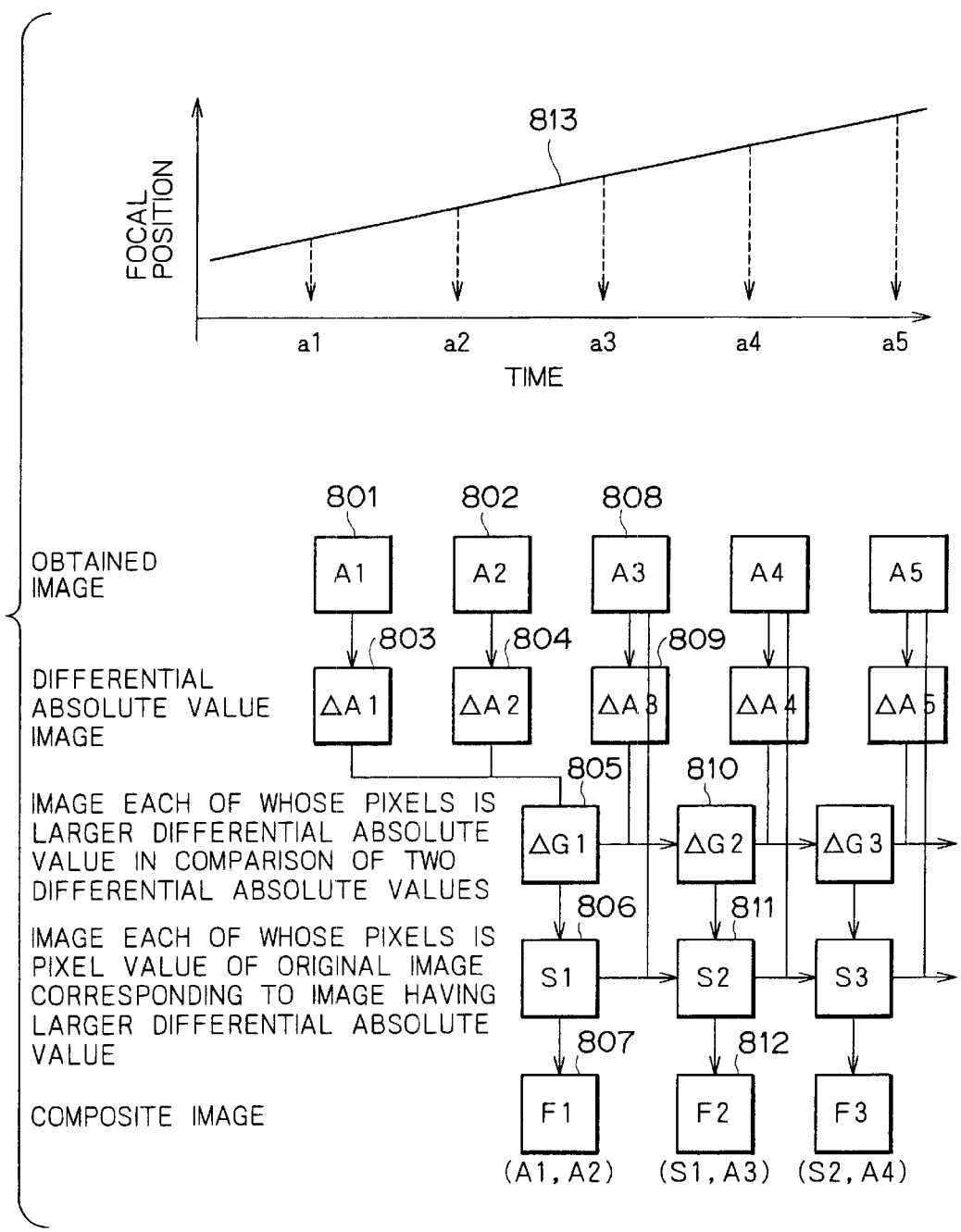
FIG. 8 is a flowchart showing a flow of processes in which image acquisition, extraction of in-focus portions, and creation of a composite image are performed in parallel according to an embodiment of the present invention.

FIG. 8 is a flowchart showing a flow of processes in which image acquisition, extraction of in-focus portions, and creation of a composite image are performed in parallel according to an embodiment of the present invention. Numerical 813 indicates a process in which a focal position, which can be represented by an exciting current, is varied with time.

Description will be made of processes performed as time elapses, taking processes at steps 801 through 812 as examples. An image A1 at step 801 is captured at time a1. A differential absolute value image ΔA1 of the image A1 is created at step 803 before the next image capture at time a2, and an image A2 at step 802 is captured at time a2. Before the next image capture at time a3, a differential absolute value image ΔA2 is created at step 804, and the differential absolute value imageΔA1 at step 803 is compared with the differential absolute value imageΔA2 at step 804, and at step. 805, an image ΔG1 each of whose pixels is a larger differential absolute value is created. At step 806, to prepare for the next composition, an image Si each of whose pixels is a corresponding pixel value of the original image of a differential absolute value image having a larger differential absolute value, determined on the basis of the image ΔG1 acquired at step 805, is created. Here, a composite image F1 at step 807 is created based on the image ΔG1 acquired at step 805 using the method illustrated in FIGS. 5 through 7.

The composite image F1 is displayed in a display device 112 shown in FIG. 1. Next, an image A3 at step 808 is captured at time a3. Before the next image capture at time a4, a differential absolute value image ΔA3 is created at step 809, and the differential absolute value image ΔA3 is compared with the image ΔG1 acquired at step 805, and at step 810, an image ΔG2 each of whose pixels is a larger differential absolute value is created. At step 811, to prepare for the next composition, an image S2 each of whose pixels is a corresponding pixel value of the original image of a differential absolute value image having a larger differential absolute value, determined on the basis of the image ΔG2 acquired at step 810, is created. Here, a composite image F2 at step 812 is created based on the image ΔG2 acquired at step 810, and displayed subsequently after the composite image F1. That is, a composite image of the previously captured images is completed and displayed at the time of capturing the next image. By repeating the same processes, image capture, composition processing, and indication can be performed in parallel so as to display composite images in real time. Furthermore, parallel processing such as this makes it possible to reduce the control time it takes to correct a focus, increasing the speed of automatic focus correction control.

[Third Embodiment]

Figure 14:
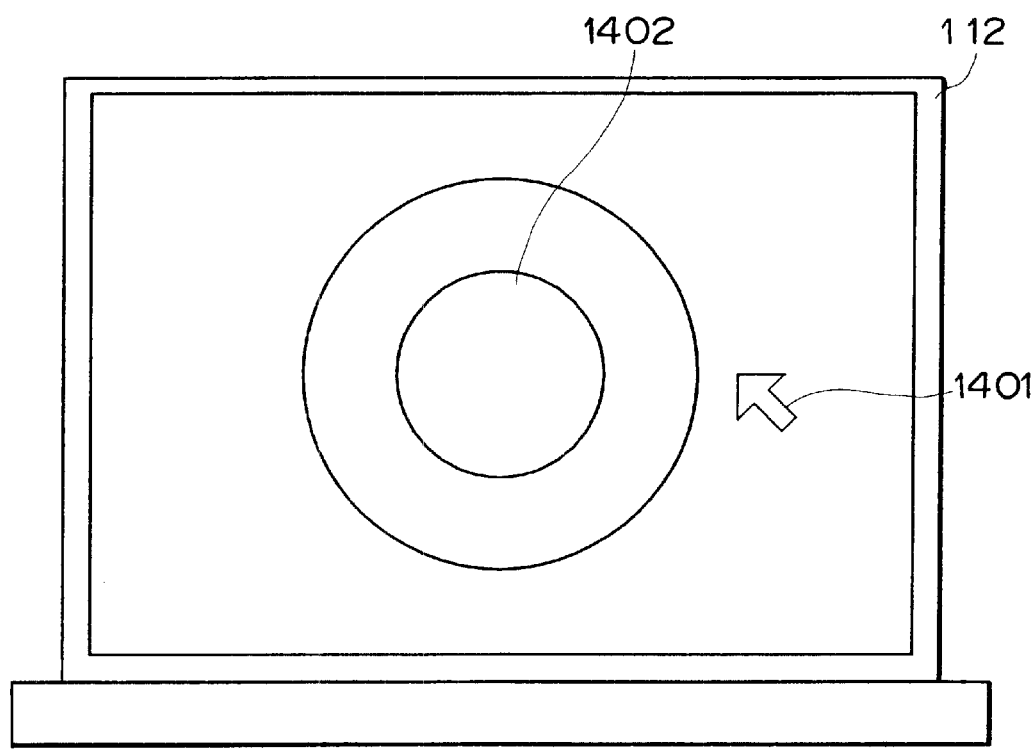
FIG. 14 is a diagram showing an indication example for a display device for an apparatus according to an embodiment of the present invention.

FIG. 14 is a diagram showing an indication example for a display device 112 for an apparatus according to an embodiment of the present invention. This indication example shows a composite image of a contact hole formed in a semiconductor wafer. An apparatus according to this embodiment has almost the same configuration as that described by use of FIG. 1, and, therefore, the description provided earlier will not be repeated.

Incidentally, this apparatus embodiment is provided with a pointing device (now shown) for moving a cursor 1401 on the display screen of the display device 112. This pointing device is used to select a specific area on the display screen. This apparatus embodiment has the function of replacing an area selected by this pointing device with another image. This function will be described by way of example.

The display device 112 shown in FIG. 14 is displaying an image of a contact hole formed in a semiconductor wafer.

The above composition processes have been applied to this sample image. When the cursor 1401 is placed in a center portion 1402 of the contact hole displayed in this display device 112 to select this portion, the portion, which is created by an electron beam having almost the same focal distance as that for the selected point, that is, a selected area in a specific original image among the original images each registered using one of a plurality of different focuses, is replaced by another image. This replacement process is performed based on address data of pixels which are registered in the above specific original image and have an in-focus evaluation value larger than a predetermined value or almost the same in-focus evaluation value as that for the selected point.

With this arrangement, edges of a contact hole can be made distinct. For example, a selected area (in the above example, the center portion 1402 of the hole) may be indicated in black so that it is in clear contrast with the other portions.

This method is effective when edge portions of a contact hole show little changes in their brightness. In a scanning electron microscope used to form a line profile based on image data and measure a pattern length using this line profile, unclear contrast in an edge portion causes an error in edge-position determination performed based on the line profile. Adoption of an apparatus according to this embodiment of the present invention can solve the above technical problem.

Although in the above description, a selected area in an image is replaced with another image, this apparatus may be configured so that the focus of a selected area can be adjusted. Specifically, the cursor 1401 is placed in the center portion 1402 of the contact hole in the composite image displayed in the display device 112 to select the portion.

Then, the selected area in an original image is replaced with pixels which are in a specific original image forming the selected area image and which have an in-focus evaluation value larger than a predetermined value or almost the same in-focus evaluation value as that for the selected point by the cursor 1401. With this arrangement, it is possible to perform an operation in which it looks as if to selectively adjust the focus of a specific portion of a sample image.

In an area whose image is to be replaced, the portion which has almost the same focus as that for the selected point by the cursor 1401, that is, a specific image among images each registered using one of a plurality of focuses, replaces another registered image.

Although in the above description, an image of a portion whose focus is almost equal to that for a selected point is replaced, this should not be construed restrictively; for example, a means for selecting an arbitrary area in a sample image may be provided, and an image in the selected arbitrary area is replaced based on address data of the area.

Although the above description illustrates an example in which an operator manually performs operations while observing the display screen 112, this should not be construed restrictively; for example, an image may be replaced with an image of a specific focus in an automated process.

[Fourth Embodiment]

Figure 9:
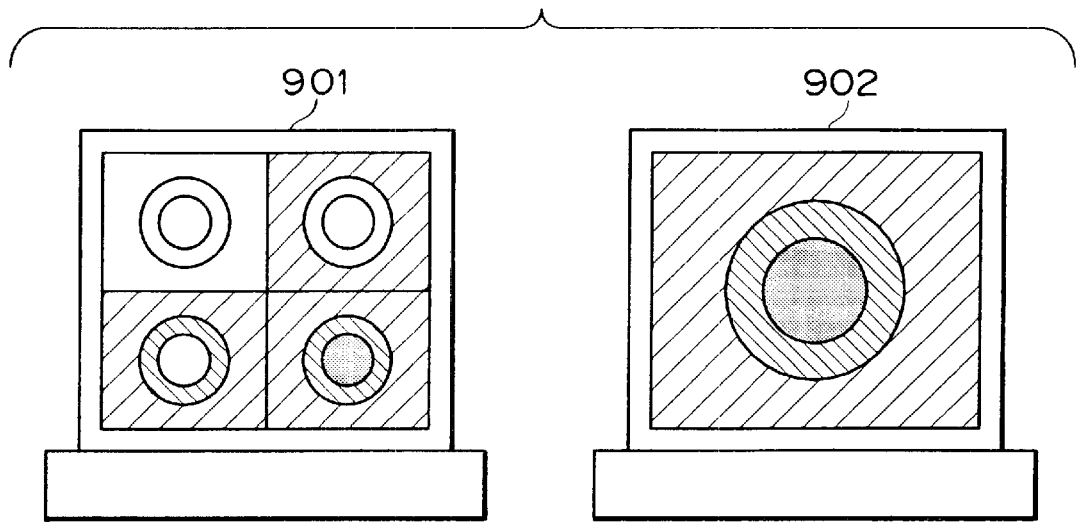
FIG. 9 is a diagram showing indication examples for displaying composite images on a real time basis according to the present invention.

FIG. 9 shows indication examples for displaying composite images on a real time basis according to the present invention. An indication example 901 displays images composed one after another, in the display monitor of a workstation, etc. by dividing the screen to accommodate each of the composite images so that the process in which the composite images are produced can be observed by comparing one image with the next. The other indication example 902 displays only the latest composite image from among the images composed one after another in the display monitor. This embodiment also has a function in which it is possible to stop the series of processes from acquisition of an image to its indication, by input from a input means 113 connected to a control computer 111 shown in FIG. 1 when an image having a desired in-focus portion has been found, while observing the series of composite images.

With this arrangement, it is possible to eliminate unnecessary electron beam irradiation that is not related to capturing of an image, and perform automatic focus control of a target portion efficiently and in a short time.

[Fifth Embodiment]

Figure 10:
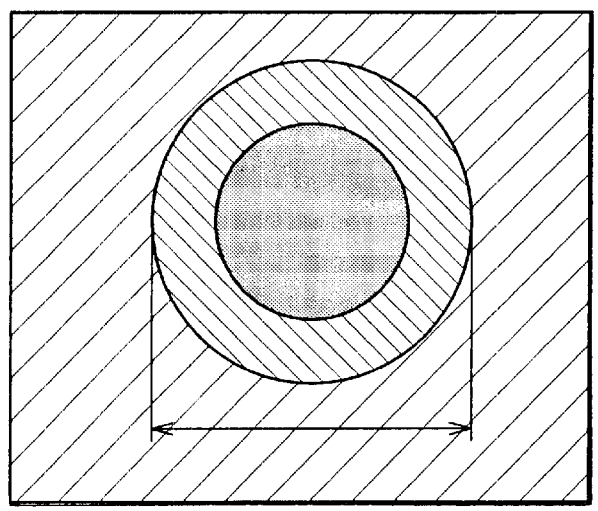
FIG. 10 is a diagram showing an example of measuring a length using a composite image according to the present invention.

FIG. 10 shows an example of measuring a length using a composite image according to the present invention. A composite-image creation function according to the present invention is added to a scanning electron microscope having a function of measuring the shape of a semiconductor so that it is possible to measure a shape on a composite image by use of these functions.

Furthermore, it is possible to select an image of a specific focus, selectively read pixels indicating an in-focus evaluation value larger than a predetermined value from the image, and measure a length based on the pixels. This arrangement makes it possible to, for example, selectively read only the bottom portion image of a contact hole and measure a length based on the image so as to eliminate an error in length measurement due to an erroneous judgement of an edge position of the contact hole, resulting in realization of highly accurate length measurement.

[Sixth Embodiment]

Figure 12:
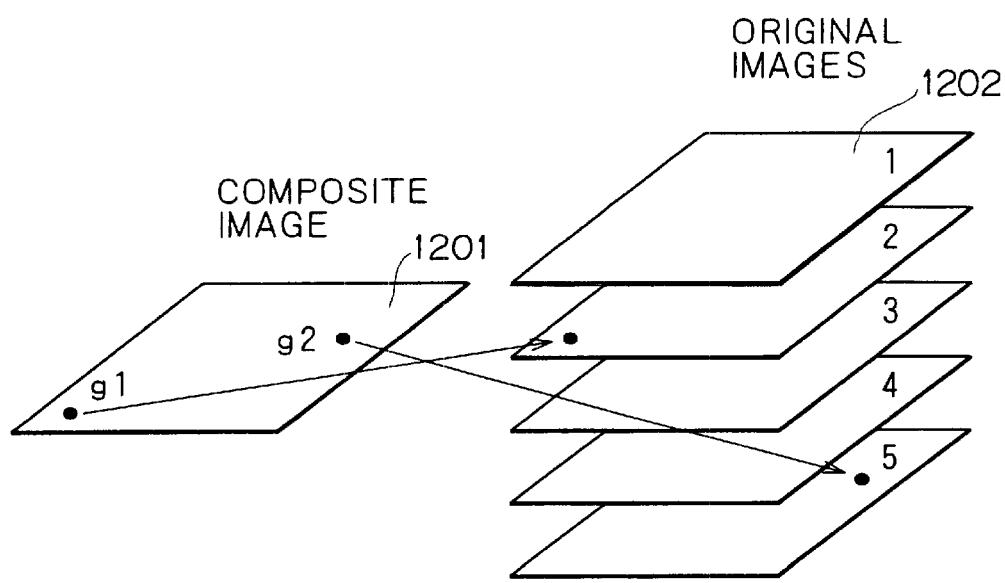
FIG. 12 is a schematic diagram showing a method for calculating a height difference between two given points in a composite image according to the present invention.
Figure 13:
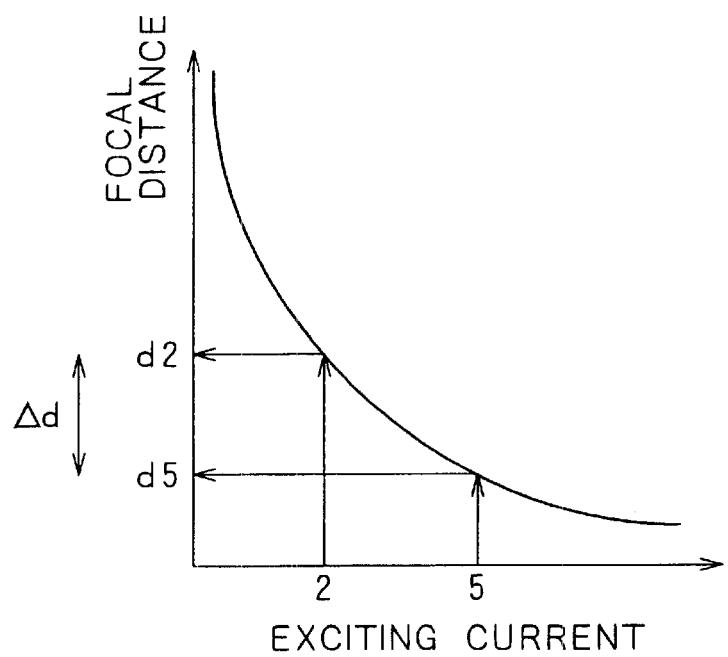
FIG. 13 is a graph showing a relationship between an excitation current and a focal distance.

FIG. 12 is a schematic diagram showing a method for determining the height difference between two given points in a composite image according to the present invention using the difference between exciting currents used when the original images of the pixels at the two given points are captured. To find the height difference between two points (pixels) g1 and g2 in a composite image 1201, it is necessary to check in which original images 1202 the corresponding pixels existed. When the point g1 existed in an original image 2 and the point g2 existed in an original image 5, the height difference between the two points g1 and g2 can be calculated from a difference $\Delta d$ between a focal distance d2 corresponding to the exciting current for the original image 2 and a focal distance d5 corresponding to the exciting current for the original image 5, using a relationship between an exciting current and a focal distance shown in FIG. 13.

Figure 15:
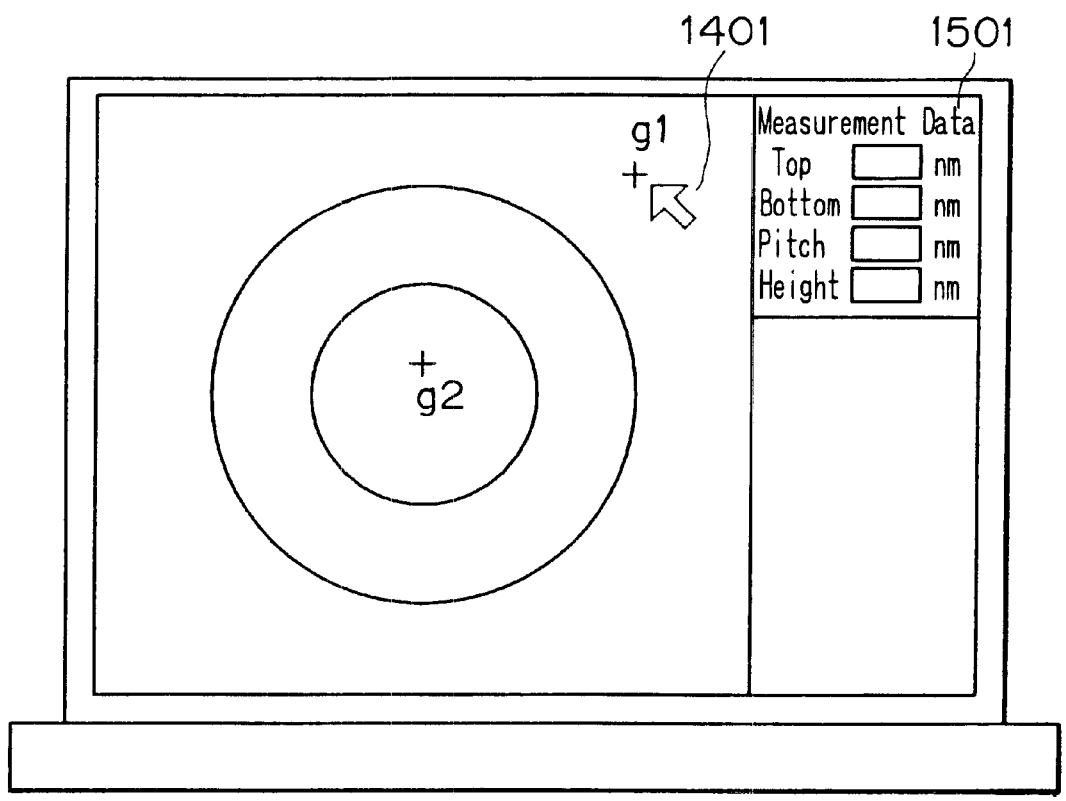
FIG. 15 is a diagram showing an example of a GUI screen for an apparatus according to an embodiment of the present invention.
Figure 16:
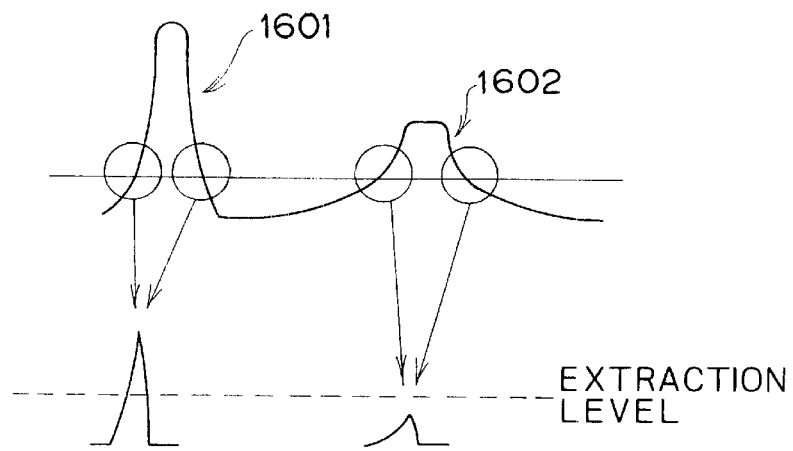
FIG. 16 is a diagram showing a method for detecting a concave/convex contour.
Figure 17:
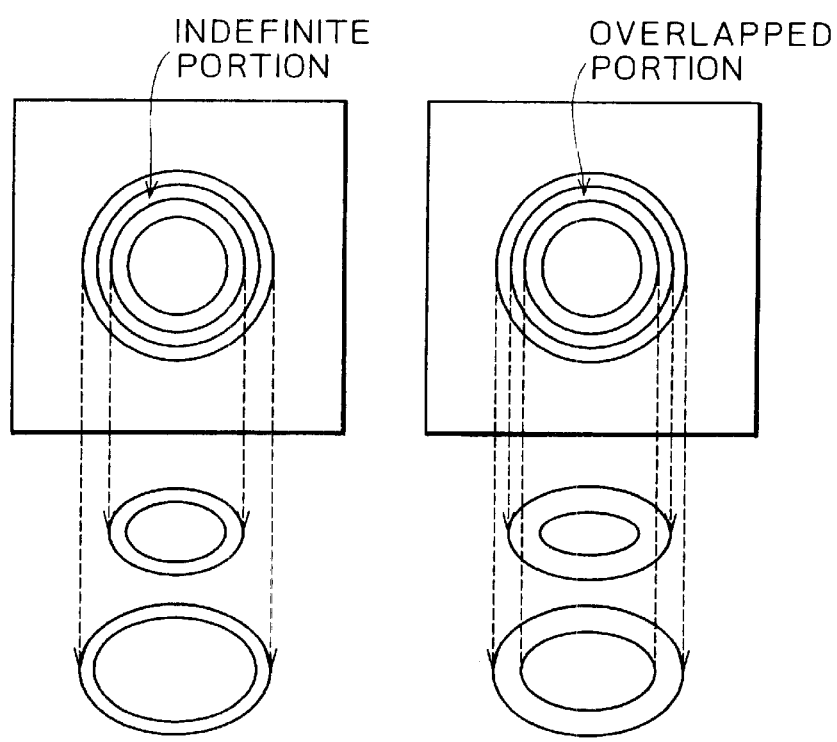
FIG. 17 is a diagram showing composition results in concave/convex contour detection.

FIG. 15 shows a GUI screen (Guide User Interface) example for specifying the points g1 and g2 in a display device. This GUI screen has a cursor 1401 movable by a pointing device and a display column 1501 for length measurement results, therein. If it is arranged such that the points g1 and g2 can be specified by use of the cursor 1401, an operator can, for example, specify the surface of a sample and the bottom surface of a contact hole while observing the image of the contact hole so that the depth of the contact hole can be measured.

According to this embodiment, positions to be set as the points g1 and g2 (reference points for depth-direction measurement) can be accurately specified in a two-dimensional image, which makes it possible to accurately measure a depth-direction dimension of a sample, which is difficult to determine in a two-dimensional image. Since in the example shown in FIG. 15, the point g1 is set to the surface of a sample and the point g2 is set to the bottom of a contact hole, the formation depth of the contact hole can be accurately measured using the sample surface as a reference level.

Although the above description illustrates an example in which the two points g1 and g2 are specified as references for dimensional measurement, this should not be construed restrictively. A point g3 may be specified in addition to the points g1 and g2. Then, a sequence may be incorporated to measure the dimensional difference between the points g1 and g2, and the dimensional difference between the points g1 and g3 so that, for example, the depths of two contact holes can be compared. Since this specific example uses the same g1 as a reference for both contact holes, it is possible to accurately compare the formation depths of the contact holes.

An apparatus according to this embodiment can adopt a deceleration electric field forming technique in which a negative voltage is applied to a sample 102 or a sample stage 101 on which the sample is placed to produce an electric field between the sample or sample stage and an electron lens 106 which is set to a ground potential so as to reduce the energy of an irradiation electron beam when it has reached the sample (not shown).

This technique (hereinafter referred to as retarding technique) attains both reduction of color aberration by passing an electron beam through the electron lens 106 at high acceleration speed and prevention of charge-up by reducing the acceleration speed of the electron beam when it has reached a sample.

In a scanning electron microscope using a retarding technique, a negative voltage is applied to a sample as described above. The focus of an electron beam can also be adjusted by adjusting this applied negative voltage. In an embodiment according to the present invention, a negative voltage applied to a sample may be changed in a stepwise manner, and an image obtained at each step may be stored. In this case, a focal distance can be decided by the magnitude of the applied negative voltage.

As described in detail above, an apparatus according to an embodiment of the present invention can acquire a sample image which is locally in focus. [Seventh Embodiment]

Figure 18:
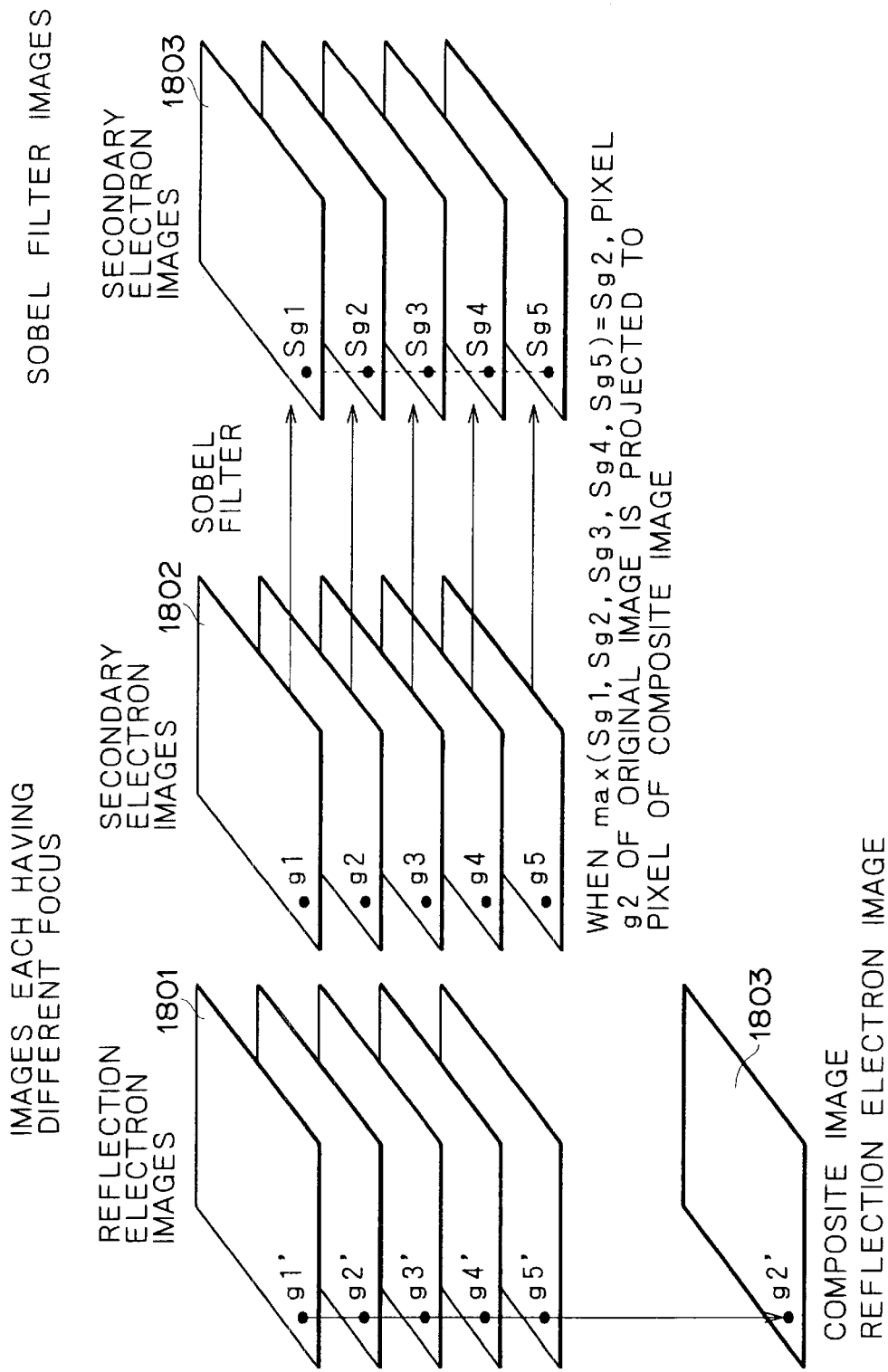
FIG. 18 is a schematic diagram showing an image composing process by determining an in-focus degree using a signal of type different from one used for composition detected at the same time.

FIG. 18 is a schematic diagram showing an image composing process in which an in-focus degree is determined using different types of signals detected at the same time according to an embodiment of the present invention. Different types of signals that can be detected at the same time in a scanning electron microscope are secondary electrons and reflection electrons. A general SEM image uses secondary electrons, but reflection electrons are sometimes used to obtain additional information about a sample. When a full-focused image is composed using reflection electrons, if reflection electron signals are weak and, as a result, the S/N ratio of each reflection electron image having a different focus is low, an image obtained by applying a differential process or a Sobel filter to a reflection electron image sometimes cannot be used for accurately performing in-focus determination. In this case, a secondary electron image is used for in-focus determination, while a reflection electron image is used for image composition. Numerals 1801 and 1802 denote a plurality of reflection electron images and a plurality of secondary electron images, respectively, captured at the same time by changing a focus. Therefore, a point g1 in an image 1801 and a point g1 in an image 1802 have different signal intensities but are located at the same position in a sample. Each of images 1803 is obtained by applying a Sobel filter to one of the secondary electron images 1802. Pixels Sg1 through Sg5 at same coordinates in the plurality of images 1803 are compared, and of these pixels, the largest one is detected. Supposing that pixel is the pixel Sg2, a pixel value g21 of a reflection electron image acquired at the same time with a pixel value g2 of the original image corresponding to the pixel Sg2 is projected to a pixel at the same coordinates in a composite image. A reflection electron composite image 1803 can be created by applying this process to all coordinates of the images.

Figure 19:
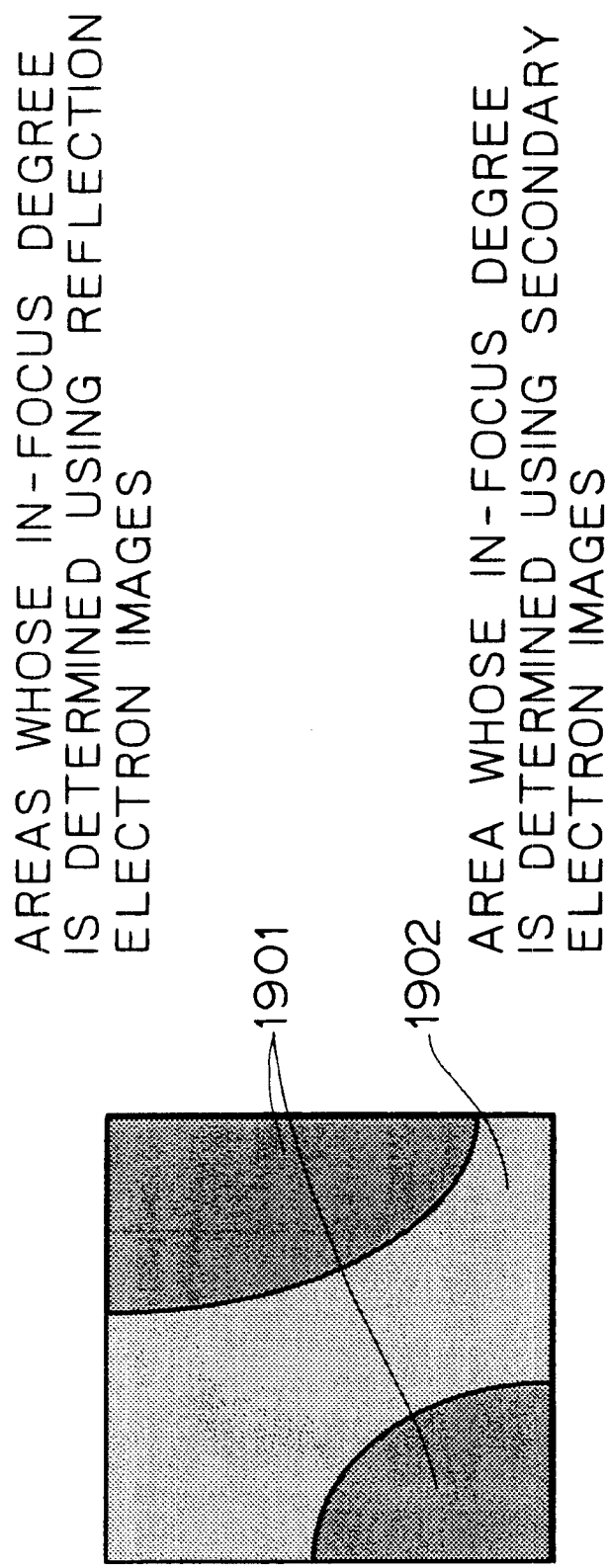
FIG. 19 is an example of a composite image obtained by characteristic quantity comparison by use of a plurality of different types of signals.

When use of only one type of signals for characteristic quantity comparison does not produce satisfactory results, another type of signals detected at the same time with the former type may also be used. FIG. 19 shows an example of an image composed by comparing also another type of signals. FIG. 18 shows an example in which secondary electron images are also used to compose a reflection electron image. In FIG. 18, reflection electron images are generally used for in-focus determination, and when use of reflection electron images for in-focus determination cannot produce satisfactory results, secondary electron images are additionally used. That is, in FIG. 19, an area 1901 is determined by in-focus determination using reflection electron images at the first stage, while an area 1902 is determined by in-focus determination using secondary electron images at the second stage since the area 1902 cannot be determined using reflection electron images at the first stage.

Figure 20:
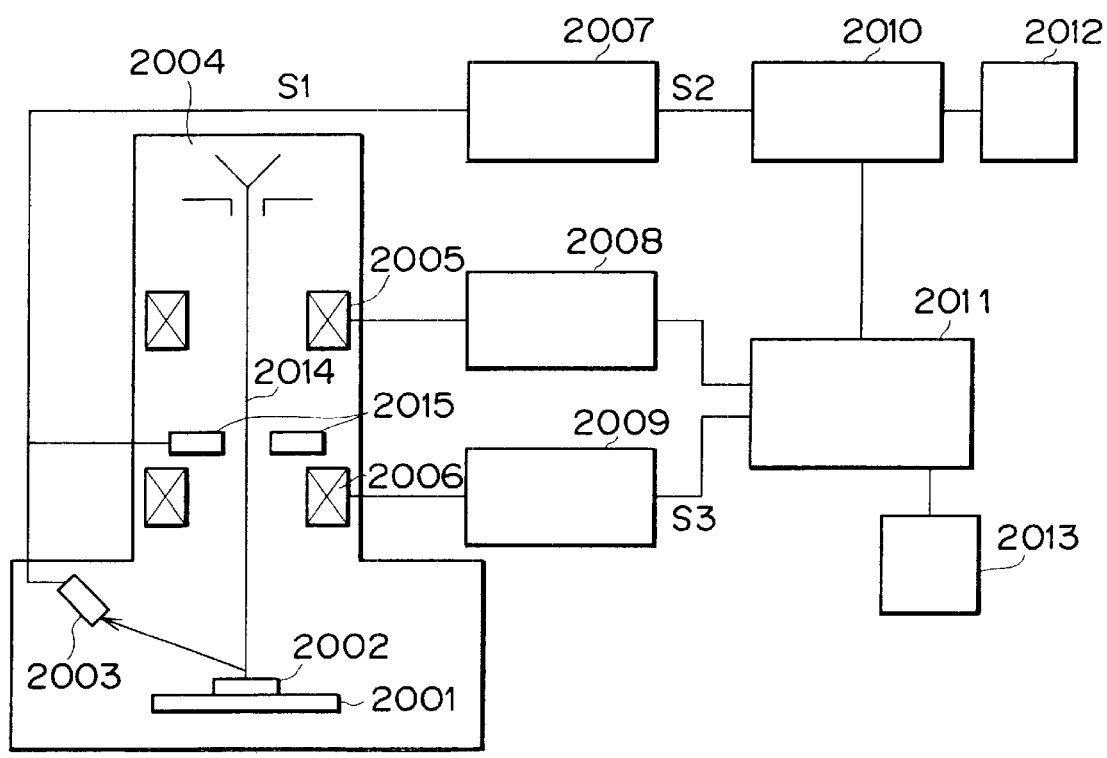
FIG. 20 is a schematic diagram of a configuration of a scanning electron microscope having a plurality of detectors.

FIG. 20 is a schematic diagram showing a scanning electron microscope having a plurality of detectors according to the present invention. Components indicated by numerals 2001 through 2014 correspond to components indicated by numerals 101 through 114 in FIG. 1. An electron beam 2014 is scanned on a sample 2002 by a scanning coil 2005, and a plurality of different types of electrons, for example secondary electrons and reflection electrons, emitted from the sample 2002 are detected by detectors. Secondary electrons are detected by a detector 2003, while reflection electrons are detected by a detector 2015. A signal Si from the detectors 2003 and 2015 is input to an AD converter 2007, which converts the signal into a digital signal S2.

[Eighth Embodiment]

A charged particle beam apparatus represented by a scanning electron microscope, or an optical inspection apparatus, which irradiates light such as laser light onto a sample, scans a beam on a target sample to obtain a pattern image of, for example, a semiconductor, an image sensor, or a display element. The embodiment described below relates to a technique suitable for properly scanning a sample regardless of its concave/convex portions to form a sample image, and inspecting the sample based on the sample image, in a charged particle beam apparatus or an optical inspection apparatus.

A beam scanning inspection apparatus such as a scanning electron microscope (hereinafter referred to as SEM) is suitable for measuring or observing patterns formed on a semiconductor wafer, which has been becoming finer. Of SEMs, a length measuring SEM produces a line profile based on, for example, a contrast obtained by irradiation of an electron beam onto a sample, or a signal amount of a secondary signal (secondary electrons and reflection electrons) generated from the sample to measure pattern dimensions based on the line profile.

Since SEMs thinly converge a beam and irradiate it onto a sample, it is necessary to properly focus the beam on the sample. Generally, a beam is focused so that a blur in edges of a sample structure image is minimized over the entire image.

However, semiconductor wafers recently have been multilayered and have become finer, making greater the height difference between the surface of a sample and the upper surface of a pattern formed on the sample or the bottom surface of a contact hole, as well as increasing the aspect ratio. As a result, a problem has arisen that the upper surface of a pattern and the sample surface have different proper beam focal distances.

A scanning electron microscope having an automatic focus control function as disclosed in Japanese Laid-Open Patent Publication No. 6-89687 (1994) uses a technique to change a focus in a stepwise manner and determine a proper excitation condition for an object lens based on a detection signal acquired for each focus. This method, however, can acquire only an average focus over the entire sample image, and has the problem that a portion having a height different from that of the sample surface, such as a pattern, becomes partially out of focus.

This means that it is not possible to accurately measure the formation width of a pattern formed on a semiconductor wafer, etc, and this problem has caused reduced measurement accuracy.

An object of this embodiment is to provide a beam scanning inspection apparatus capable of accurately measuring the formation width of a pattern formed on a semiconductor wafer, etc. by solving the above problem.

To accomplish the above object, a beam scanning inspection apparatus according to this embodiment forms images of a sample based on signals obtained by scanning a beam on the sample, said beam scanning inspection apparatus comprising: a means for changing a focus of said beam in a stepwise manner; a storage means for storing a sample image for each focus changed by said means; and a means for forming a sample image by overlapping the sample images stored in the storage means.

This beam scanning inspection apparatus also forms a line profile based on the overlapped sample image to measure dimensions according to the line profile.

In order to realize high integration density and high operation speed of semiconductor devices, it has been demanded to develop finer patterns formed on a semiconductor wafer, devices having a three-dimensional structure, and multilayered wiring.

On the other hand, development of finer patterns necessitates higher measurement accuracy on the inspection apparatus side, while development of devices having a three-dimensional structure and multilayered wiring further increases the aspect ratio (pattern height/pattern width) of a pattern to be measured. What this trend means to length measuring SEMs is that it is necessary to realize a higher resolution for increasing measurement accuracy and an increased focal depth for enabling observation of high aspect patterns (large-height-difference pattern) at the same time.

However, a resolution R and a focal depth DOF are proportional to each other as indicated by the following formula. A Focal depth decreases (becomes shallower) as a resolution is enhanced (becomes smaller) That is, their effects work against each other.

R d

DOF d/sin α( R)

d: diameter of electron beam, α: half aperture angle of electron beam

Therefore, when a fine and large-height-difference pattern is measured under high resolution conditions (extremely thin electron beam), focusing on the upper surface of the pattern blurs the surface of the substrate, making it impossible to measure pattern edges on the substrate surface (desired pattern width) with high length measurement accuracy.

On the other hand, considering the current focusing technique, it is very difficult to control an electron beam so that it is always focused on the substrate surface.

An object of this apparatus embodiment is to attain both enhancement of resolution and increasing of a focal depth which are mutually contradictory as described above.

To acquire high resolution, an electron beam diameter is decreased by increasing the reduction ratios of a converging lens and an object lens. Generally, the aperture angle (2α) of an electron beam incident on a sample surface increases as the reduction ratio is increased. As the aperture angle (2α) increases, an increase in the diameter of the electron beam (2α·ΔF) due to a focus deviation (ΔF) becomes larger. Observation with higher resolution is possible with a smaller electron beam diameter d on a focal surface since an electron beam of a smaller diameter is irradiated to an object on the focal surface. On the other hand, the image of an object placed apart from the focal surface, however little it is apart, becomes significantly blurred since the electron beam diameter (d+2α·ΔF) becomes larger.

Considering this problem, in order to attain both a large focal depth and a high resolution, this embodiment stores images captured with a large half aperture angle α and several focal positions matching the height of a pattern, and forms a sample image by overlapping these stored images. The principle is shown in FIGS. 22(A) to 22(D).

Figure 22:
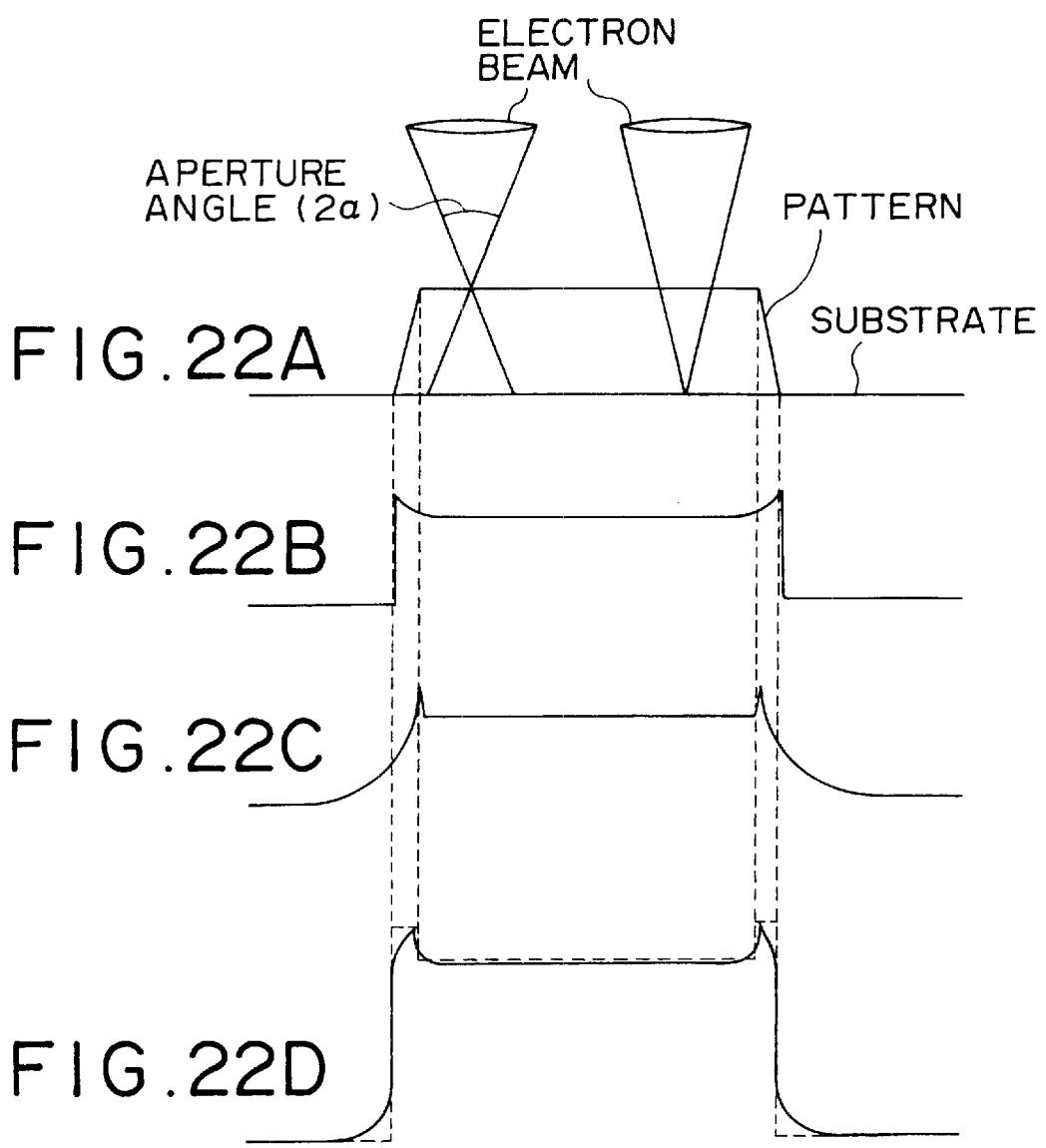
FIGS. 22(A) to 22(D) are diagrams for describing a line profile for each sample image obtained by changing a focus.

FIG. 22(C) shows a line profile obtained when a beam focused on the upper surface of a pattern (in the left in FIG. 22(A)) is scanned across the pattern. The edge profile on the upper surface of the pattern is distinct, while the edge profile on the substrate surface is not distinct. When a beam focused on the substrate surface is used, on the other hand, a line profile shown in FIG. 22(B) is produced in which the edges on the substrate surface is distinct but the edges on the upper surface is not.

Overlapping of line profiles in FIG. 22(B) and 22(C) produces a line profile having distinct edges both on the upper surface and the substrate surface as indicated by a solid line in FIG. 22(D). A broken line in FIG. 22(D) indicates an ideal line profile obtained when an ideal point beam (all portions in focus) is scanned across the pattern. As seen from the figure, the overlapped line profile indicated by the solid line in FIG. 22(D) is close to the ideal signal intensity distribution, compared with those in FIG. 22(B) and FIG. 22(C). That is, use of a overlapped profile makes it possible to accurately measure the dimension of a large height-difference pattern even with its focal position deviated.

As described above, the effect of an increased focal depth by overlapping images becomes more distinct with higher resolution. Furthermore, with a larger electron beam half aperture angle a, that is, with a smaller electron beam diameter, the image of an object at a focal position becomes clearer, whereas the image of an object apart from the focal position, however little apart, becomes more unclear (only a background contributing to only increasing of brightness of the entire image). This means that an overlapped image has a higher resolution.

Utilizing the above principle, this embodiment comprises: a means for repeating setting of a beam focal position, and formation and capture of a predetermined number of frame images; and a means for overlapping the plurality of frame images acquired by the above means to form a sample image.

With the above arrangement, both a high resolution and an increased focal depth can be attained. As a result, it is possible to accurately measure the dimension of a fine and large-height-difference pattern regardless of accuracy of a focal position.

It should be noted that changing a focal position on a frame basis makes the control operation easy, reducing at redundant time in measurement.

Figure 21:
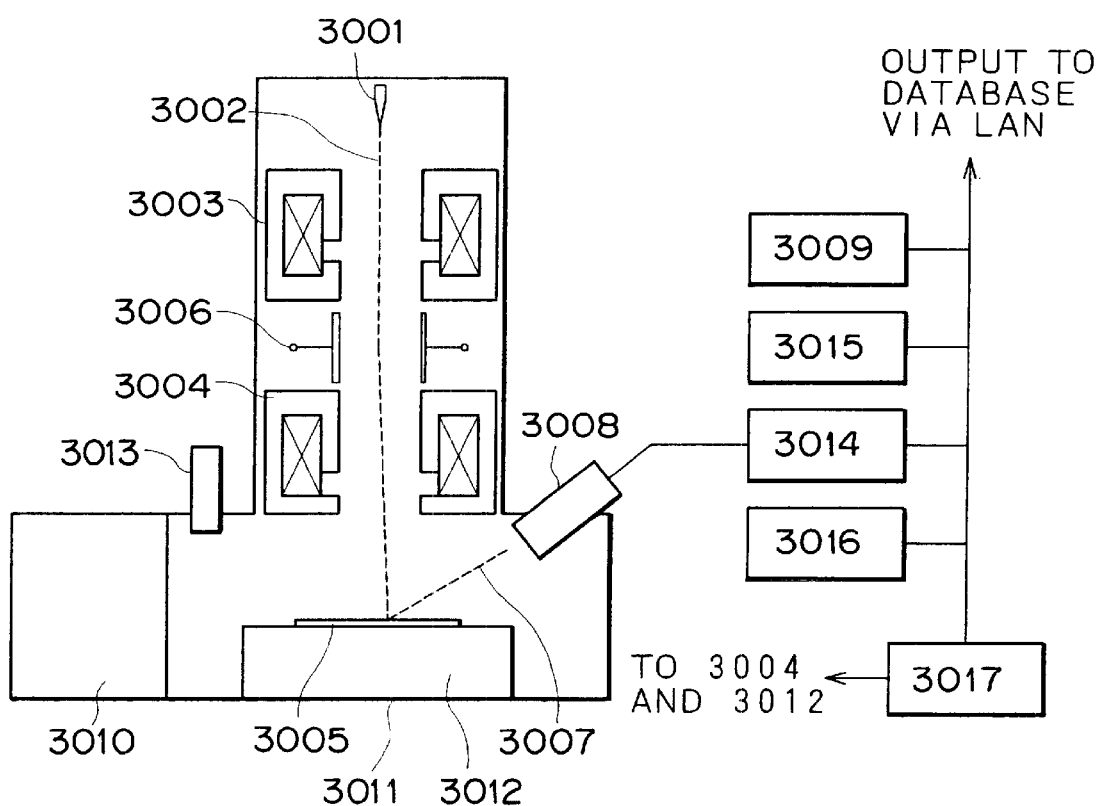
FIG. 21 is a diagram showing the principle of a scanning electron microscope suitable for composing an image using sample images obtained for each focus by changing a focus in a stepwise manner.

An apparatus according to this embodiment will be described in detail below using FIG. 21. Although the apparatus will be described with reference to a length measuring SEM used to measure the dimension of a pattern formed on a semiconductor wafer, etc., this should not be construed restrictively. A scanning ion microscope using an ion beam, or an optical microscope which forms a sample image by scanning laser light on the sample, may be used.

An electron beam 3002 emitted from an electron gun 3001 is thinly converged by a converging lens 3003 and an object lens 3004 after the beam is accelerated, and is focused on a sample wafer 3005. The converging lens is used to control the electron beam current value, while the object lens is used to adjust the focal position.

The electron beam 3002 that has been focused on the wafer is deflected by a deflector 3006 so that it is scanned on the wafer surface two-dimensionally or one-dimensionally. Part of the wafer irradiated with the electron beam 3002, in turn, emits secondary electrons 3007. The secondary electrons 3007 are detected by a secondary electron detector 3008 and converted into an electric signal. It should be noted that even though the following description assumes and thereby explains that the secondary electrons 3007 are detected, reflection electrons may be detected instead of, or in addition to the secondary electrons 3007.

The electric signal is subjected to signal processing such as A/D conversion in a signal processing unit 3014. The image signal subjected to signal processing is stored in a memory unit 3015, which is a storage medium, and used to apply intensity modulation or Y-modulation to a display 3009. The display 3009 is scanned in synchronization with scanning of an electron beam 3002 on the wafer surface so that a sample image is formed in the display. When the display is scanned two-dimensionally with intensity modulation applied, an image is displayed, while when the display is scanned one-dimensionally with Y-modulation applied, a line profile is drawn.

The sample image (an image and/or a line profile) is used to measure a pattern dimension as follows:
(1) First, an image is formed, and positioning of a pattern to be measured and focusing are performed.
(2) Next, a line profile is formed by scanning an electron beam across the pattern to be measured one-dimensionally in such a direction that a desired dimension can be acquired.
(3) Then, the pattern edges are determined from the line profile according to a predetermined pattern edge determination algorithm.
(4) Then, the dimension of the pattern to be measured is calculated from the distance between the pattern edges.
(5) Finally, the calculated value acquired is output as a dimensional measurement result.

A threshold method or a linear approximation method is generally used as a pattern edge determination algorithm. In the threshold method, a line profile is cut by a given threshold level, and the intersection points of the line profile and the threshold level are determined as pattern edges. By setting the threshold level to 50%, a measurement result close to the actual dimension can be acquired. In the linear approximation method, changes in a line profile in pattern edge portions are linearly approximated, and the intersection points of this approximated line and the base line of the line profile are determined as pattern edges.

A pattern measurement accuracy (length measurement accuracy) is inversely proportional to the diameter of an electron beam as a first approximation. Decreasing an electron beam diameter can reduce variations in length measurement values. On the other hand, decreasing an electron beam diameter also reduces an electron beam current. Specifically, an electron beam current is proportional to the square of an electron beam diameter. If a beam current is excessively reduced to decrease an electron beam diameter, the S/N ratio of a sample image will be lowered.

A large reduction in the S/N ratio deteriorates image quality, that is, resolution, and reduces length measurement accuracy. That is, to achieve high length measurement accuracy, it is necessary to attain both a reduced electron beam diameter and a sufficient S/N ratio (which lead to high resolution).

To satisfy these requirements, this embodiment employs a method in which a plurality of frames are overlapped to form a sample image. The processes employed in this method are performed in the following order.
(1) A sample image is formed using an electron beam of a small diameter. (This is called a frame image. The image quality is not good because the S/N ratio is low.)
(2) Formation of a frame image is repeated a plurality of times, for example, 20 times.)
(3) Twenty frame images obtained in (2) are overlapped to form a sample image of a sufficient resolution (an image which is captured with a small electron beam diameter and has a high S/N ratio).
(4) The sample image acquired in (3) is processed to calculate pattern dimensions.

In this embodiment, the following procedure is used to measure a pattern dimension.

A wafer 3005 to be measured is extracted from a wafer cassette 3010 and is prealigned. Prealignment is an operation performed to orient the direction of a wafer using an orientation flat and a notch formed on the wafer as references.

After prealignment, a wafer number formed on the wafer 3005 is read by a wafer number reader (not shown). A wafer number is specific to each wafer. A recipe previously registered for this wafer is read using the read wafer number as a key. After this, operations are performed according to this recipe automatically or semi-automatically.

After the recipe is read, the wafer 3005 is transferred onto a X-Y stage 3012 in a sample chamber 3011, which is kept vacuous, and is loaded there. The wafer 3005 fitted on the X-Y stage 3012 is aligned using an optical microscope 3013 fitted on the upper surface of the sample chamber 3011 and an alignment pattern formed on the wafer 3005.

The alignment is performed using the alignment pattern formed on the wafer to correct the position coordinate system on the X-Y stage and the pattern position coordinate system in the wafer. An optical microscope image acquired by magnifying the alignment pattern a few hundreds times is compared with an alignment pattern reference image registered in the memory unit 3015, and correct the stage position coordinates to exactly align the visual field of the optical microscope image with that of the reference image.

After the alignment, the visual field is moved to the position of a predetermined pattern to be measured by rig use of the X-Y stage 3012 and a deflection coil 3006, and the pattern to be measured is positioned. Then, after the focal position is set with the current visual field position, a sample image of the pattern to be measured is formed using the frame image overlapping method as described above and stored in the memory unit 3015.

Focusing is performed by generally observing the signal intensity distribution (a line profile) of a sample image, and adjusting the focus to a position at which the line profile is considered to be most distinct. Then, using a sample image read from the memory unit 3015, a dimension measurement unit 3016 calculates the dimension of the pattern to be measured according to a predetermined pattern edge determination algorithm.

An apparatus according to this embodiment performs the following processes at the time of forming a sample image. Utilizing the characteristic that the focal distance of a magnetic lens is almost inversely proportional to the square of the exciting current, a control unit 3017 in FIG. 21 changes the focal position of an electron beam for each predetermined number of frames by controlling the exciting current for the object lens 3004.

For example, within a predetermined range of focal distance set so that it includes a focal position acquired using the above-mentioned focusing method, the exciting current is changed from the largest value to a smaller value by steps (that is, the focal position is changed from the neighborhood of the upper surface of a pattern to the substrate surface by steps) to acquire and store frame images like four frames, six frames, eight frames, ten frames, twelve frames, and so on.

Here, the number of frames captured at one step is increased as the substrate is approached, considering the fact that the secondary electron signal amount is reduced at positions closer to the substrate since electrons emitted from the substrate are obstructed by the side walls of a pattern. This makes it possible to acquire an image having uniform brightness over the entire sample and a high resolution.

Next, the stored frame images are read out and overlapped to form a sample image after they are passed through a high pass filter to cut off low-space-frequency components. Frame images captured at positions upwardly away from the pattern surface or downwardly away from the substrate surface have almost uniform brightness (image composed of only low-space-frequency components) since the electron beam comes greatly out of focus there, and, therefore, overlapping the frame images with their lowspace-frequency components cut off does not deteriorate the resolution of the sample image.

These frame image acquisition conditions are registered in the memory unit 3015 as a recipe. A recipe specifies a measuring procedure or measuring conditions to automatically or semi-automatically perform measuring operations.

Incidentally, cutoff of the low-space-frequency components may be performed before forming or storing frame images, instead of being performed as a preprocess for overlapping of frame images. Either way, a sample image having more distinct pattern edges can be acquired since the low-space-frequency components are cut off by a high pass filter, making it possible to remove signal components originated from objects apart from the focal position.

A line profile is formed based on this sample image. Then, pattern lengths are measured based on the distance between edges of the line profile. In this apparatus embodiment, these processes are performed by the control unit 3017.

Then, the operations after alignment are repeated for each of predetermined measurement positions in the wafer to measure lengths. This completes the measurement of one wafer. If there are a plurality of wafers to be measured left in the wafer cassette, the next wafer is taken out and measured according to the above procedure, one after another. The dimensional measurement results are output together with measurement position coordinate data and images of the measurement positions, and registered with a database (not shown) for future analysis.

Even though this embodiment controls the exciting current for the object lens to change a focal position, the height of the stage may be changed instead for that purpose.

In the case of an apparatus using a retarding technique in which a negative voltage is applied to a sample to form a deceleration electric field for an electron beam so as to reduce damage to the sample and charge-up caused by a highly accelerated electron beam, the negative voltage applied to the sample may be changed to adjust the focus of the electron beam.

For an insulator sample whose charge-up takes time to saturate, an image of the sample may be captured after the sample is irradiated with an electron beam for a predetermined period of time. This pre-irradiation operation can be registered as a recipe.

Even though this apparatus embodiment uses an electron beam as a probe for pattern dimensional measurement, an ion beam may be used instead. Also, even though this apparatus embodiment uses one probe, a multi-probe method may be used to form an image. Furthermore, this embodiment illustrates observation of a semiconductor wafer, but a wafer for an image sensor or a display element, or a sample other than any wafers may be observed.

This apparatus embodiment makes it possible to attain both a high resolution and an increased focal depth. As a result, a sample captured at a high resolution is more distinctly observed. Furthermore, a length measuring SEM according to this embodiment can accurately measure the dimension of a fine and large-height-difference pattern.

[Ninth Embodiment]

As described below, this embodiment relates to an apparatus suitable for reducing mixing of noise during the above-mentioned image composition.

Techniques for observing a three-dimensional structure using an electron microscope image are disclosed in Japanese Laid-Open Patent Publications Nos. 5-128989 (1993) and 5-299048 (1993), which are described earlier, and 9-92195 (1997).

A conventional technique for evaluating a noise amount is described in John Immerkaer's "Fast Noise Variance Estimation", Computer Vision and Image Understanding, Vol. 64, No. 2, 1996, p. 300-302.

As semiconductor wafers have been multilayered, their sample has taken a shape extending three-dimensionally, and furthermore, since enhanced resolution of electron microscopes has decreased focal depth, the need for observing a three-dimensional structure is increasing. On the other hand, although conventional techniques for observing a three-dimensional structure using an image captured by an electron microscope are disclosed in Japanese Laid-Open Patent Publications Nos. 5-128989 (1993), which observes a three-dimensional image, and 5-299048 (1993), which uses contour lines and bird's eye views, these techniques are not suitable for forming a two-dimensional image. Compared with these techniques, a full-focused image composition technique in which a plurality of images each having a different portion in focus are used to compose a two-dimensional image whose every portion is in focus, is simple and easy to use, and expected to be applied to electron microscope images. However, since an electron microscope image has a large amount of noise, it is necessary to give consideration to noise. Since an optically captured image includes relatively little noise, the conventional full-focused image composition technique for optical images has given no consideration to noise. When an electron microscope image is composed using the conventional method, some artifacts occur, producing an unnatural full-focused image.

An object of this embodiment is to provide a method and an apparatus for composing a full-focused image which looks natural and does not look like an artificially composed image even from input images having much noise.

Description will be made of a composite image generating method according to this embodiment or an apparatus using it, said apparatus comprising a plurality of full-focused image composing means for performing a series of steps included in said method, said series of steps comprising the steps of: reducing noise of a plurality of input images each read with a different focus; evaluating noise amounts of the noise-reduced images whose noise has been reduced and evaluating in-focus degrees of said noise-reduced images to calculate signal change amount evaluation values; generating a maximum signal change amount evaluation value and composition information based on the calculated signal change amount evaluation values; and generating favorableness degree information by determining a noise influence degree using said maximum signal change amount evaluation value and said noise amount evaluation values; and said method further comprising a step of: generating a composite image based on a plurality of pieces of said favorableness degree information and a plurality of pieces of said composition information generated by a plurality of said full-focused image composing means.

Figure 23:
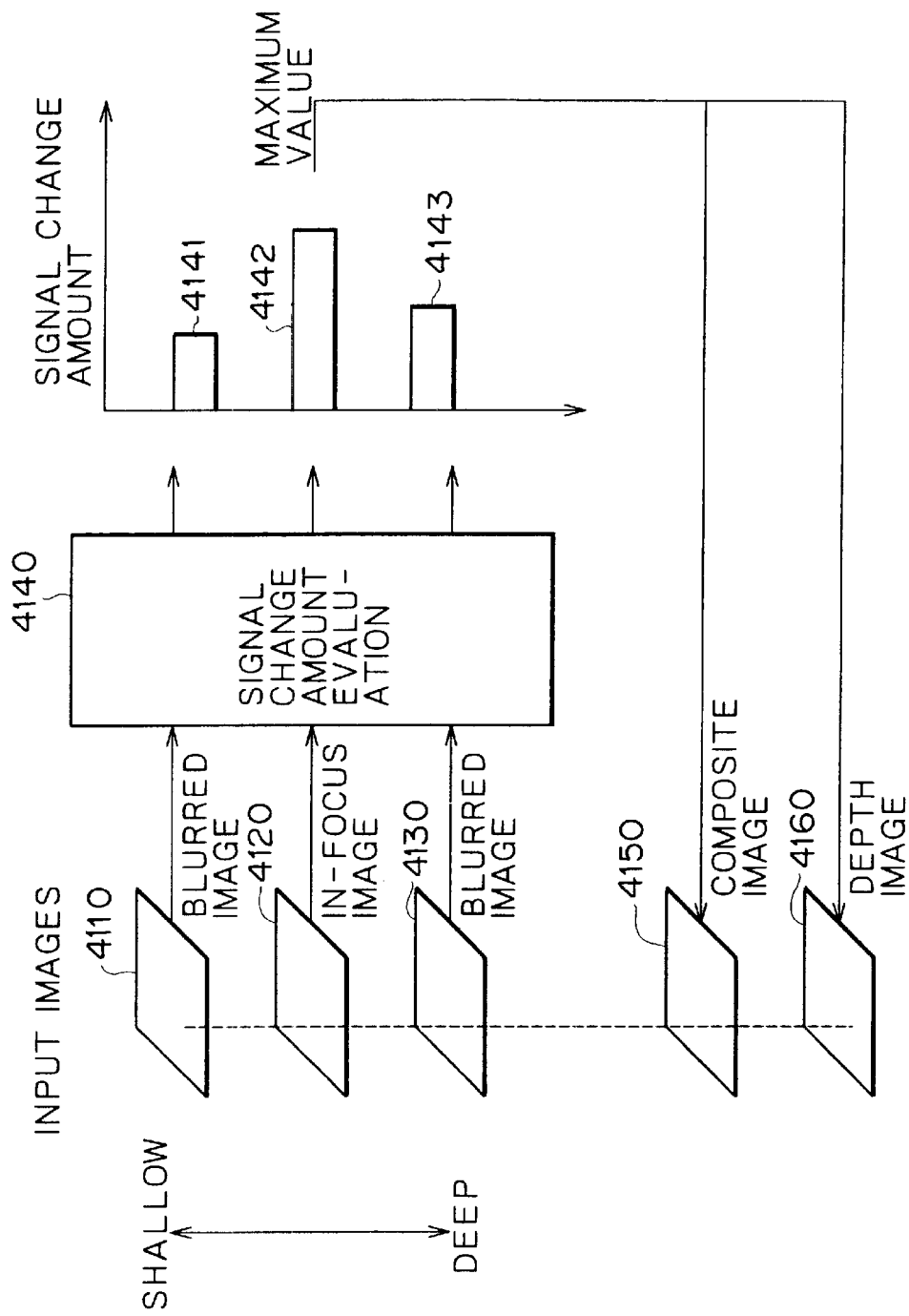
FIG. 23 is a diagram showing the concept of full-focused image composition.

FIG. 23 is a diagram showing the concept of full-focused image composition according to the present invention. Reference numerals 4110, 4120, and 4130 indicate a plurality of input images captured by changing a focus; 4140 denotes a signal change amount evaluation; 4141, 4142, and 4143 are signal change amounts corresponding to the input images 4110, 4120, and 4130, respectively; 4150 indicates a composite image; and 4160 indicates a depth image. Select a corresponding pixel in each of the input images 4110, 4120, and 4130 and suppose that the pixel of the image 4110 and its neighborhood are blurred while the pixel of the image 4120 is in focus, and the pixel of the image 4130 and its neighborhood are also blurred. Signals from the neighborhood of a blurred pixel show little changes while signals from the neighborhood of a pixel in focus show large changes. According to evaluation of those signal change amounts by the signal change amount evaluation 4140, the signal change amounts are represented by bars 4141, 4142, and 4143 shown in FIG. 23, indicating that the signal change amount 4142 of the image 4120 in focus has the largest value. Therefore, a pixel of the input image 4120 corresponding to the bar 4142 showing the largest signal change amount is set as a pixel at the corresponding position in a composite image 4150. Depth information for the image 4120 corresponding to the bar 4142 showing the largest signal change amount is set as a pixel at the corresponding position in a depth-image 4160. Even though the focal distance of an input image is preferably used as a pixel value to indicate depth information since the actual depth of an imaged object is directly given, another method may be employed. For example, the input images 4110, 4120, and 4130 may be numbered such as #1, #2, and #3 to be used as depth information. In short, it is only necessary to make sure which input image has been selected. Repeating the above operation for all pixels composes the composite image 4150 whose every portion is in focus.

[Tenth Embodiment]

Figure 24:
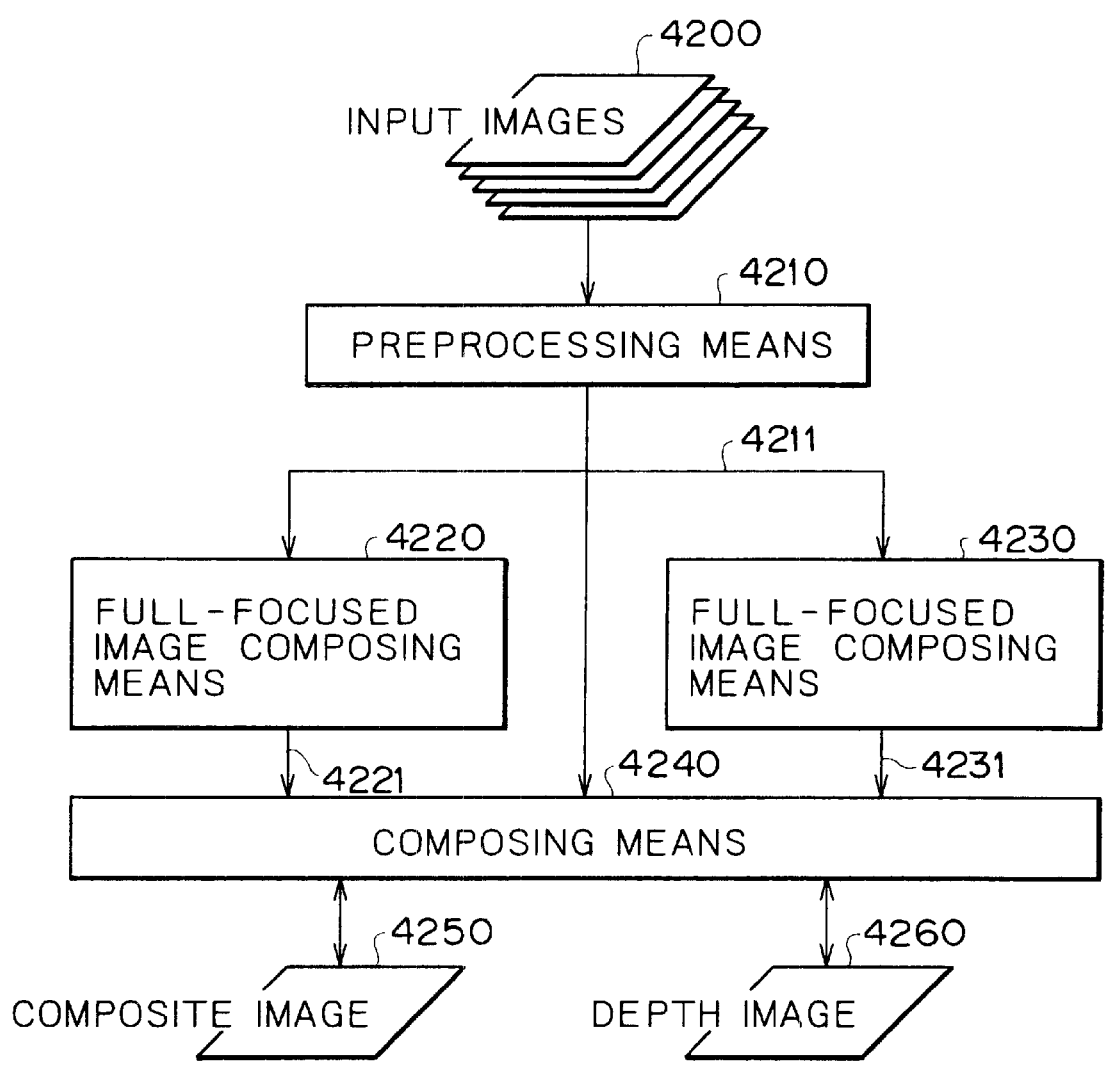
FIG. 24 is a diagram showing an embodiment of full-focused image composition.

FIG. 24 shows a tenth embodiment according to the present invention.

Input images 4200 are processed in a preprocess 4210, and then fed to full-focused image composing means 4220 and 4230, which compose different full-focused images and generate sets of composition information and favorableness degree information 4221 and 4231, respectively. Based on the sets of composition information and favorableness degree information 4221 and 4231, a composing means 4240 composes a composite image 4250 and a depth image 4260 by selecting each pixel most suitable for the purpose of the composition from corresponding pixels of input images 4211 after the preprocess. As described above, a plurality of full-focused composite images can be used to compose a more favorable composite image by connecting each favorable pixel selected from one of these full-focused composite images. Although this example uses two full-focused image composing means, the example can easily be extended to employ three or more full-focused image composing means.

[Eleventh Embodiment]

Figure 25:
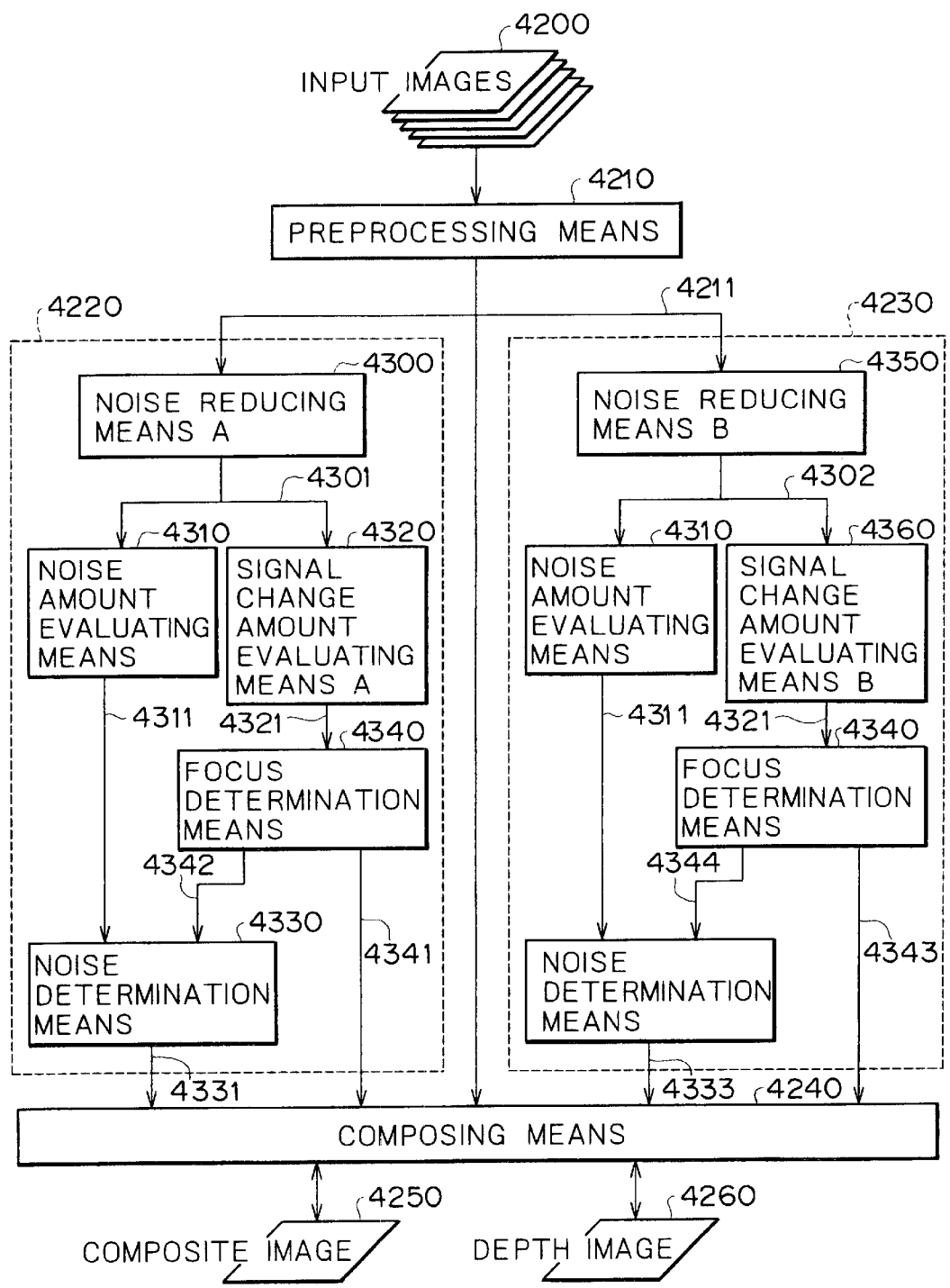
FIG. 25 is a diagram showing another embodiment of full-focused image composition.

FIG. 25 shows an eleventh embodiment according to the present invention. This embodiment discloses a specific configuration of the tenth embodiment by limiting the meaning of the term "favorable" used in description of the tenth embodiment to mean "unsusceptible to noise influence".

Since a full-focused image composing means 4230 has the same configuration as that for a full-focused image composing means 4220, the full-focused image composing means 4220 will be mainly described. Input images are preprocessed by a preprocessing means 4210, and then the noise of the input images is reduced by a noise reducing means 4300. Specific examples of the noise reducing means include a noise reduction filter and smoothing reduction. Here, smoothing reduction example will be described. A noise amount evaluating means 4310 calculates noise amount evaluation values 4311 of noise reduced images 4301, while a signal change amount evaluating means 4320 calculates signal change amount evaluation values 4321, which indicate in-focus degrees, from the noise-reduced images 4301. A focus determination means 4340 generates a maximum signal change amount value 4342 and composition information 4341 using the signal change amount evaluation values 4321. The maximum signal change amount value 4342 is fed to a noise determination means 4330, which outputs favorableness degree information 4331 indicating the degree of noise influence. The full-focused image composing means 4230 operates similarly as the full-focused image composing means 4220. However, if a noise reducing means 4350 is set so that it provides larger smoothing reduction than the noise reducing means 4300 does, the processing results from the full-focused image composing means 4230 shows larger noise reduction effect but reduced space resolution, compared with those from the full-focused image composing means 4220. That is, while the full-focused image composing means 4220 provides an image that does not have many favorable portions free from noise influence but has a high space resolution, the full-focused image composing means 4230 provides an image that has many favorable portions free from noise influence but has a low space resolution. A composing means 4240 composes a composite image 4250 that has many favorable portions free from noise influence and a high space resolution, by selecting each pixel subjected to less noise influence from one of the images to compose a composite image having little noise. Although this example uses two fall-focused image composing means, the example can easily be extended to employ three or more full-focused image composing means.

Figure 26:
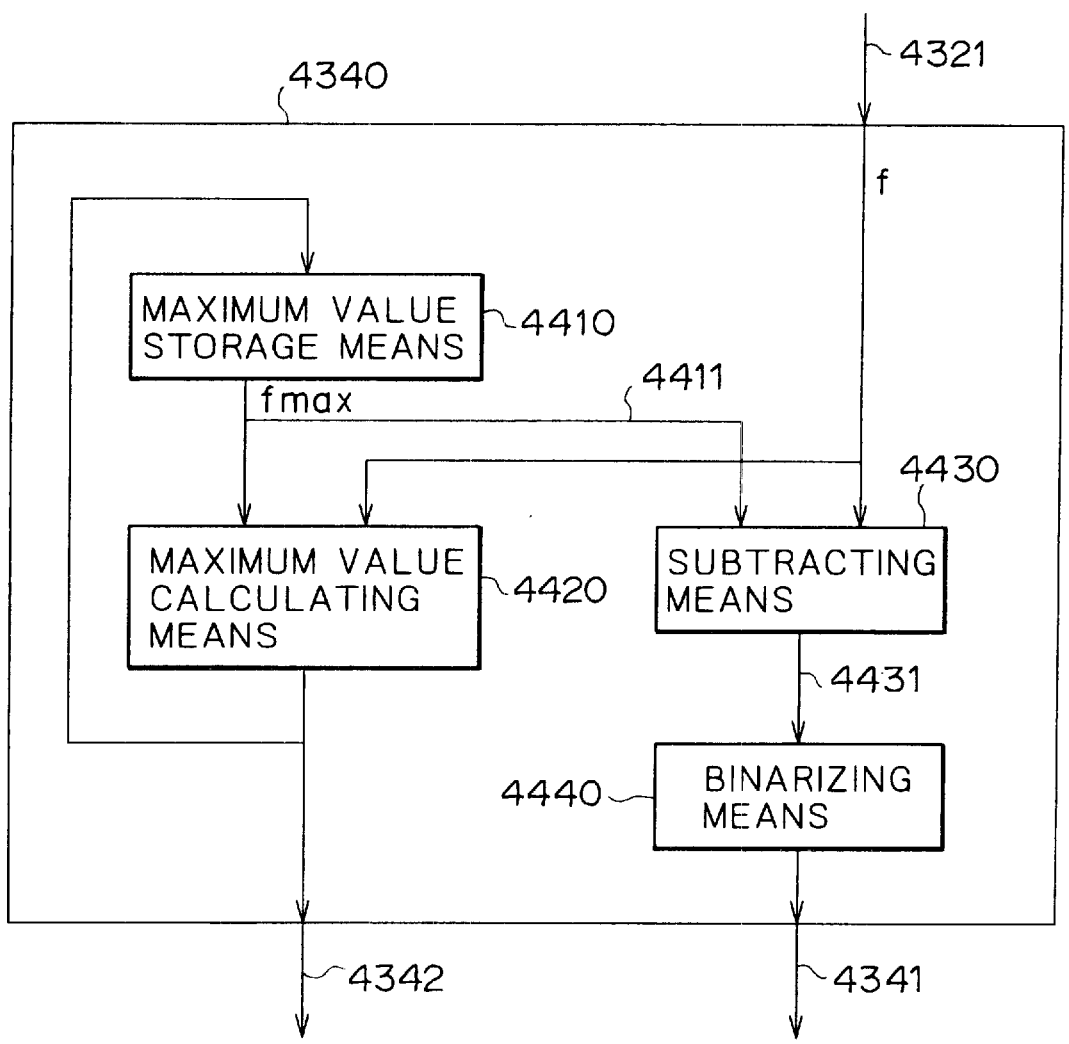
FIG. 26 is a diagram showing a configuration of a focus determination means.

FIG. 26 shows a configuration of a focus determination means 4340.

A maximum value storage means 4410 currently stores a maximum signal change amount value 4411 calculated up to the last image. A maximum value calculating means 4420 compares the maximum signal change amount value 4411 calculated up to the last image against a signal change amount 4321 of the current image, and selects the larger one as a maximum signal change amount value 4342 for up to the current image to update the maximum value stored in the maximum value storage means 4410 with the selected value. A subtracting means 4430, on the other hand, calculates the difference between the maximum signal change amount value 4411 calculated up to the last image and the signal change amount 4321 of the current image, and a binarizing means 4440 determines whether the difference is larger than zero. That is, when the signal change amount 4321 is denoted as f and the maximum signal change amount value 4411 calculated up to the last image is denoted as fmax and composition information 4341 is represented as g, if $f > f\max$, $g=1$ if $f \leq f\max$, $g=0$ Therefore, when the signal change amount 4321 is larger than the maximum signal change amount value 4411 calculated up to the last image, g=1. That is, when a pixel of the current image should be selected as that for a composite image, its composition information g is set to 1.

Figure 27:
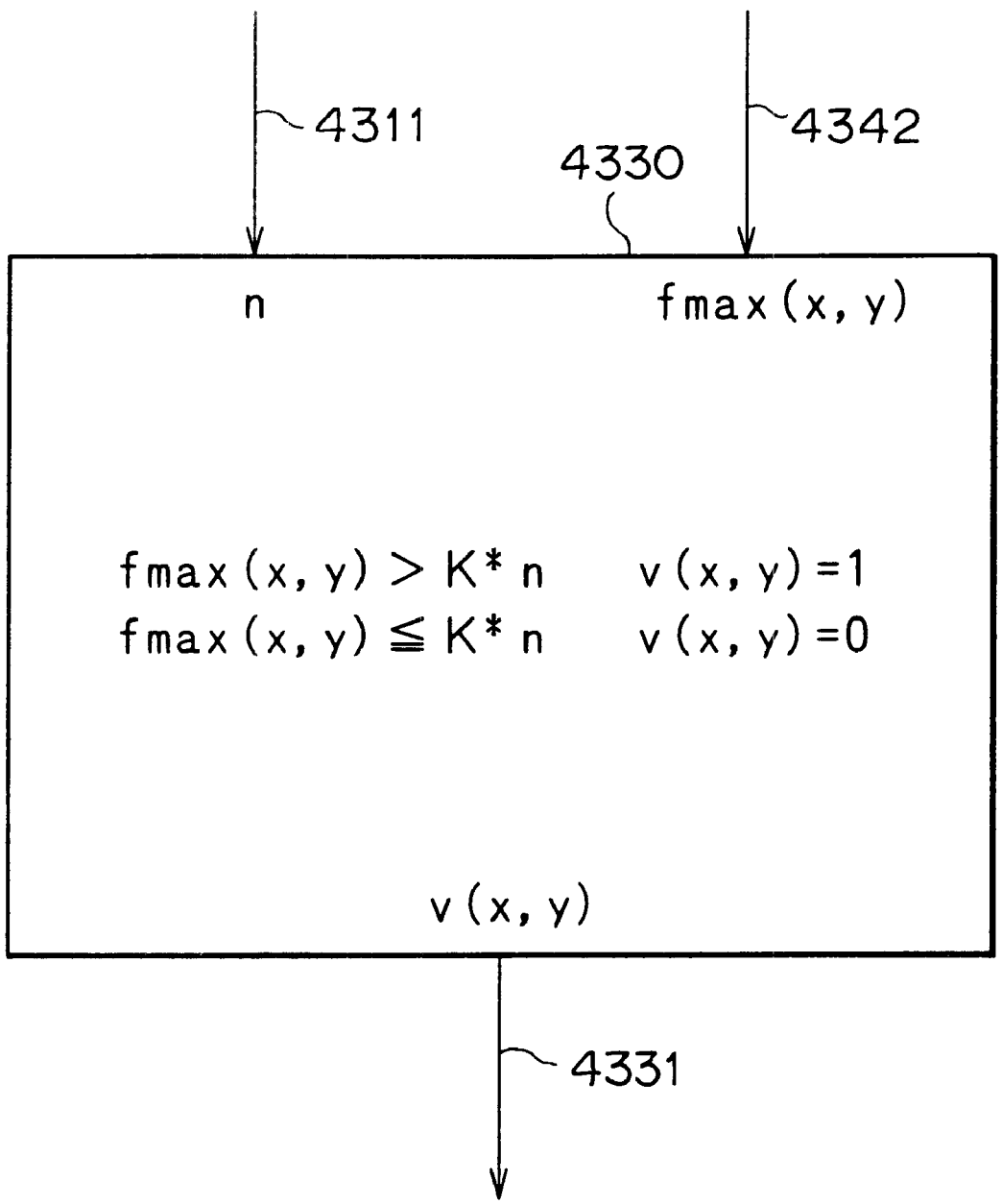
FIG. 27 is a diagram showing a configuration of a noise determination means.

FIG. 27 shows a configuration of a noise determination means 4330. The noise determination means 4330 receives the noise amount evaluation values 4311 and the maximum signal change amount value 4342, and outputs the favorableness degree information 4331. When the favorableness degree information 4331 is denoted as v and the maximum signal change amount value 4342 is denoted as fmax and a noise amount evaluation value 4311 is represented as N, if the maximum signal change amount value fmax is larger than the noise amount evaluation value N, the favorableness degree information v is set to 1 since there is little noise influence, which makes the favorableness degree high. When the maximum signal change amount value fmax is smaller than the noise amount evaluation value N, the favorableness degree information v is set to 0 since there is large noise influence, which makes the favorableness degree low. It should be noted that a noise amount evaluation value 4311 is multiplied by a constant K to change its scale so that the noise amount evaluation value 4311 can be appropriately compared with the maximum signal change amount value 4342. The above description of the noise determination means 4330 is expressed as follows:

When $f(x,y) > K^*n$, $v(x,y)=1$

When $f(x,y) \leq K^*n$, $v(x,y)=0$

The favorableness degree information 4331 to be output is set to 1 when there is little noise influence, which makes the favorableness degree high, while it is set to 0 when there is large noise influence, which makes the favorableness degree low.

Figure 28:
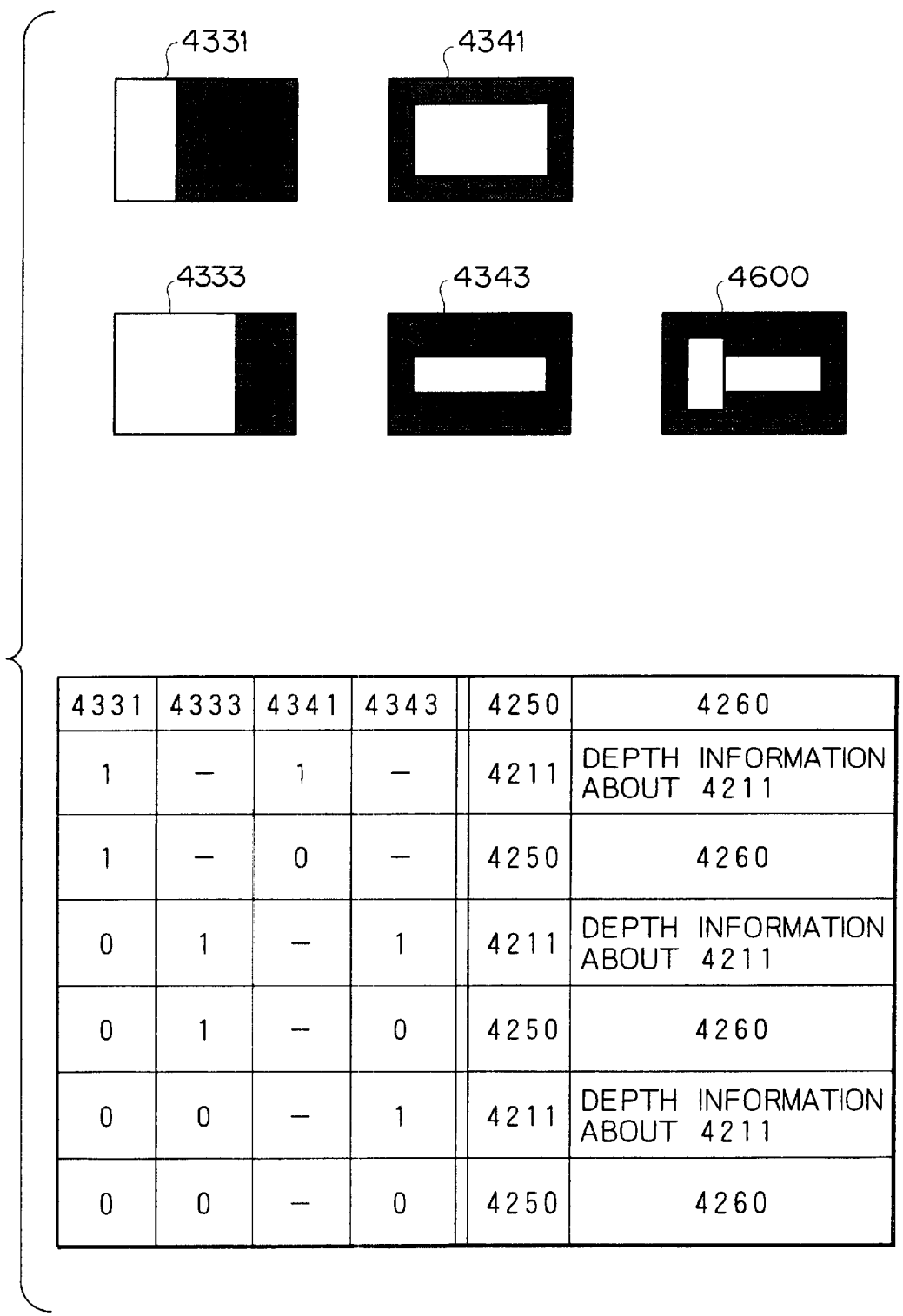
FIG. 28 is a diagram showing a configuration of a composing means.

FIG. 28 shows a configuration of the composing means 4240. The composing means 4240 receives pieces of composition information 4341 and 4343, pieces of favorableness degree information 4331 and 4333, and preprocessed input images 4211, and outputs the composite image 4250 and a depth image 4260. The pieces of favorableness degree information 4331 and 4333 are information used to show noise influence by indicating a portion subjected to little noise influence as 1 (white) and a portion subjected to large noise influence as 0 (black). Referring to FIG. 25, if it is arranged such that a noise reducing means B4350 provides larger smoothing reduction than that provided by a noise reducing means A4300, portions subjected to little noise influence, which is indicated by a value of 1 (white), in the favorableness degree information 4333 should be more extended than portions subjected to little noise influence, which is also indicated by a value of 1 (white), in the favorableness degree information 4331. Supposing that the pieces of composition information 4341 and 4343 have shapes as indicated in the figure, for portions in which the favorableness degree information 4331 is 1, the composition information 4341 is preferably used, while for portions in which the favorableness degree information 4331 is 0 and the favorableness degree information 4333 is 1, the composition information 4343 is preferably used. Furthermore, even though portions in which both the favorableness degree information 4331 and the favorableness degree information 4333 are 0 provide no reliable information, the favorableness degree information 4333 is arbitrarily used since either one or the other should be selected. Final composition information 4600 composed of only portions subjected to little noise influence is shown in the figure. Portions of the composite image 4250 in which the final composition information 4600 is 1 are updated with pixels of the preprocessed input images 4211, while portions of the composite image 4250 in which the final composition information 4600 is 0 are left unchanged without updating the original pixels. On the other hand, portions of the depth image 4260 in which the final composition information 4600 is 1 are updated with depth information of the preprocessed input images 4211, while portions of the depth image 4260 in which the final composition information 4600 is 0 are left unchanged without updating the original pixels of the depth image 4260. Thus, optimum composition concerning noise reduction is attained by combining portions subjected to little noise influence with their high space resolution unchanged and portions subjected to large noise influence with their space resolution decreased to reduce their noise.

Figure 29:
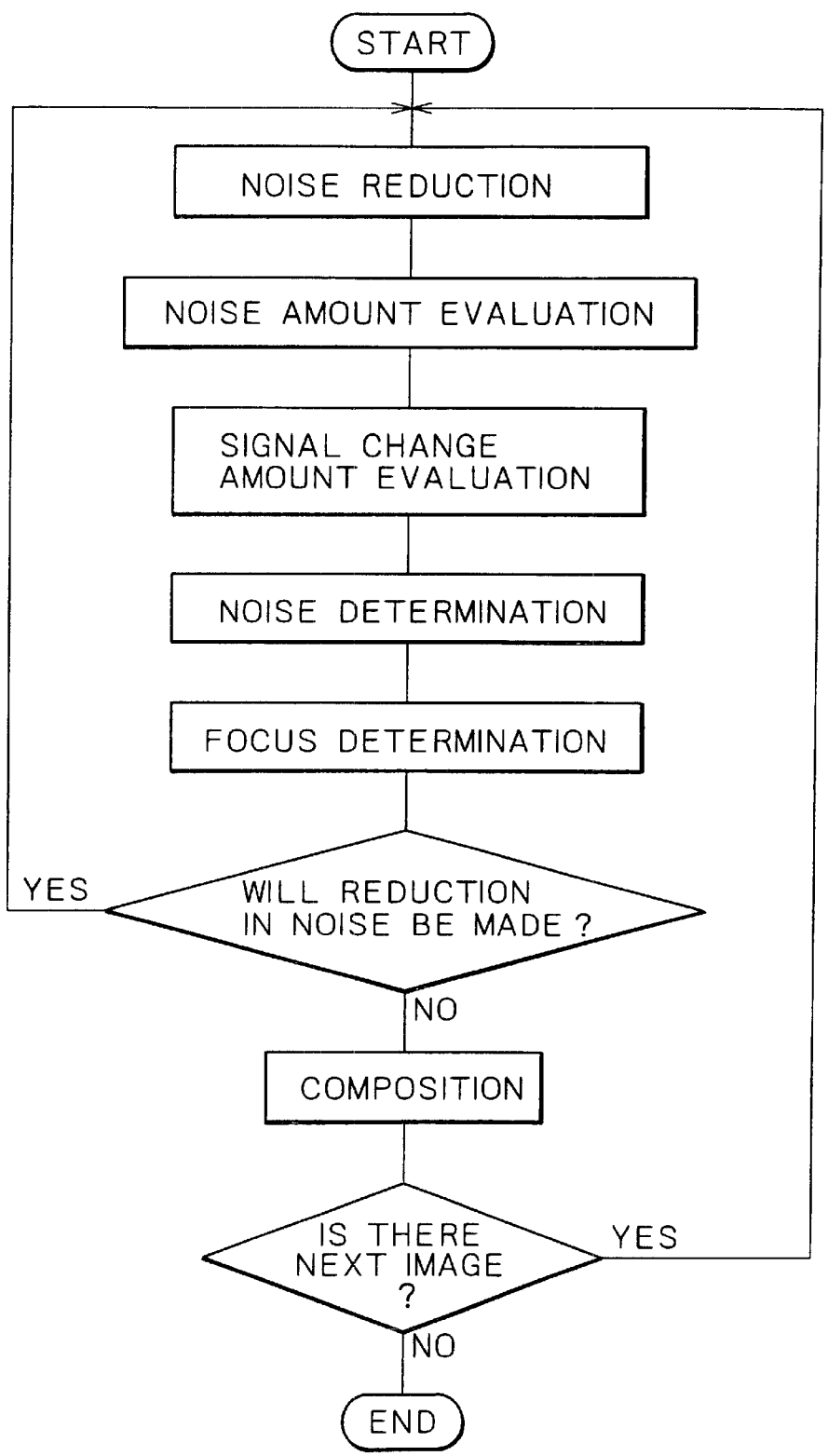
FIG. 29 is a flowchart of full-focused image composition.

FIG. 29 is a flowchart showing processes of software realizing the tenth embodiment. A series of steps such as a noise reducing step, a noise evaluating step, a signal change amount evaluating step, a noise determination step, a focus determination step, and a noise reduction changing step are repeated each time the noise reduction amount is changed at the noise reduction changing step. Then, after composition is performed, the next target image is loaded at a step which determines the existence of a next image, and the entire series of steps are repeated until there is no target image left.

That is, even though full-focused image composition means 4220 and 4230 are separately shown in a configuration diagram such as FIG. 25, full-focused image composition means 4220 and 4230 can be performed by executing a module with its repetition condition changed for each of them in a flowchart when they are realized by software. Even in such a case, however, the existence of a plurality of full-focused image composition means must be considered since the module is executed repeatedly.

Figure 30:
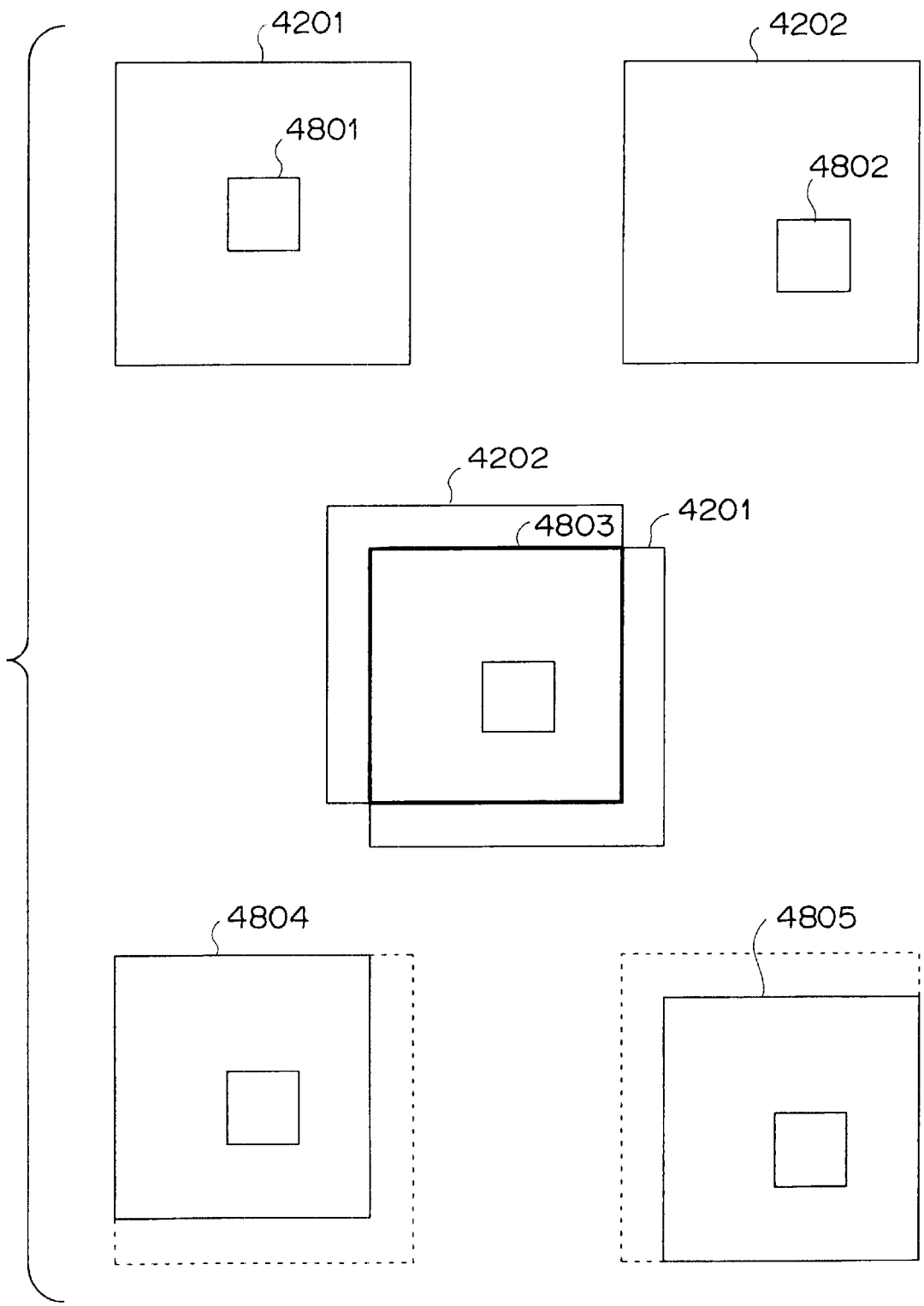
FIG. 30 is a diagram showing an embodiment of full-focused image composition.

FIG. 30 shows the first configuration example of a preprocessing means 4210. When input images 4201 and 4202 are obtained by imaging a target object at positions that are shifted from each other, performing full-focused image composition of pixels at a same position in the input images 4201 and 4202 does not produce proper results. Therefore, to cope with this problem, for example, an area 4801 of an arbitrary size is selected from the center portion of the input image 4201 as a template, and template matching is performed with the input image 4202.

As a result, if an area 4802 is matched, the areas 4801 and 4802 are completely overlapped to select the overlapping square area (an AND area 4803) of the input images 4201 and 4202, that is, portions of the input images 4201 and 4202 that are not overlapped are removed to produce position-matched input images 4804 and 4805. Using the position-matched input images 4804 and 4805 as input images, full-focused image composition with properly matched pixels can be performed. Although this example uses two input images, the example can be easily extended to employ three or more input images.

FIG. 31 shows the second configuration example of the preprocessing means 4210. As in the case shown by FIG. 30, when input images 4201 and 4202 are obtained by imaging a target object at positions that are shifted from each other, performing full-focused image composition of pixels at a same position in the input images 4201 and 4202 does not produce proper results. Therefore, to cope with this problem, for example, an area 4801 of an arbitrary size is selected from the center portion of the input image 4201 as a template, and template matching is performed with the input image 4202. As a result, if an area 4802 is matched, the areas 4801 and 4802 are completely overlapped to acquire the square area (an OR area 4903) that includes the input image 4201 or 4202 or both, and the portions of the OR area 4903 that do not overlap the input image 4201 are added to the input image 4201 by giving a value of 0 or the average value of the input image to each pixel of the portions to produce a position-matched input image 4904, while the portions of the OR area 4903 that do not overlap the input image 4202 are added to the input image 4202 by giving a value of 0 or the average value of the input image to each pixel of the portions to produce a position-matched input image 4905. Using the position-matched input images 4904 and 4905 as input images, full-focused image composition with properly matched pixels can be performed. Although this example uses two input images, the example can be easily extended to employ three or more input images.

Figure 32:
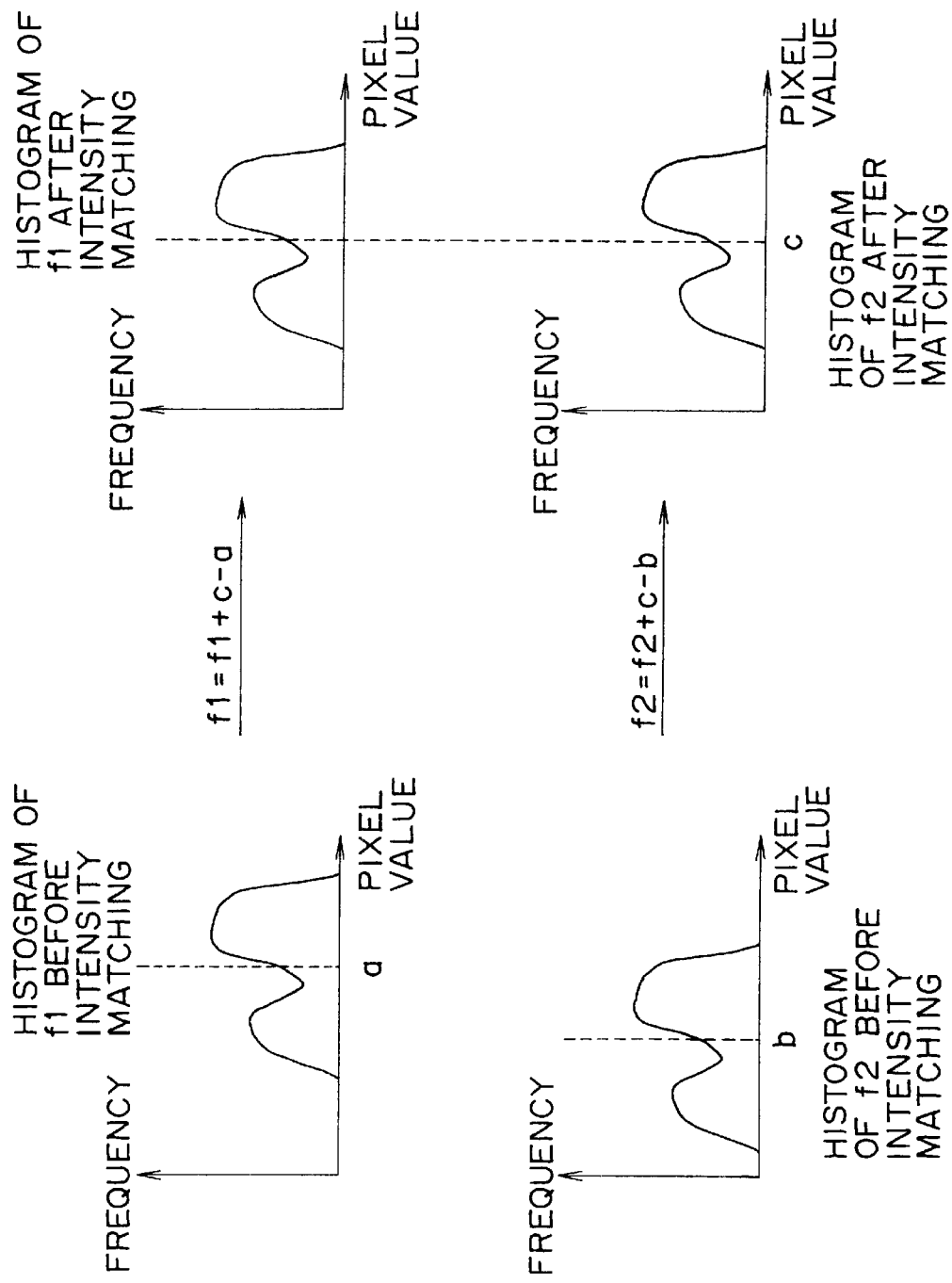
FIG. 32 is a diagram showing another configuration of a preprocessing means 210 for full-focused image composition.

FIG. 32 shows the third configuration example of the preprocessing means 4210. When the intensity levels of an input image f1 and an input image f2 do not coincide, that is, the average value a of the pixel values of the input image f1 does not coincide with the average value b of the pixel values of the input image f2, if full-focused image composition is performed using those input images as they are, borders between portions made up of pixels of the input image f1 and portions made up of pixels of the input image f2 are distinct, producing an unsatisfactory result. Therefore, the intensity levels of both the input images f1 and f2 are converted so that the average values of the pixel values of both images are equal to the same average value c.

$$f1(x,y)=f1(x,y)+c-a$$

$$f2(x,y)=f2(x,y)+c-b$$

Since the above conversion makes the average pixel values of both the input image f1 and the input image f2 coincide with the value c, when full-focused image composition is performed using those input images, borders between portions made up of pixels of the input image f1 and portions made up of pixels of the input image f2 are not distinct, producing a satisfactory result. Although this example uses two input images, the example can be easily extended to employ three or more input images.

[Twelfth Embodiment]

Figure 33:
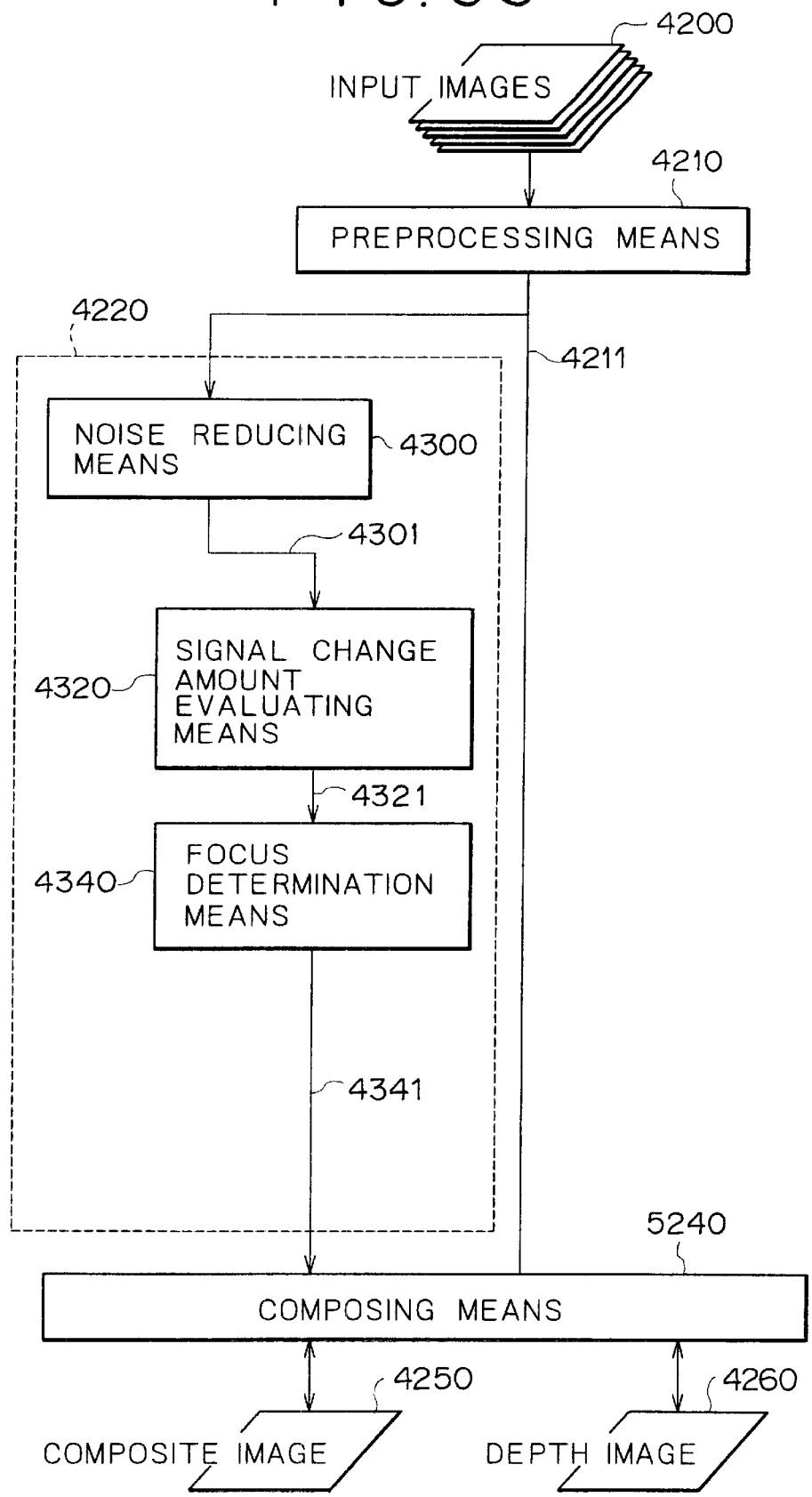
FIG. 33 is a diagram showing an embodiment of full-focused image composition.

FIG. 33 shows a twelfth embodiment according to the present invention.

Input images are preprocessed by a preprocessing means 4210, and then the noise of the input images is reduced by a noise reducing means 4300. Specific examples of the noise reducing means include a noise reduction filter and smoothing reduction. A noise amount evaluating means 4310 calculates noise amount evaluation values 4311 of noise reduced images 4301, while a signal change amount evaluating means 4320 calculates signal change amount evaluation values 4321, which indicate in-focus degrees, from the noise-reduced images 4301. A focus determination means 4340 generates composition information 4341 using signal change amount evaluation values 4321. A composing means 5240 composes a composite image 4250 and a depth image 4260 from the composition information 4341.

Thus, in full-focused image composition, by reducing noise of the input images by the noise reducing means 4300 before the signal change amount evaluating means 4320 evaluates signal change amounts, it is possible to compose the composite image 4250 subjected to little noise influence.

[Thirteenth Embodiment]

Figure 34:
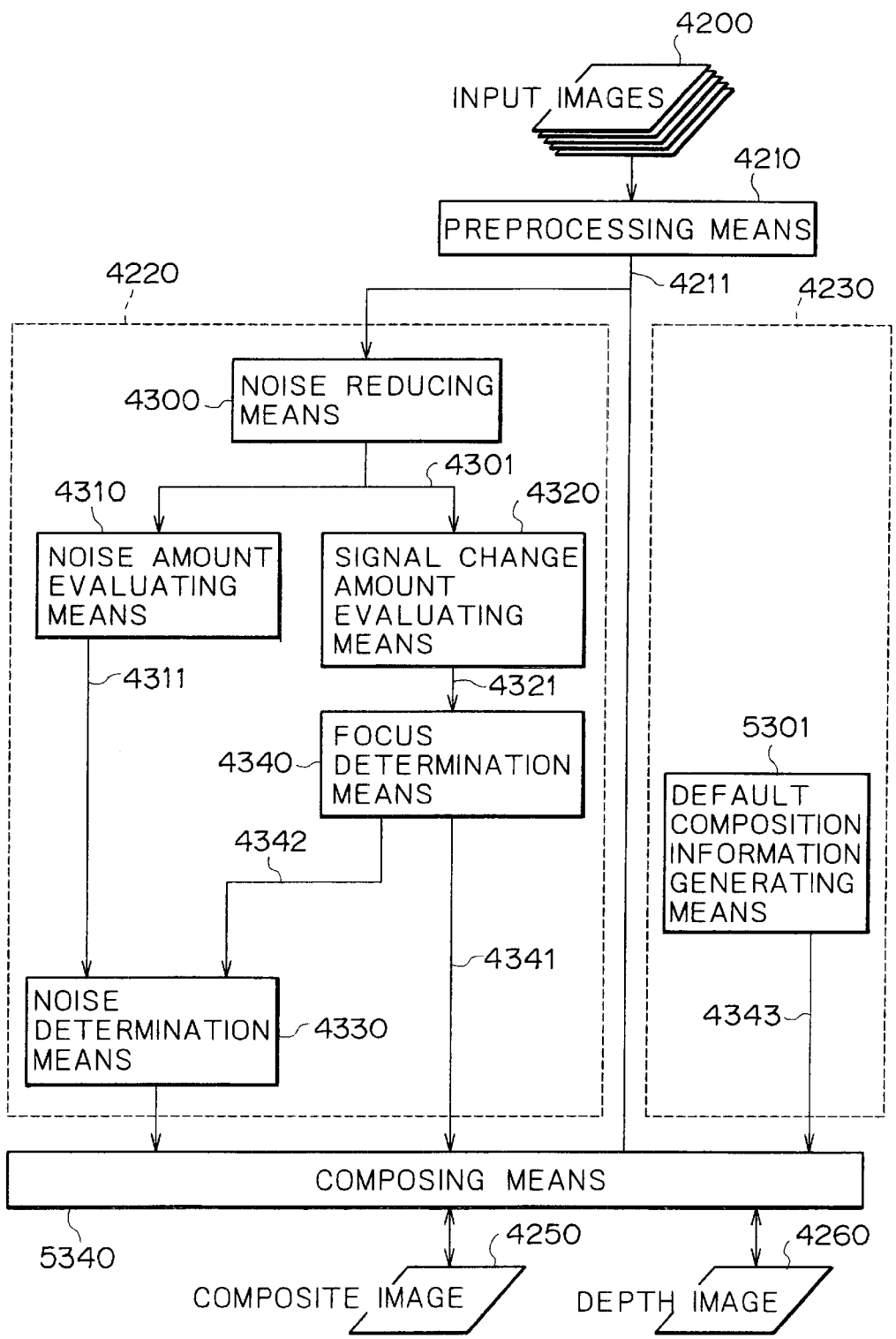
FIG. 34 is a diagram showing another embodiment of full-focused image composition.

FIG. 34 shows a thirteenth embodiment of the present invention.

A full-focused image composing means 4230 consists of only a default composition information generating means 5301. Input images are preprocessed by a preprocessing means 4210, and then the noise of the input images is reduced by a noise reducing means 4300. A noise amount evaluating means 4311 calculates noise amount evaluation values 4311 of noise-reduced images 4301, while a signal change amount evaluating means A4320 calculates signal change amount evaluation values 4321, which indicate in-focus degrees, from the noise-reduced images 4301. A focus determination means 4340 generates a maximum signal change amount value 4342 and composition information 4341 using the signal change amount evaluation values 4321. The maximum signal change amount value 4342 is fed to a noise determination means 4330, which outputs favorableness degree information 4331 indicating the degree of noise influence. The default composition information generating means 5301 outputs composition information 4343 so as to set a value of 1 to all pixels when a default image is input, and set a value of 0 to all pixels when an image other than a default image is input, in order to always select a fixed default image.

A full-focused image composing means 4220 forms an image which does not have many favorable portions subjected to little noise influence but has a high space resolution, while the full-focused image composing means 4230 selects a fixed default image. A composing means 4240 composes a composite image 4250 that has many favorable portions subjected to little noise influence and a high space resolution by selecting pixels of the image acquired from the full-focused image composition means 4220 for portions subjected to little noise influence, and selecting pixels of the default image for portions subjected to noise influence.

[Fourteenth Embodiment]

Figure 35:
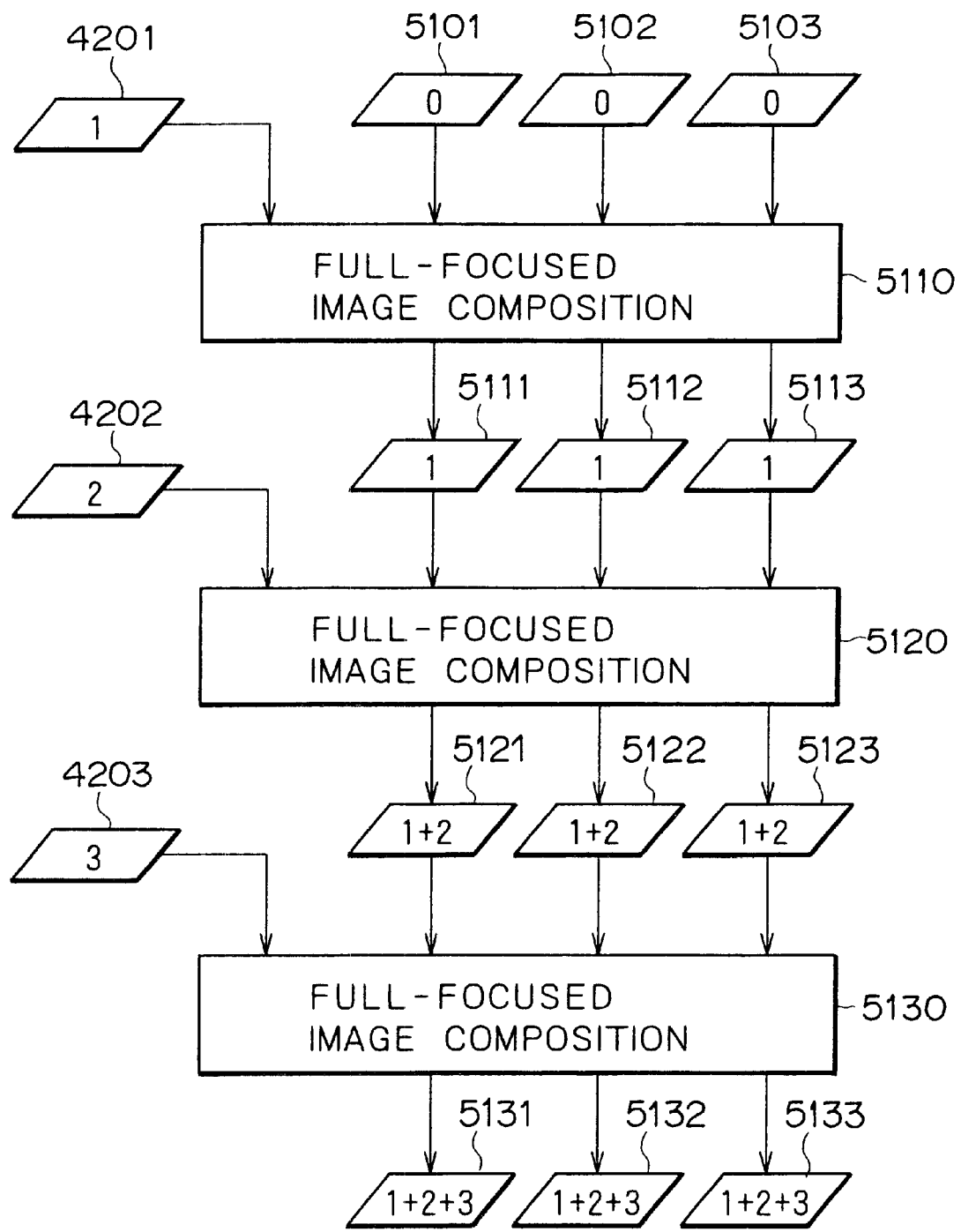
FIG. 35 is a diagram showing still another embodiment of full-focused image composition.

FIG. 35 shows a fourteenth embodiment according to the present invention. A full-focused image composing means 5110 receives an input image 4201, a maximum signal change amount value image 5101, a composed image 5102, and a depth image 5103, and outputs a maximum signal change amount value image 5111, a composed image 5112, and a depth image 5113. The maximum signal change amount value image 5101 corresponds to a maximum signal change amount value fmax 4411 in FIG. 26, the composed image 5102 corresponds to a composite image 4250 in FIG. 24, and the depth image 5103 corresponds to a depth image 4260. Full-focused image composing means 5120 and 5130 receives and outputs the same images as those received and output by the full-focused image composing means 5110. Next, the operation of this embodiment will be described below. The full-focused image composing means 5110 checks a signal change amount of the input image 4201, and compares it with the maximum signal change amount value image 5101 to update the composed image 5102 and the depth image 5103 to produce a composed image 5112 and a depth image 5113, respectively. Next, the full-focused image composing means 5120 checks a signal change amount of an input image 4202, and compares it with a maximum signal change amount value image 5111 to update the composed image 5112 and the depth image 5113 to produce a composed image 5122 and a depth image 5123, respectively. Furthermore, the full-focused image composing means 5130 checks a signal change amount of the input image 4203, and compares it with the maximum signal change amount value image 5121 to update the composed image 5122 and the depth image 5123 to produce a composed image 5132 and a depth image 5133, respectively. In a configuration as described above in which input images are fed one by one to generate the current composition results by adding the current input image to the last composition results, it is possible to perform an input process, in which a next input image is fed, and a composing process, in which a full-focused composition process is performed on an input image, in parallel so that the full-focused image composing means 5110, 5120, and 5130 can be included in the input processes, in which input images are input. To process ten input images, for example, the above arrangement can finish it in much shorter time than an arrangement in which all of the ten input images are input before they are subjected to the full-focused image composition process.

As described above, the fourteenth embodiment according to the present invention can provide a method and an apparatus for composing a full-focused image which looks natural and does not look like an artificially composed image even from input images having much noise.

[Fifteeth Embodiment]

This embodiment, as described below, relates to a technique to form a composite image based on a plurality of images each having a different focus as described so far, and particularly to a technique to suitably change a focus when acquiring a plurality of images.

Scanning electron microscopes generally employ a magnification variable from about a few tens to one million times, thereby having a dynamic range greatly different from that of optical microscopes. To compose an image having a large focal depth from a plurality of images each having a different focal position in an observation apparatus such as this, it is important to optimally control a focus shift amount between images.

Figure 36:
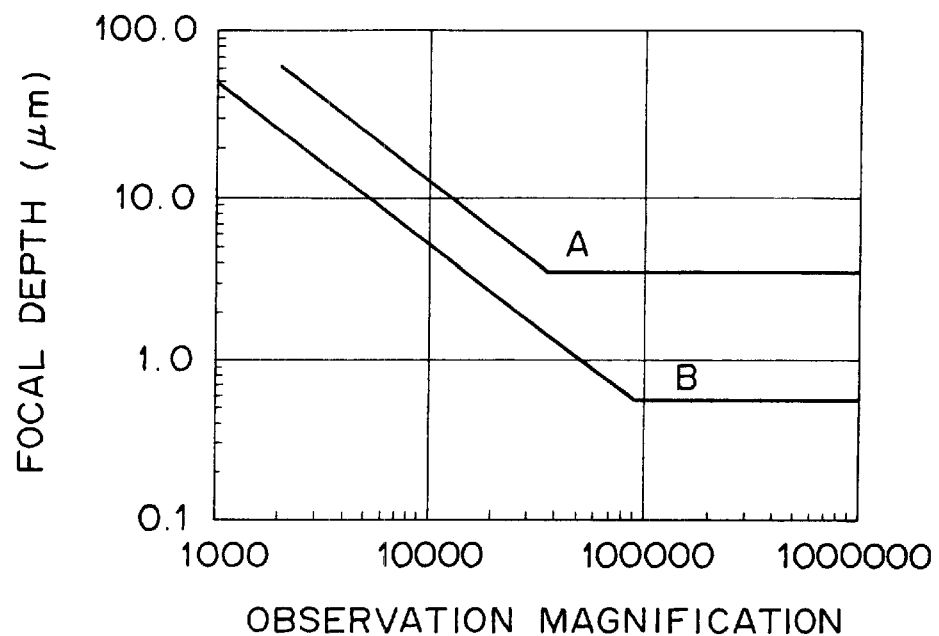
FIG. 36 is a graph showing relationships between an observation magnification and a focal depth when the same acceleration voltage and different beam resolutions are applied.
Figure 37:
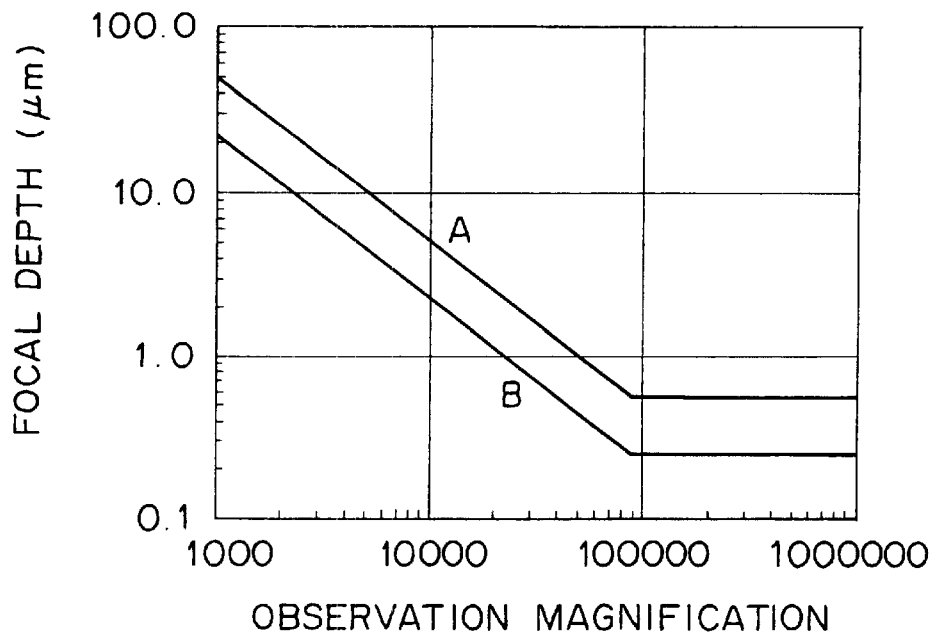
FIG. 37 is a graph showing relationships between an observation magnification and a focal depth when the same beam resolution and different acceleration voltages are applied.

To clarify problems to be solved by this embodiment, description will be made of a relationship between image forming conditions and focal depth with reference to FIGS. 36 and 37. Both FIGS. 36 and 37 show a relationship between an observation magnification and a range of focus in which a beam can be focused (focal depth) when n scanned image is formed under constant focal conditions. FIG. 36 shows two graphs formed at the same acceleration voltage but different device resolutions: graph A shows a focal depth at a low resolution and graph B shows a focal depth at a high resolution. FIG. 37 also shows two graphs formed at the same beam resolution but different acceleration voltages: graph A shows a focal depth at a high acceleration voltage and graph B shows a focal depth at a low acceleration voltage. To acquire an image having a focal depth larger than those indicated by a graph under each image forming condition, it is necessary to compose an image by capturing a plurality of images each having a different focal position (focal condition). As shown in FIGS. 36 and 37, a focal depth largely depends on not only observation magnification but also beam conditions such as the beam resolution and acceleration voltage. Furthermore, a focal depth depends on the number of pixels or a pixel size used to form an image. That is, since the size of a pixel becomes smaller as the number of pixels is increased, the allowable value of a focus displacement of a beam regarded as being in focus also becomes smaller, decreasing the focal depth. Therefore, it is important to capture scanned images while calculating an optimal focus shift amount according to these image forming conditions including observation magnification. For example, to compose an image of a high magnification, it is necessary to capture images while applying a minute focus shift amount to them. In the case of composition of an image of a low magnification, however, this focus shift amount turns out to be too small.

Thus, when a fixed focus shift amount is used to capture a plurality of images to reconstruct an image, a sufficiently extended focal depth cannot be effected if the shift is applied to the entire magnification range of a scanning electron microscope. The above conventional technique has given no consideration to this problem and, therefore, to acquire a given focal depth, it is necessary to capture more images than are necessary. On the other hand, when a plurality of images are captured to extend a focal depth, a same portion of a sample is repeatedly scanned. Therefore, as the number of images used for composition is increased, a sample is damaged by a beam, causing the problem that it is not possible to obtain a composite image properly reflecting the characteristics of the sample. To cope with this problem, it is necessary to restrict the number of images used for extension of a focal depth to a minimum.

An object of this embodiment is to provide an electron beam apparatus capable of producing the maximum extension effect of a focal depth using a minimum of captured images by capturing a plurality of images with an optimal focus shift amount according to image forming conditions such as device parameters and observation conditions.

To solve the above problem, this embodiment comprises a means for determining an optimal focus shift amount based on image forming conditions; a means for setting a focal depth necessary for a composite image; and a means for determining the minimum number of images to be captured necessary for satisfying the set focal depth value provided by the above means.

A focal depth fd of a scanned image under a constant focal condition with a low observation magnification is expressed by the following formula:

$$fd = A1 \times (dpix/M) \times R \times \sqrt{Vacc} \tag{1}$$

Where A1 denotes a constant; dpix denotes a pixel size; M represents an observation magnification; R represents a beam resolution (a resolution decided by a beam diameter); and Vacc indicates an acceleration voltage. With a higher observation magnification, the resolution of a scanned image becomes restricted by the beam resolution R. In such a case, the focal depth is expressed by the following formula:

$$fd = A2 \times R^2 \times \sqrt{Vacc} / \sqrt{(1 + 0.73 \times (Ip/BO) \times 10^{14})} \tag{2}$$

Where A2 denotes a constant; Ip denotes a probe current; and BO represents the intensity of an electron gun per 1V. In the high magnification range, many conditions contributing to image formation influence a focal depth as shown in the formula (2). With the field emission type electron source, which has a very high intensity BO, the item Ip/BO in the formula (2) is very small, and, therefore, the focal depth in the high magnification range can be practically expressed as:

$$fd = A2 \times R^2 \sqrt{Vacc} \quad (3)$$

Incidentally, the beam resolution R in the formulas (1) through (3) can be expressed by the following relationship:

$$R = 0.61\lambda/\alpha = 0.75/(\alpha \sqrt{Vacc}) \quad (4)$$

Therefore, the beam resolution R in the formulas (1) through (3) can be replaced with the second item or third item of the formula (4). Here, $\lambda$ denotes an electron wavelength, and $\alpha$ denotes the convergent angle (half angle) of a primary beam.

An image of a focal depth larger than those indicated by the formulas (1) through (3) can be obtained by performing appropriate image composition by use of a plurality of images each having a different focus. At that time, the maximum extension effect of a focal depth with a minimum of images can be obtained by setting the focus shift amount to a same value or a little smaller value than those indicated by the formulas (1) through (3).

A focus shift amount determination means calculates an optimal focus shift amount based on image forming conditions such as an acceleration voltage, the intensity of an electron source, a probe current, the number of pixels, a magnification, a beam resolution, using the formulas (1) through (3). The focus shift amount determination means can store these calculation results in a table beforehand, and select one corresponding to a given image forming condition from the table. The minimum number of captured images necessary for optimal composition is also determined by employing a means for setting the upper and lower limits of a desired focal range (range of focal depth)or a means for directly entering values specifying a range of focal depth, using results from the formulas (1) through (3). This embodiment further includes a focus control means for changing a focus each time an image is captured; an image sequential-capturing means for sequentially capturing a series of images; and an image storage means for storing a series of images.

The focus control means can be realized in various control modes such as controlling a focus using a current focus condition as a center point, or controlling a focus using a current focus as an end point of the control range, or controlling a focus within a predetermined focal range. This embodiment further includes a means for calculating the focal depth of an image composed from a plurality of captured images, using the amount of a change in focus between images, the number of images, and a focal depth of the electrooptic system, and a display means for displaying the acquired value so that an observer can easily check the focal depth of an acquired image.

When it is necessary to perform image composition (focus composition) for extending a focal depth independently from the functions of a scanning electron microscope, a plurality of images stored in the image storage means can be provided to another image composing means to compose an image having an increased focal depth.

This embodiment further includes an image constructing means for further constructing a composite image from a series of images in order to perform a series of processes, such as capturing of a series of images, and indication and storage of a composite image having an increased focal depth, together at once.

Since each of a plurality of images used to extend a focal depth has focal position information on the object lens, an image position in the composite image can be specified to determine the focal position information on the object lens corresponding to the image position. To utilize this information, this embodiment further includes an image position specifying means for specifying two arbitrary points in a composite image; a focal position extracting means for extracting the object lens focal positions corresponding to the two specified points; and a means for calculating the height difference between the two specified points using the extracted focal position information, and displaying the results.

Figure 38:
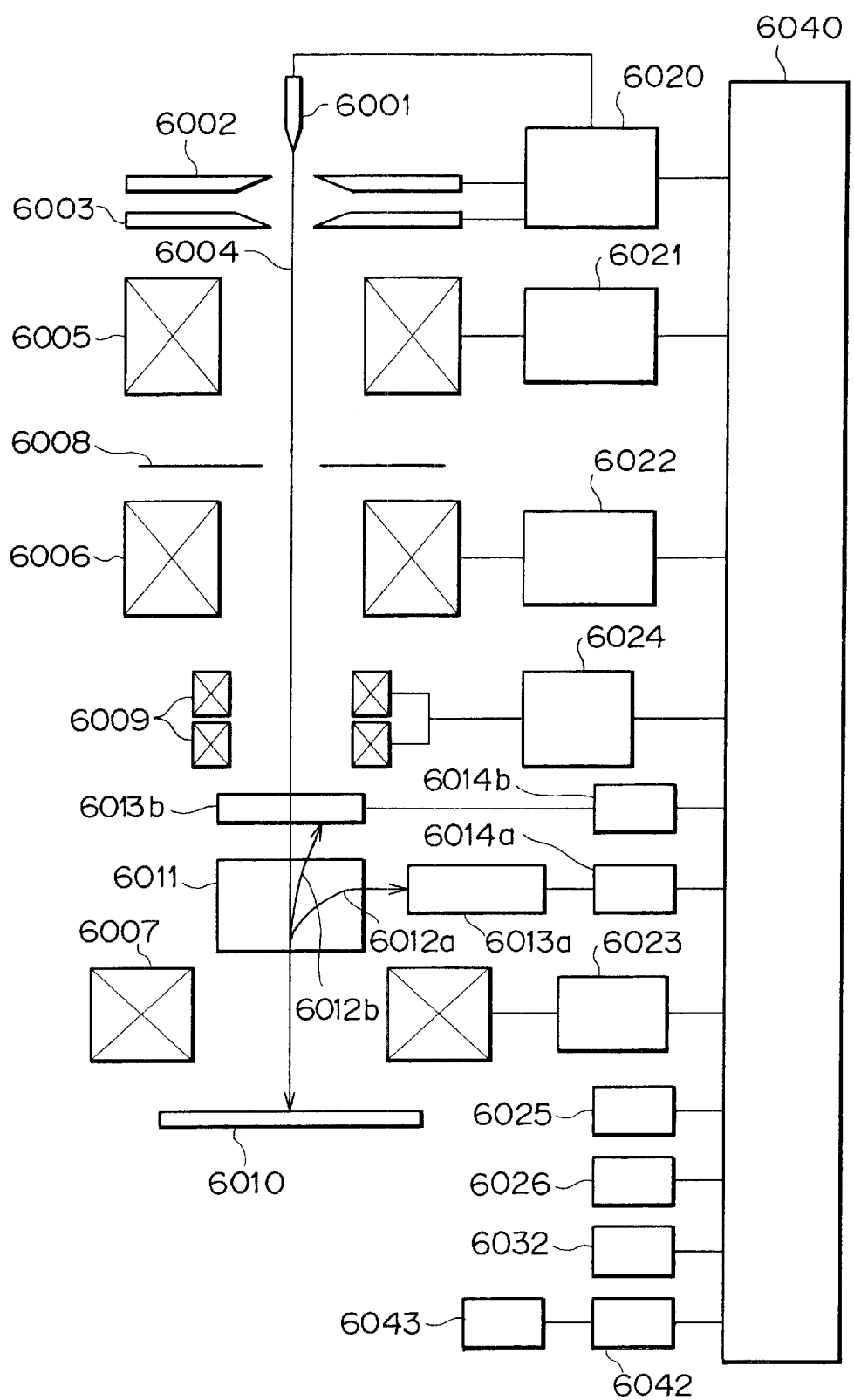
FIG. 38 is a diagram showing a schematic configuration of a scanning electron microscope used to describe an embodiment of the present invention.

This embodiment will be described below with reference to the accompanying drawings. FIG. 38 is a schematic diagram showing a configuration of a scanning electron microscope according to this embodiment. A voltage is applied between a cathode 6001 and a first anode 6002 by a high voltage control source 6020 controlled by a microprocessor (CPU) 6040 so that a primary electron beam 6004 is extracted from the cathode 6001 at a given emission current. Since an acceleration voltage is applied between the cathode 6001 and a second anode 6003 by the high voltage control source 6020 controlled by the CPU 6040, the primary electron beam 6004 emitted from the cathode 6001 is accelerated to proceed to the latter stage of a lens system. The primary electron beam 6004 is converged by a converging lens 6005 controlled by a lens control source 6021, and after the unnecessary regions of the primary electron beam are removed by a diaphragm 6008, the primary electron beam is converged into a small spot on a sample 6010 by a converging lens 6006 and an object lens 6007 controlled by a lens control source 6022 and an object lens control source 6023, respectively. The object lens 6007 can take various forms such as an in-lens system, an out-lens system, and a snorkel system (semi-in-lens system).

The primary electron beam 6004 is scanned on the sample 6010 by a scanning coil 6009 two-dimensionally. Secondary signals (sample signals) 6012a and 6012b of secondary electrons, reflection electrons, etc. generated or reflected from the sample 6010 irradiated with the primary electron beam proceed to the upper part of the object lens 6007, and are separated according to their energy by a crossed electromagnetic field generator 6011 for secondary signal separation, to proceed toward secondary signal detectors 6013a and 6013b. Then, these secondary signals 6012a and 6012b are detected by the secondary signal detectors 6013a and 6013b. Signals from the secondary signal detectors 6013a and 6013b are passed through signal amplifiers 6014a and 6014b, respectively, and stored in an image memory 6025 as image signals. The image information stored in the image memory 6025 is displayed in an image display device 6026 as necessary. A signal to the scanning coil 6009 is controlled by a scanning coil control source 6024 according to the observation magnification. A plurality of images each having a different focus are captured one after another while their focus control conditions are calculated by the CPU 6040, and the images are stored in an image memory 6032. The image data stored in the image memory 6032 can be output from the SEM to the outside. Furthermore, images in the image memory 6032 are subjected to image processing in the CPU 6040, and are used to compose an image having an increased focal depth, which is stored in an image memory 6025 and displayed in the image display device 6026. The composite image can also be stored in the image memory 6032, and output from the SEM to the outside. It should be noted that although the image processing can be performed by a program stored in the CPU 6040, it may be performed at high speed using dedicated hardware. Since the dedicated hardware can provide high speed image processing, it is possible to capture a series of images each having a different focus while applying image processing to the captured images in parallel in order to compose an image having an increased focal depth.

In an SEM, in addition to the CPU controlling hardware, another computer may be incorporated to provide data processing and a man-machine interface. In this case, a series of images are temporarily stored in the image memory 6032 incorporated in the CPU 6040, and then their data is transferred to a computer 6042 for data processing. The image data transferred to the computer 6042 is processed by a program on the computer 6042 to compose an image having an increased focal depth. This composite image is displayed in a monitor 6043 connected to the computer 6042.

Figure 39:
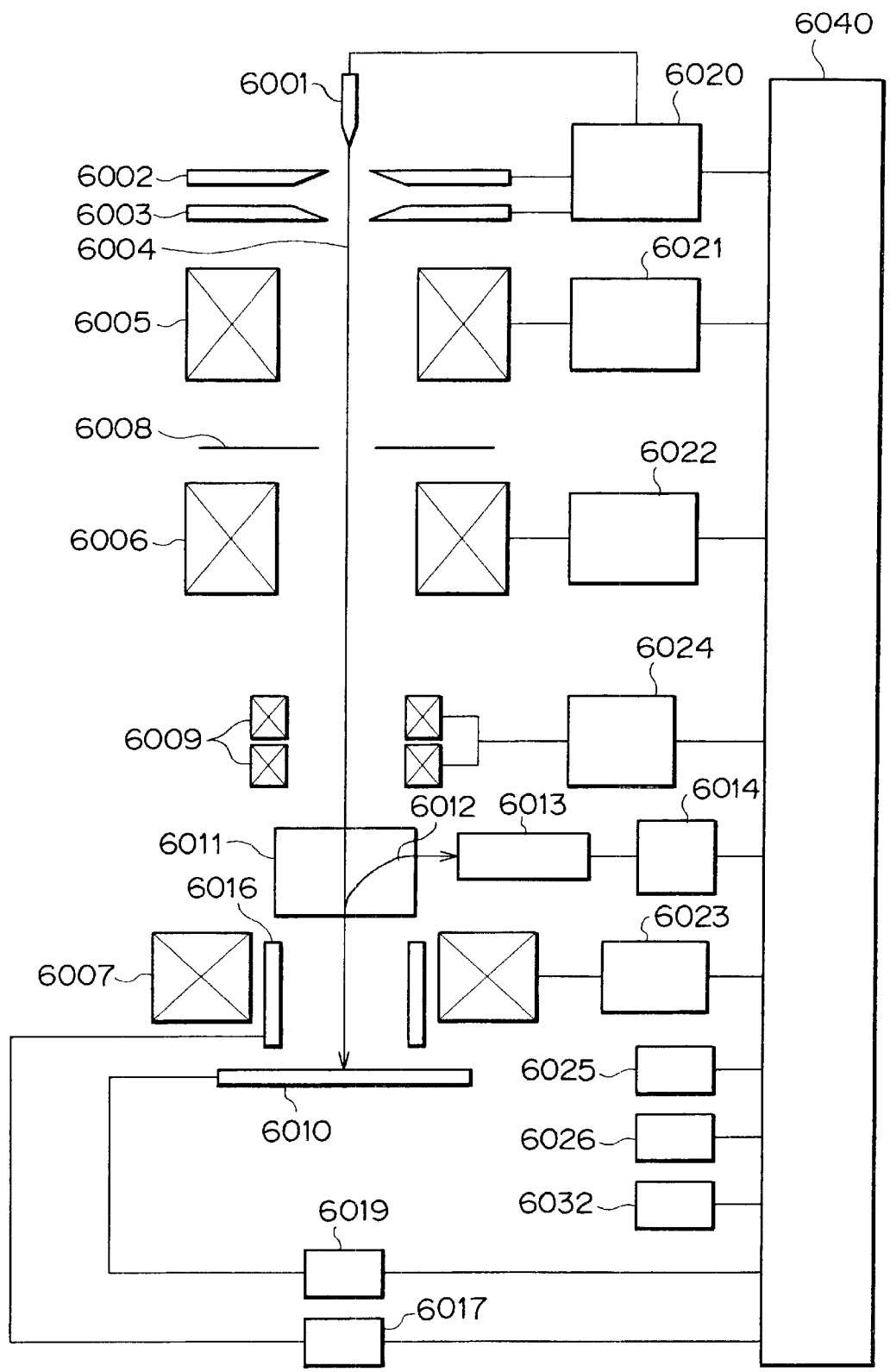
FIG. 39 is a diagram showing a schematic configuration of another scanning electron microscope used to describe an embodiment of the present invention.

In the configuration shown in FIG. 39, electrodes 6016 symmetrical about the axis are provided in the object lens section. These electrodes are arranged-such that their potential distribution is at least partially overlapped with the magnetic field of the object lens, and the focal position of the primary electrons is changed by controlling the voltage of the electrodes using a control source 6017. Furthermore, as another focal position control means, a coil other than that for the object lens may be provided in proximity to the object lens 6007 to change the focal position of the primary electrons by changing the exciting current for the coil. Further, in addition to the electrodes 6016 which are symmetrical about the axis and accelerate the primary electrons, a control source 6019 for applying a voltage to a sample may be provided in the object lens section, and the voltage applied to the sample may be controlled by the control source 6019 to change the focal position of the primary electrons.

Figure 40:
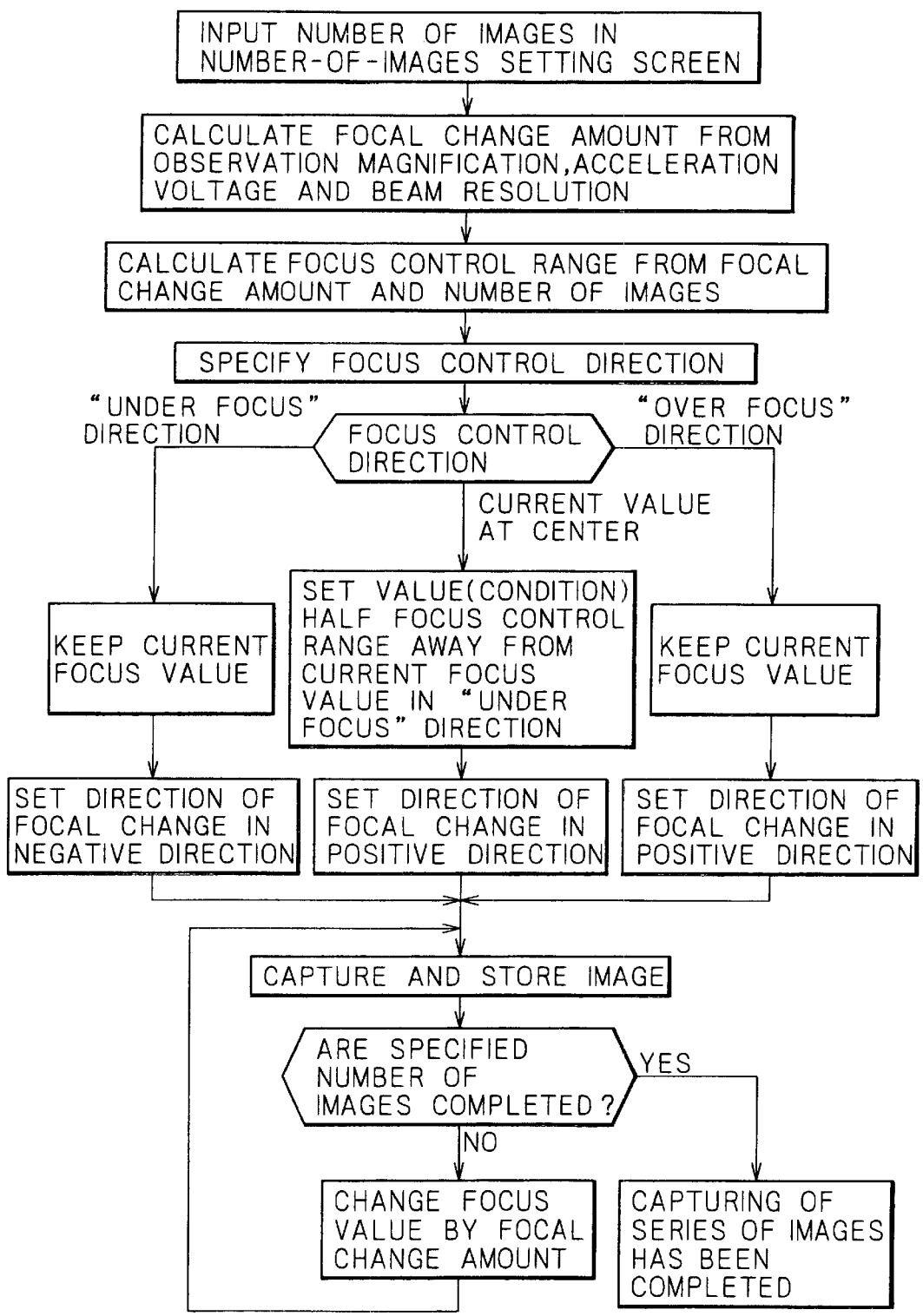
FIG. 40 is a flowchart showing a control flow for acquiring a series of images each having a different focus with the number of images to be acquired specified.

FIG. 40 shows a control flow for capturing a series of images with the number of images to be captured specified. An operator can input the number of images to be captured by directly entering the number of images in the number-of-images setting screen, or selecting the number of images from a predetermined selection range. The control CPU calculates the focal depth of a beam based on the current image forming conditions (magnification, acceleration voltage, beam resolution, number of pixels, etc.), and determines an optimal focus change amount using the calculation results and the number of images specified. In another setting screen, the operator can further specify the under-focus direction, the over-focus direction, or both directions with the current value at the center for focus control when capturing images. The control CPU sequentially captures the specified number of images while performing focus control according to the specified control conditions. These images are stored in an image memory, and used for the later processes (image transfer, image composition, etc.)

Figure 41:
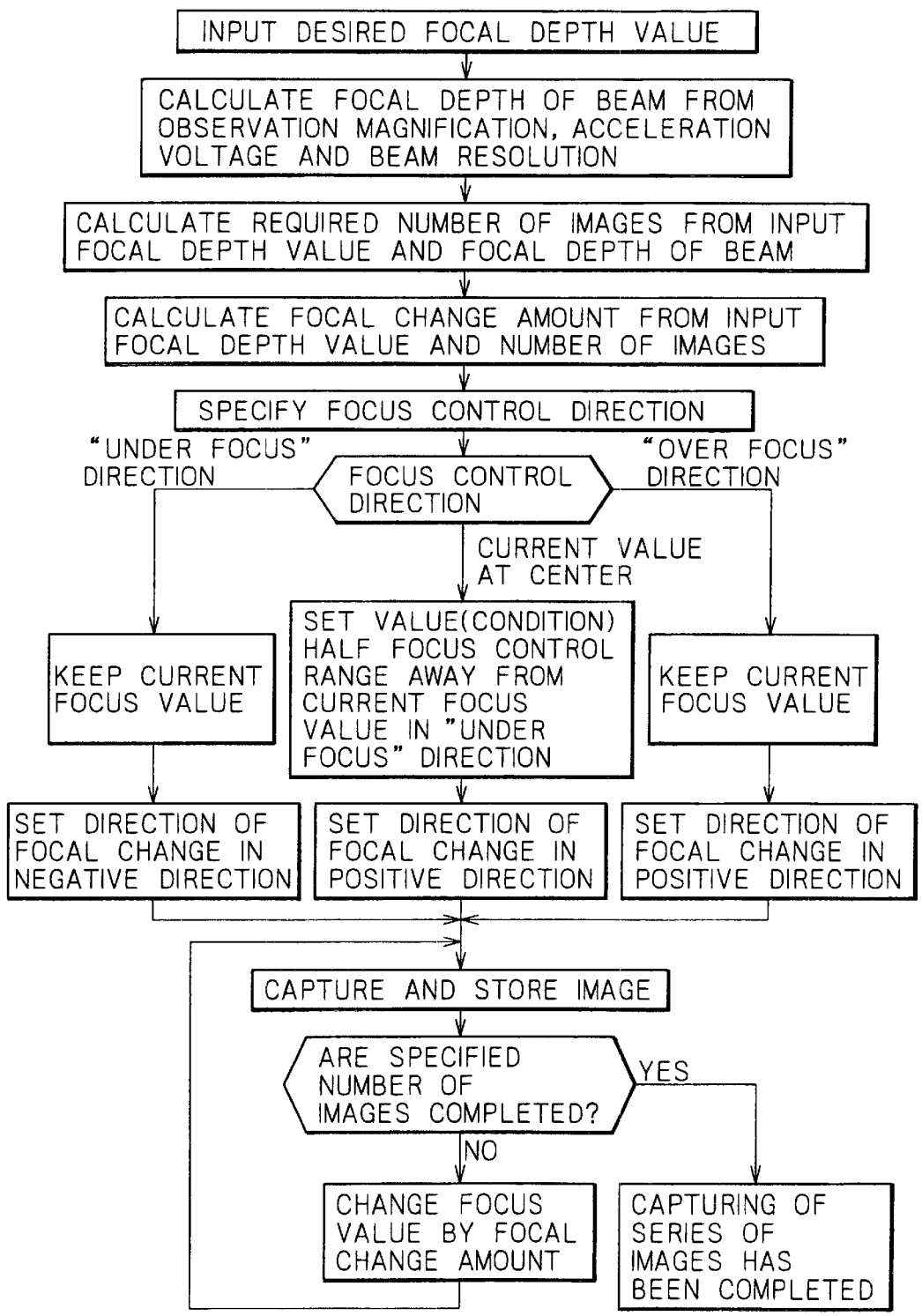
FIG. 41 is a flowchart showing a control flow for acquiring a series of images each having a different focus with a focal depth specified.

FIG. 41 shows a control flow for capturing a series of images with a necessary focal depth value specified. In this case, an operator directly specifies a necessary focal depth value. The control CPU determines the number of images and a focus shift amount necessary to satisfy the specified focal depth using the focal depth of a beam, and captures and stores a series of images using the same procedure as that shown in FIG. 40.

Figure 42:
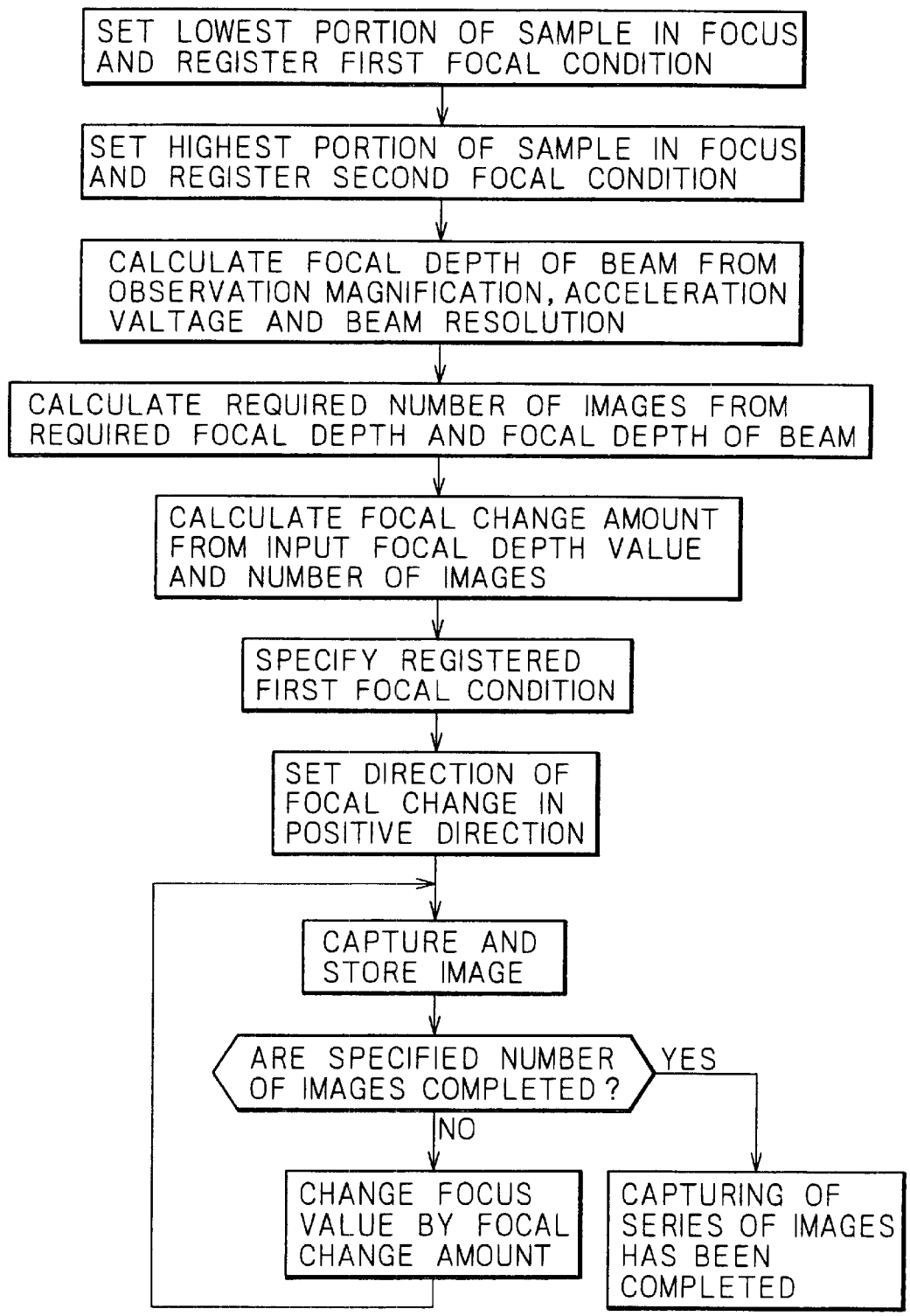
FIG. 42 is a flowchart showing a control flow for acquiring a series of images each having a different focus with a focal range specified.

FIG. 42 shows a control flow for capturing a series of images with their focal range specified. In this case, an operator specifies the upper and lower limits of a desired focal range in an observed image. First, a portion of a sample to be set to the lower limit of the focal range is set in focus, and this focal condition is registered in the CPU as the first focal condition. Next, a portion of the sample to be set to the upper limit is set in focus, and this focal condition is registered in the CPU as the second focal condition. The control CPU calculates the focus control range based on these registered conditions, and determines the suitable number of images and a suitable focus shift amount from the focal depth value of a beam.

By composing an image using a plurality of images captured in various forms according to this embodiment, an operator can construct an image having a desired focal depth. Furthermore, in this case, it is possible to restrict the amount of beam irradiation (proportional to the number of images) on a sample necessary to capture images, to a theoretical minimum value, minimizing the beam damage and shortening image acquisition and processing times.

Incidentally, description has so far been made with reference to charged particle beams. Techniques for optically captured images, on the other hand, are disclosed in Japanese Laid-Open Patent Publications Nos. 5-333271 (1993), 9-26312 (1997), 6-113183 (1994), 2000-39566 (2000), 5-227460 (1993), 10-290389 (1998), 11-261797 (1999), 11-283035 (1999), and 11-287618 (1999).

What is claimed is:

1. An image-formation apparatus using charged particle beams comprising:
    a charged particle source for emitting charged particle beams under various focus conditions;
    a scan deflector for scanning a charged particle beam emitted from the charged particle source on a sample;
    a charged particle detector for detecting charged particles emitted from a plurality of points on a surface portion of said sample in response to the charged particle beams under various focus conditions, and for generating a pixel signal corresponding to each of the various focus conditions for each of the plurality of points in response to the detected charged particles; and
    a data processing system configured to perform the machine-implemented steps of:
        determining an in-focus status of the pixel signal corresponding to each of the various focus conditions for each of the plurality of points;
        for each of the plurality of points on said surface portion of said sample, selecting a preferred pixel signal from pixel signals corresponding to the various focus conditions for each of the plurality of points based on in-focus statuses thereof; and
        generating a two-dimensional image of said surface portion of said sample based on the preferred pixel signals corresponding to the plurality of points on said surface portion of said sample.

2. The image-formation apparatus using charged particle beams as claimed in claim 1, wherein said image formation apparatus stores the pixel signals output from said charged particle detector for each of the various focus conditions; calculates characteristic quantities of arbitrary type which indicate in-focus statuses of the stored pixel signals; compares the characteristic quantities at same coordinates of pixel signals each corresponding to a different focus condition; and forms said two-dimensional image based on the comparison.

3. The image-formation apparatus using charged particle beams as claimed in claim 2, wherein said characteristic quantities are differential values or differential absolute values between pixels of an image based on said signals for each different focus condition, and said image-formation apparatus compares said differential values or said differential absolute values at same coordinates of images each for a different focus condition and uses a pixel value of an image having a large differential value or a large differential absolute value as a final pixel value of said two-dimensional image.

4. The image-formation apparatus using charged particle beams as claimed in claim 2, wherein said characteristic quantities are differential values or differential absolute values between pixels of an image based on said signals for each different focus condition, and said image-formation apparatus compares said differential values or said differential absolute values at same coordinates of a plurality of the images each for a different focus condition and composes a pixel value based on a ratio of the differential values or the differential absolute values to form said two-dimensional image.

5. The image-formation apparatus using charged particle beams as claimed in claim 2, wherein said characteristic quantities are differential values or differential absolute values between pixels of an image based on said signals for each different focus condition, and said image-formation apparatus compares said differential values or said differential absolute values at same coordinates of images each for a different focus condition and composes a pixel value based on a weighted ratio of the differential values or the differential absolute values to form said two-dimensional image.

6. The image-formation apparatus using charged particle beams as claimed in claim 2, wherein said characteristic quantities are based on pixel values obtained by applying a Sobel filter to an image based on said signals for each different focus condition.

7. An image-formation apparatus using charged particle beams comprising:
 a charged particle source for emitting charged particle beams under various focus conditions changed in a stepwise manner;
 a scan deflector for scanning a charged particle beam emitted from the charged particle source on a sample;
 a charged particle detector for detecting charged particles emitted from a plurality of points on a surface portion of said sample in response to the charged particle beams under various focus conditions, and for generating a pixel signal corresponding to each of the various focus conditions for each of the plurality of points in response to the detected charged particles; and
 a storage medium for storing pixel signals output from the charged particle detector; and
 a data processing system configured to perform the machine-implemented steps of:
  reading signals from the storage medium,
  determining an in-focus status of the pixel signal corresponding to each of the various focus conditions for each of the plurality of points;
  for each of the plurality of points on said surface portion of said sample, selecting a preferred pixel signal from pixel signals corresponding to each of the various focus conditions for each of the plurality of points based on in-focus statuses thereof; and
  generating an image of said surface portion of said sample based on the preferred pixel signals corresponding to the plurality of points on said surface portion of said sample.

8. An image-formation apparatus using charged particle beams comprising:
 a charged particle source for emitting charged particle beams under various focus conditions changed in a stepwise manner;
 a scan deflector for scanning a charged particle beam emitted from the charged particle source on a sample;
 a charged particle detector for detecting charged particles emitted from a plurality of points on a surface portion of said sample in response to the charged particle beams under various focus conditions, and for generating a pixel signal corresponding to each of the various focus conditions for each of the plurality of points in response to the detected charged particles;
 a plurality of frame memories, each of which is configured to store pixel signals for the plurality of points corresponding to one of the various focus conditions, wherein each of said plurality of frame memories has memory units for storing the pixel signal corresponding to each of the plurality of points corresponding to one of the various focus conditions; and
 a data processing system configured to perform the machine-implemented steps of:
  determining in-focus statuses of the pixel signals stored in the plurality of frame memories;
  for each of the plurality of points on said surface portion of said sample, selecting a preferred pixel signal from pixel signals corresponding to each of the various focus conditions for each of the plurality of points based on in-focus statuses thereof; and
  storing the preferred pixel signal for each of the plurality of points to corresponding memory unit of one of the plurality of frame memories.

9. An image-formation apparatus using charged particle beams having means for adjusting a focus condition of a charged particle beam and constructing an image of a sample using irradiation of said charged particle beam, comprising:
 a storage medium for storing a sample image obtained for each of various focus conditions; and
 a data processing system configured to perform the machine-implemented steps of:
  reading sample images corresponding to each of the various focus conditions from the storage medium;
  determining an in-focus status of each of a plurality of points on the sample images corresponding to each of the various focus conditions;
  for each of the plurality of points, selecting a preferred pixel from the sample images corresponding to the various focus conditions based on in-focus statuses thereof; and
  generating an image of said sample based on the preferred pixel for each of the plurality of points.

10. An image-formation apparatus using charged particle beams comprising:
 a charged particle source for emitting charged particle beams under various focus conditions;
 a scan deflector for scanning a charged particle beam emitted from the charged particle source on a sample;
 a charged particle detector for detecting charged particles emitted from a plurality of points on a surface portion of said sample in response to the charged particle beams under various focus conditions, and for generating a pixel signal corresponding to each of the various focus conditions for each of the plurality of points in response to the detected charged particles;
 a storage medium for storing pixel signals output from the charged particle detector for each of the various focus conditions; and
 a data processing system configured to perform the machine-implemented steps of:
  reading pixel signals from the storage medium;
  determining an in-focus status of the pixel signal corresponding to each of the various focus conditions for each of the plurality of points;
  for each of the plurality of points on said surface portion of said sample, selecting a preferred pixel signal from pixel signals corresponding to each of the various focus conditions for each of the plurality of points based on in-focus statuses thereof; and generating an image of said surface portion of said sample based on the preferred pixel signals corresponding to the plurality of points on said surface portion of said sample;

wherein said generating step is performed in parallel with changing the focus conditions of the charged particle beam.

11. The image-formation apparatus using charged particle beams as claimed in claim 10, further comprising a display means for displaying a process of the generating step.

12. The image-formation apparatus using charged particle beams as claimed in claim 11, further comprising means for externally stopping irradiation of said charged particle beams onto said sample.

13. An image-formation apparatus using charged particle beams having means for adjusting a focus of a charged particle beam and constructing an image of a sample based on scanning of said charged particle beam on the sample, comprising:

a storage medium for storing a sample image obtained for each adjusted focus;

selecting means for selecting a specific area of a sample image stored in the storage medium; and means for replacing the sample image whose area has been selected by the selecting means, with a sample image having a different focus or another image.

14. An image-formation apparatus using charged particle beams comprising:

a charged particle source;

a lens for converging and irradiating a charged particle beam emitted from the charged particle source onto a sample;

a detector for detecting secondary charged particles obtained at a portion irradiated with said charged particle beam;

a display device for displaying a sample image based on charged particles obtained by the detector;

means for storing position information in an irradiation direction of the charged particle beam for each specific position in the sample image displayed in the display device;

a specifying means for specifying an arbitrary position in a display screen of the display device; and means for calculating a distance between two positions specified by said specifying means in said irradiation direction of the charged particle beam, based on position information about at least the two positions.

15. An image-formation apparatus using charged particle beams comprising:

means for adjusting a focus of a charged particle beam;

means for constructing a sample image based on scanning of said charged particle beam on the sample;

means for measuring dimensions of an observation target on the sample based on the sample image;

a storage medium for storing a plurality of sample images obtained for each adjusted focus; and image forming means for selecting a specific sample image from said plurality of sample images, and forming another sample image using pixels from the specific sample image having a focus evaluation value more than a predetermined value;

wherein said image-formation apparatus performs said measuring of dimensions based on the another sample image formed by the image forming means.

16. A beam scanning inspection apparatus for forming a sample image based on signals obtained by scanning a beam on the sample, said beam scanning inspection apparatus comprising:

focus changing means for changing a focus of said beam in a stepwise manner;

a storage medium for storing a sample image for each focus changed by the focus changing means;

means for overlapping sample images stored in the storage means to form another sample image;

means for forming a line profile based on the overlapped sample image; and means for measuring dimensions based on the line profile.

17. An electron beam apparatus for obtaining a scan image of a sample, comprising beam converging means for thinly converging a primary electron beam emitted from an electron source using an object lens, beam scanning means for scanning primary electrons on a sample, detecting means for detecting secondary signals generated from the sample by scanning the beam on the sample, and image forming means for forming a sample image using the secondary signals, said apparatus comprising:

focus control amount determination means for determining an amount of change in a beam convergence position;

focus control means for controlling beam focal conditions according to the focus control amount;

image quantity determination means for determining the number of images;

image capturing means for capturing a plurality of images of the sample each under a different focal condition controlled by the focus control means, wherein the each of the images have pixels corresponding to a plurality of points on the sample;

storage means for storing the plurality of images; and a data processing system configured to carry out the machine-implemented steps of:

accessing the plurality of images from the storage means;

determining in-focus statuses for the pixels on each of the plurality of images under different focal conditions;

for each of the plurality of points, selecting a preferred pixel from the pixels corresponding to the same point of the plurality of points based on the in-focus statuses thereof; and generating an image of the sample using the preferred pixel for each of the plurality of points.

18. The electron beam apparatus as claimed in claim 17, wherein said focus control amount determination means determines a focus control amount by using one or a combination of two or more of an acceleration voltage, a working distance of an object lens, a beam convergent angle, an image magnification, an image resolution decided by a primary beam diameter, the number of pixels of an image, a pixel size of an image, and a probe current.

19. The electron beam apparatus as claimed in claim 18, wherein when A1 and A2 denote coefficients, said focus control amount is determined by the following relationship: when the observation magnification (M) is smaller than a predetermined value, $$\text{focus control amount} = A1 \times d\text{pix}/M, \text{ and}$$

when the observation magnification is larger than a predetermined magnification, $$\text{focus control amount} = A2 \text{ (constant)}.$$

20. The electron beam apparatus as claimed in claim 19, wherein the value of said coefficient A1 is determined by the relationship that the coefficient A1 is inversely proportional to the beam convergent angle α.

21. The electron beam apparatus as claimed in claim 20, wherein either one or both of said coefficient A1 and said coefficient A2 are proportional to the value of a function determined based on an electron beam intensity and the probe current.

22. The electron beam apparatus as claimed in claim 19, wherein the value of said coefficient A1 is determined by the relationship that the coefficient A1 is proportional to the product between the square root of the acceleration voltage (Vacc) and the primary electron beam resolution (R) under the current beam conditions.

23. The electron beam apparatus as claimed in claim 19, wherein the value of said coefficient A2 is determined by the relationship that the coefficient A2 is proportional to the product between the square root of the acceleration voltage (Vacc) and the square of the resolution.

24. The electron beam apparatus as claimed in claim 17, wherein a value of said focus control amount is selected from table values predetermined for each acceleration voltage.

25. The electron beam apparatus as claimed in claim 17, wherein said image quantity determination means specifies the number of images to be sequentially captured by directly entering a numerical value or selecting a numerical value from a list.

26. The electron beam apparatus as claimed in claim 25, wherein said image quantity determination means limits the maximum number of images to be set according to the number of pixels of the images.

27. The electron beam apparatus as claimed in claim 17, wherein said image quantity determination means comprises:
  focal range setting means for setting the upper limit and the lower limit of a focal range; and
  image quantity calculating means for calculating the number of images using values set by the focal range setting means.

28. The electron beam apparatus as claimed in claim 27, wherein said image quantity determination means comprises:
  focus adjustment value registering means for registering each of two focus adjustment values; and
  image quantity calculating means for calculating the number of images using values registered with the focus adjustment value registering means.

29. The electron beam apparatus as claimed in claim 17, wherein said image quantity determination means comprises:
  focal depth setting means for setting a difference between focus control ranges (focal depth); and
  calculating means for calculating the number of images based on a value set by the focal depth setting means.

30. The electron beam apparatus as claimed in claim 17, wherein said focus control means sequentially captures a series of a predetermined number of images while controlling a focus in an under-focus direction using a current focal state as a reference.

31. The electron beam apparatus as claimed in claim 17, wherein said focus control means sequentially captures a series of a predetermined number of images while controlling a focus in an over-focus direction using a current focal state as a reference.

32. The electron beam apparatus as claimed in claim 17, wherein said focus control means sequentially captures a series of a predetermined number of images while controlling a focus within an over-focus range starting from an over-focus state, using a current focal state as a center state.

33. The electron beam apparatus as claimed in claim 17, further comprising display means for indicating a focal depth value of an image composed using a plurality of sequentially captured images.

34. An electron beam apparatus for obtaining a scan image of a sample, comprising beam converging means for thinly converging a primary electron beam emitted from an electron source using an object lens, beam scanning means for scanning primary electrons on a sample, detecting means for detecting secondary signals generated from the sample by scanning the beam on the sample, and image forming means for forming a sample image using the secondary signals, said apparatus comprising:
  focus control amount determination means for determining a beam convergence position change amount;
  focus control means for controlling beam focal conditions according to the focus control amount;
  image quantity determination means for determining the number of images;
  image capturing means for capturing a plurality of images of the sample each under a different focal condition controlled by the focus control means, wherein the each of the images have pixels corresponding to a plurality of points on the sample;
  storage means for storing the plurality of images;
  image constructing means for constructing an image of the sample using the plurality of stored images, wherein the image constructing means is configured to carry out the machine-implemented steps of:
    accessing the plurality of images from the storage means;
    determining in-focus statuses for the pixels on each of the plurality of images under different focal conditions;
    for each of the plurality of points, selecting a preferred pixel from the pixels corresponding to the same point of the plurality of points based on the in-focus statuses thereof; and
    generating an image of the sample using the preferred pixel for each of the plurality of points.

35. The electron beam apparatus as claimed in claim 34, wherein said image constructing means for constructing a new image using a plurality of images, performs a series of steps, said series of steps comprising:
  a position correcting step of correcting a positional displacement between images;
  an intensity correcting step of correcting a difference in intensity between images;
  an in-focus image extracting step of extracting an image element most closely in focus, from among image elements corresponding to one another between images; and
  a full-focused image constructing step of constructing a new image by combining the extracted image elements.

36. The electron beam apparatus as claimed in claim 34, further comprising:
  specifying means for specifying two arbitrary points in an image composed using a plurality of sequentially captured images;
  calculating means for calculating a height difference between the two points specified by the specifying means; and
  displaying means for displaying the calculation results from the calculating means.

* * * * *